US012660357B2

(12) United States Patent (10) Patent No.: US 12,660,357 B2
Yokoyama (45) Date of Patent: Jun. 16, 2026

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Masanao Yokoyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 415 days.

(21) Appl. No.: 18/251,665

(22) PCT Filed: Oct. 4, 2021

(86) PCT No.: PCT/JP2021/036588
§ 371 (c)(1),
(2) Date: May 11, 2023

(87) PCT Pub. No.: WO2022/102278
PCT Pub. Date: May 19, 2022

(65) Prior Publication Data
US 2023/0411430 A1 Dec. 21, 2023

(30) Foreign Application Priority Data

Nov. 11, 2020 (JP) ................................. 2020-187900

(51) Int. Cl.
*H10F 39/00* (2025.01)
*H10F 39/18* (2025.01)
(52) U.S. Cl.
CPC ........... *H10F 39/811* (2025.01); *H10F 39/18* (2025.01)
(58) Field of Classification Search
CPC ...... H10F 39/811; H10F 39/18; H10F 39/018; H10F 39/12; H10F 39/809; H01L 25/065;
(Continued)

(56) References Cited

U.S. PATENT DOCUMENTS

| | | | | |
|---|---|---|---|---|
| 2015/0279881 A1* | 10/2015 | Shizukuishi | .......... | H10F 39/018 |
| | | | | 438/67 |
| 2019/0104272 A1* | 4/2019 | Izuhara | .............. | H04N 25/7795 |
| 2020/0035628 A1* | 1/2020 | Huang | .................... | H01L 24/08 |

FOREIGN PATENT DOCUMENTS

| | | |
|---|---|---|
| JP | 2004-146816 A | 5/2004 |
| JP | 2009-084299 A | 4/2009 |
| JP | 2011-078755 A | 4/2011 |

OTHER PUBLICATIONS

International Search Report and Written Opinion of PCT Application No. PCT/JP2021/036588, issued on Nov. 16, 2021, 09 pages of ISRWO.

* cited by examiner

*Primary Examiner* — Jonathan Han
(74) *Attorney, Agent, or Firm* — CHIP LAW GROUP

(57) ABSTRACT

Provided is a solid-state imaging device that readily accommodates a design change of a pixel chip or a circuit chip. The solid-state imaging device according to the present technology includes a pixel chip including a pixel having a photoelectric conversion element, at least one circuit chip including a circuit configured to process a signal generated in the pixel, and a connecting substrate electrically connecting the pixel chip and the circuit chip, in which the pixel chip, the connecting substrate, and the circuit chip are stacked in this order. It is possible to provide a solid-state imaging device that readily accommodates a design change of a pixel chip or a circuit chip on the basis of the solid-state imaging device according to the present technology.

20 Claims, 76 Drawing Sheets

(58) Field of Classification Search
CPC ......... H01L 25/07; H01L 25/18; H04N 25/00;
H04N 25/70; H10D 84/00; H10D 84/038
See application file for complete search history.

FIG. 11

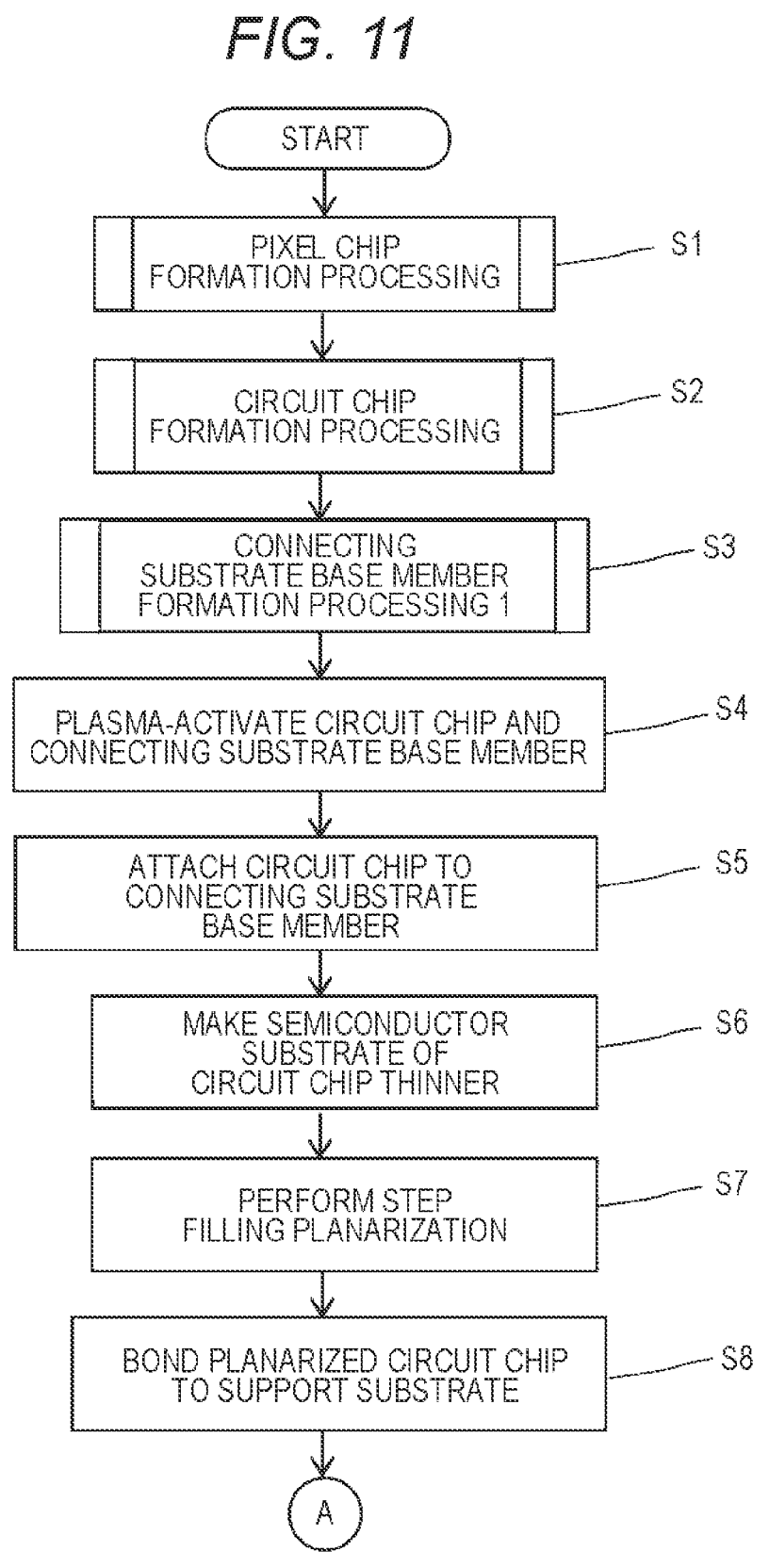

```
        ┌─────────────┐
        │    START    │
        └──────┬──────┘
               ↓
    ┌──────────────────────┐
    │     PIXEL CHIP        │ ─── S1
    │ FORMATION PROCESSING  │
    └──────────┬───────────┘
               ↓
    ┌──────────────────────┐
    │    CIRCUIT CHIP       │ ─── S2
    │ FORMATION PROCESSING  │
    └──────────┬───────────┘
               ↓
    ┌──────────────────────┐
    │      CONNECTING       │ ─── S3
    │ SUBSTRATE BASE MEMBER │
    │ FORMATION PROCESSING 1│
    └──────────┬───────────┘
               ↓
  ┌────────────────────────────┐
  │ PLASMA-ACTIVATE CIRCUIT CHIP│ ─── S4
  │ AND CONNECTING SUBSTRATE    │
  │        BASE MEMBER          │
  └────────────┬───────────────┘
               ↓
  ┌────────────────────────────┐
  │   ATTACH CIRCUIT CHIP TO    │ ─── S5
  │   CONNECTING SUBSTRATE      │
  │        BASE MEMBER          │
  └────────────┬───────────────┘
               ↓
  ┌────────────────────────────┐
  │     MAKE SEMICONDUCTOR      │ ─── S6
  │        SUBSTRATE OF         │
  │     CIRCUIT CHIP THINNER    │
  └────────────┬───────────────┘
               ↓
  ┌────────────────────────────┐
  │      PERFORM STEP           │ ─── S7
  │    FILLING PLANARIZATION    │
  └────────────┬───────────────┘
               ↓
  ┌────────────────────────────┐
  │ BOND PLANARIZED CIRCUIT CHIP│ ─── S8
  │    TO SUPPORT SUBSTRATE     │
  └────────────┬───────────────┘
               ↓
             ( A )
```

PIXEL CHIP FORMATION PROCESSING

START

FORM PIXEL REGION IN
FIRST SEMICONDUCTOR SUBSTRATE — S1-1

FORM FIRST WIRING LAYER ON
FIRST SEMICONDUCTOR SUBSTRATE — S1-2

END

100

100a

IF 101a
100a

100

10

101b
101c     101
101a 100a
100

CIRCUIT CHIP FORMATION PROCESSING

START

FORM CIRCUIT IN
SEMICONDUCTOR SUBSTRATE — S2-1

FORM WIRING OF SECOND WIRING LAYER
ON SEMICONDUCTOR SUBSTRATE — S2-2

FORM OPENING FOR
CONNECTING TERMINAL ON WIRING — S2-3

PERFORM KGD
MEASUREMENT — S2-4

FORM METAL
BONDING SURFACE — S2-5

SEPARATE EACH CIRCUIT CHIP
BY DICING — S2-6

TRANSFER — S2-7

PLANARIZE
CHIP SURFACE — S2-8

END

CONNECTING SUBSTRATE BASE MEMBER
FORMATION PROCESSING 1

400a

IF        401c

400a

IF        401e
          401c

400a

40B 401b
401e
401c 400b
400a

FIG. 20
PLASMA ACTIVATION
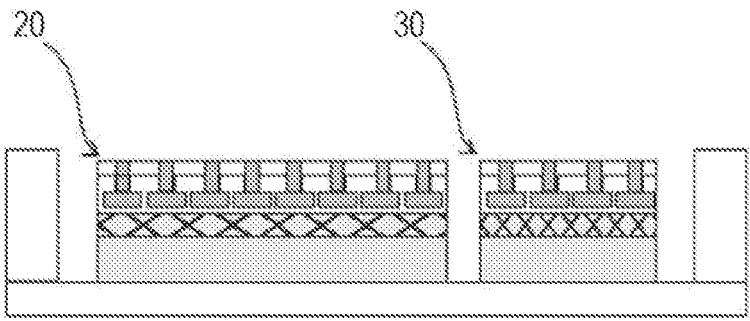
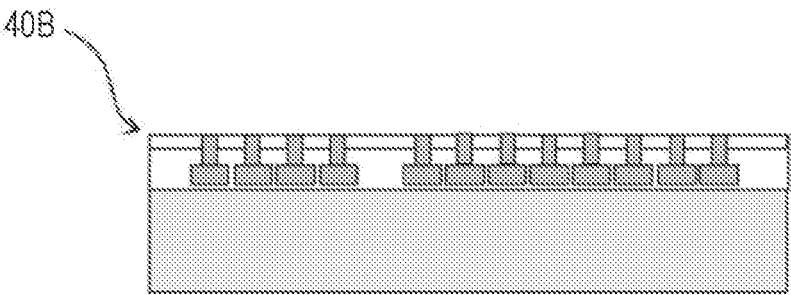

600

700

800

WIRING

10

40

30

20

WIRING

600

800

700

INSULATING MEMBER

10

40

20

30

INSULATING MEMBER

FIG. 39

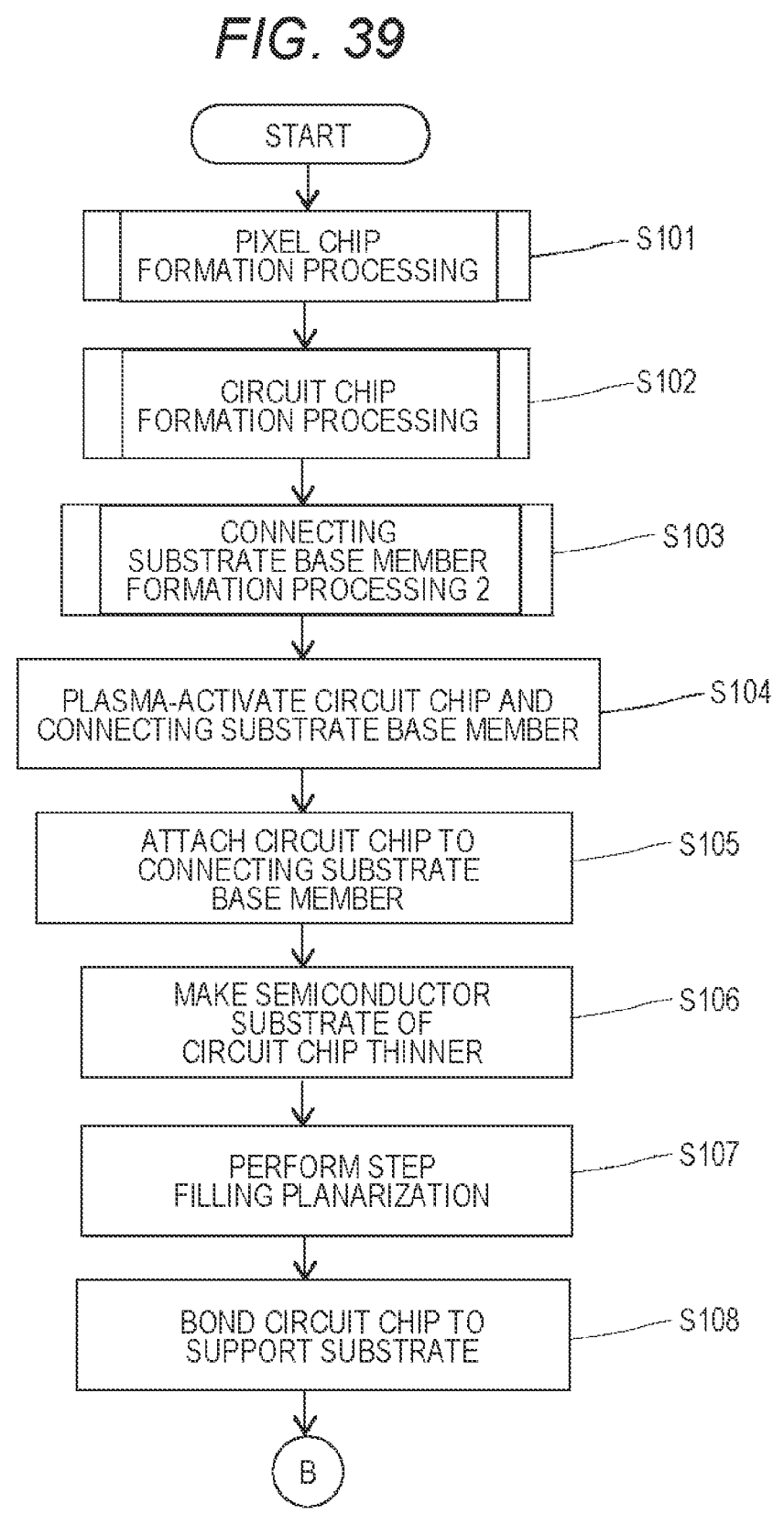

```
                    ┌──────────────┐
                    │    START     │
                    └──────┬───────┘
                           ▼
         ┌─────────────────────────────────┐
         │        PIXEL CHIP               │──── S101
         │   FORMATION PROCESSING          │
         └────────────────┬────────────────┘
                          ▼
         ┌─────────────────────────────────┐
         │       CIRCUIT CHIP              │──── S102
         │   FORMATION PROCESSING          │
         └────────────────┬────────────────┘
                          ▼
         ┌─────────────────────────────────┐
         │        CONNECTING               │──── S103
         │  SUBSTRATE BASE MEMBER          │
         │   FORMATION PROCESSING 2        │
         └────────────────┬────────────────┘
                          ▼
         ┌─────────────────────────────────┐
         │ PLASMA-ACTIVATE CIRCUIT CHIP AND│──── S104
         │ CONNECTING SUBSTRATE BASE MEMBER│
         └────────────────┬────────────────┘
                          ▼
         ┌─────────────────────────────────┐
         │   ATTACH CIRCUIT CHIP TO        │──── S105
         │   CONNECTING SUBSTRATE          │
         │       BASE MEMBER               │
         └────────────────┬────────────────┘
                          ▼
         ┌─────────────────────────────────┐
         │    MAKE SEMICONDUCTOR           │──── S106
         │      SUBSTRATE OF               │
         │   CIRCUIT CHIP THINNER          │
         └────────────────┬────────────────┘
                          ▼
         ┌─────────────────────────────────┐
         │      PERFORM STEP               │──── S107
         │   FILLING PLANARIZATION         │
         └────────────────┬────────────────┘
                          ▼
         ┌─────────────────────────────────┐
         │   BOND CIRCUIT CHIP TO          │──── S108
         │    SUPPORT SUBSTRATE            │
         └────────────────┬────────────────┘
                          ▼
                       ┌─────┐
                       │　 B 　│
                       └─────┘
```

CONNECTING SUBSTRATE BASE MEMBER
FORMATION PROCESSING 2

START

EMBED, IN SEMICONDUCTOR SUBSTRATE,
METAL MATERIAL BEING THROUGH ELECTRODE — S3-10

FORM WIRING ON
SEMICONDUCTOR SUBSTRATE — S3-20

FORM VIA ON WIRING — S3-30

FORM SECOND
CONNECTING TERMINAL ON VIA — S3-40

END

400a

400a

MM

401c
IF
MM
400a 401e
401c
IF
MM
400a

40B'

401b
401e
401c
MM 400b
400a

FIG. 43
PLASMA ACTIVATION
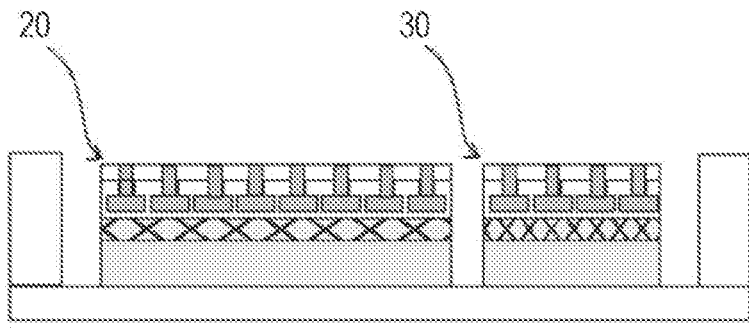
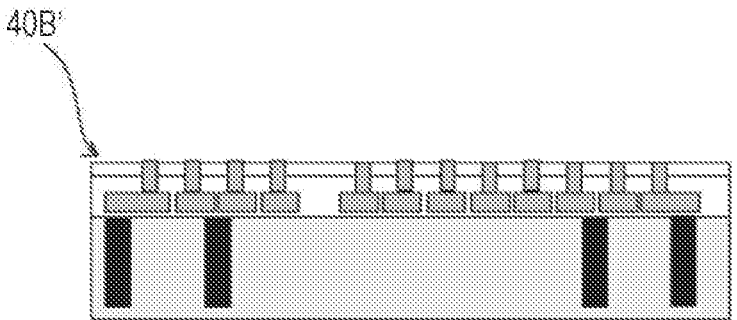

FIG. 59
PLASMA ACTIVATION
20                    30
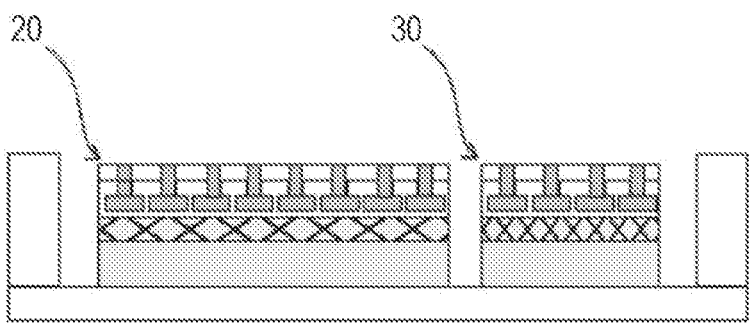
40B
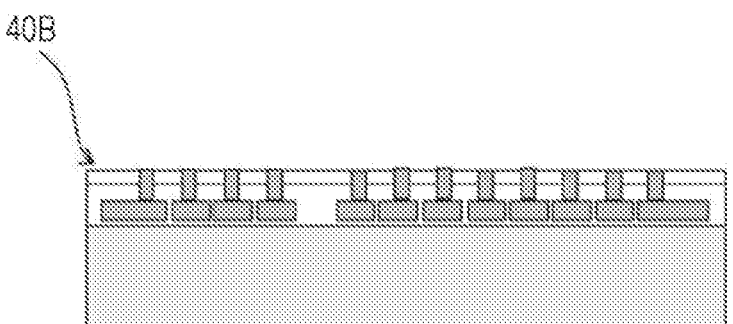

SOLID-STATE IMAGING DEVICE AND ELECTRONIC APPARATUS

CROSS REFERENCE TO RELATED APPLICATIONS

This application is a U.S. National Phase of International Patent Application No. PCT/JP2021/036588 filed on Oct. 4, 2021, which claims priority benefit of Japanese Patent Application No. JP 2020-187900 filed in the Japan Patent Office on Nov. 11, 2020. Each of the above-referenced applications is hereby incorporated herein by reference in its entirety.

TECHNICAL FIELD

The technology according to the present disclosure (here-inafter, also referred to as "the present technology") relates to a solid-state imaging device and an electronic apparatus.

BACKGROUND ART

A solid-state imaging device in which a pixel chip includ-ing an image having a photoelectric conversion element and a circuit chip that processes a signal generated in a pixel of the pixel chip are stacked is known in the related art (for example, see Patent Document 1).

CITATION LIST

Patent Document

Patent Document 1: Japanese Patent Application Laid-Open No. 2004-146816

SUMMARY OF THE INVENTION

Problems to be Solved by the Invention

For the solid-state imaging device in the related art, a change of an element/wiring layout of one of the pixel chip or the circuit chip, however, requires a change of an element/wiring layout of the other, and it is therefore difficult to readily accommodate the design change of the pixel chip or the circuit chip.

It is therefore an object of the present technology to provide a solid-state imaging device that readily accommo-dates a design change of a pixel chip or a circuit chip, and an electronic apparatus including the solid-state imaging device.

Solutions to Problems

The present technology provides a solid-state imaging device including:

a pixel chip including a pixel having a photoelectric conversion element;

at least one circuit chip including a circuit configured to process a signal generated in the pixel; and a connecting substrate electrically connecting the pixel chip and the circuit chip, in which the pixel chip, the connecting substrate, and the circuit chip are stacked in this order.

The connecting substrate may include a substrate body, and wiring provided in the substrate body to connect the pixel chip and the circuit chip.

The substrate body need not be provided with a transistor.

The circuit chip may be smaller than the pixel chip.

The circuit chip may be smaller than the connecting substrate.

The at least one circuit chip may be a plurality of circuit chips arranged side by side.

The substrate body may include a substrate, and a first insulating layer disposed on a side of the substrate adjacent to the circuit chip, and the wiring may be provided in the substrate and the first insulating layer.

The substrate body may further include a second insulat-ing layer disposed on a side of the substrate adjacent to the pixel chip, and the wiring may be provided in the substrate, the first insulating layer, and the second insulating layer.

The pixel chip may include a first semiconductor substrate in which the pixel is formed and a first wiring layer disposed on a side of the first semiconductor substrate adjacent to the connecting substrate, the circuit chip may include a second semiconductor substrate in which the circuit is formed and a second wiring layer disposed on a side of the second semiconductor substrate adjacent to the connecting sub-strate, and the wiring may include a first connecting terminal on a surface of the substrate body adjacent to the first wiring layer at a position corresponding to a connecting terminal of wiring provided in the first wiring layer, and include a second connecting terminal on a surface of the substrate body adjacent to the second wiring layer at a position corresponding to a connecting terminal of wiring provided in the second wiring layer.

The wiring, the wiring formed in the first wiring layer, and the first connecting terminal may be connected via at least one through electrode.

A connecting terminal of the wiring formed in the second wiring layer may be provided on a surface of the second wiring layer adjacent to the connecting substrate, and the connecting terminal and the second connecting terminal may be bonded.

A connecting terminal of the wiring formed in the first wiring layer may be provided on a surface of the first wiring layer adjacent to the connecting substrate, and the connect-ing terminal and the first connecting terminal may be bonded.

A connecting terminal of the wiring formed in the second wiring layer may be provided on a surface of the second wiring layer adjacent to the connecting substrate, and the connecting terminal and the second connecting terminal may be bonded.

The substrate may be a semiconductor substrate.

The substrate may be a glass substrate.

The at least one circuit chip may include a circuit chip having an analog circuit as the circuit.

The at least one circuit chip may include a circuit chip having a logic circuit as the circuit.

The at least one circuit chip may include a circuit chip having a memory circuit as the circuit.

The at least one circuit chip may include a circuit chip having an interface circuit as the circuit.

The present technology further provides an electronic apparatus including a solid-state imaging device, the solid-state imaging device including:

a pixel chip including a pixel having a photoelectric conversion element;

at least one circuit chip including a circuit configured to process a signal generated in the pixel; and a connecting substrate electrically connecting the pixel chip and the circuit chip, in which the pixel chip, the connecting substrate, and the circuit chip are stacked in this order.

BRIEF DESCRIPTION OF DRAWINGS

FIG. 11 is a first half of a flowchart for describing a method for manufacturing the solid-state imaging device according to the first embodiment of the present technology.

FIG. 20 is a cross-sectional view illustrating a process of plasma-activating the two circuit chips and the connecting substrate base member.

FIG. 39 is a first half of a flowchart for describing a method for manufacturing the solid-state imaging device according to the second embodiment of the present technology.

FIG. 43 is a cross-sectional view illustrating a process of plasma-activating two circuit chips and the connecting substrate base member.

FIG. 59 is a cross-sectional view illustrating a process of plasma-activating the two circuit chips and the connecting substrate base member.

MODE FOR CARRYING OUT THE INVENTION

Figure 1A:
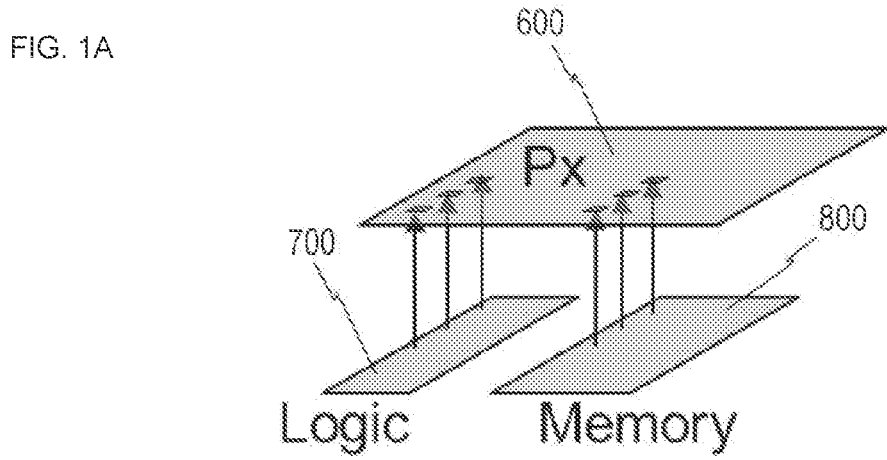
FIGS. 1A, 1B, and 1C are diagrams for describing a problem of a comparative example.

Hereinafter, preferred embodiments of the present technology will be described in detail with reference to the accompanying drawings. Note that, in the present specification and drawings, components having substantially the same functional configuration are denoted by the same reference numerals to avoid the description from being redundant. The embodiments to be described below are each a representative embodiment of the present technology, and the scope of the present technology is not restrictively interpreted by the embodiments. Herein, even in a case where it is described that a solid-state imaging device and an electronic apparatus according to the present technology each exhibit a plurality of effects, the solid-state imaging device and the electronic apparatus according to the present technology are each only required to exhibit at least one effect. Note that the effects described herein are merely examples and should not be restrictively interpreted, and other effects may be provided.

Furthermore, the description will be given in the following order.

1. Introduction
2. Basic concept of present technology
3. Application example of present technology
4. Solid-state imaging device according to first embodiment of present technology
　(1) Configuration of solid-state imaging device
　(2) Operation of solid-state imaging device
　(3) Solid-state imaging device of comparative example
　(4) Solid-state imaging device of example
　(5) Method for manufacturing solid-state imaging device
　(6) Effects of solid-state imaging device and manufacturing method thereof
5. Solid-state imaging device according to second embodiment of present technology
　(1) Configuration of solid-state imaging device
　(2) Solid-state imaging device of example
　(3) Method for manufacturing solid-state imaging device
6. Solid-state imaging device according to third embodiment of present technology
　(1) Configuration of solid-state imaging device
　(2) Solid-state imaging device of example
　(3) Method for manufacturing solid-state imaging device
7. Modification common to embodiments of present technology
8. Usage example of solid-state imaging device to which present technology is applied
9. Another usage example of solid-state imaging device to which present technology is applied
10. Application example to moving object)
11. Application example to endoscopic surgery system 1. <Introduction>

In a stacked-type solid-state imaging device in the related art in which a pixel chip 600 including a pixel region Px and at least one circuit chip 700, 800 (such as a Logic chip or a Memory chip) are stacked as illustrated in FIG. 1A, elements and wiring are laid out such that pads (connecting terminals) of the pixel chip 600 and pads (connecting terminals) of the circuit chip 700, 800 are arranged at positions corresponding to each other.

Figure 1B:
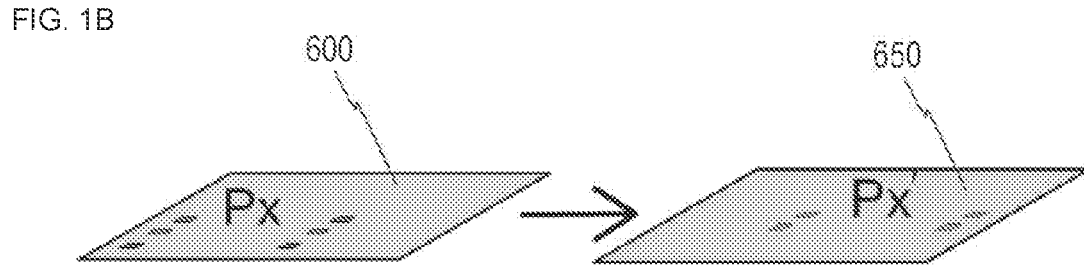
Figure 1C:
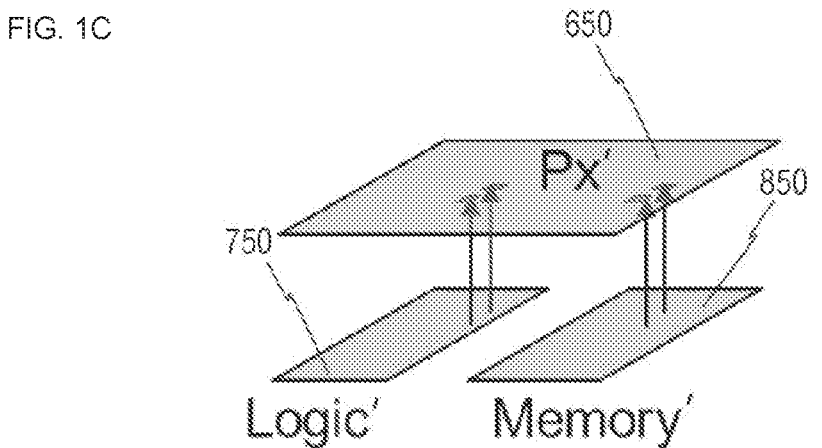

Therefore, as illustrated in FIG. 1B, in a case where the element/wiring layout of the pixel chip 600 is changed to an element/wiring layout of a pixel chip 650 including a pixel region Px', it is also necessary to change, in response to this change, the element/wiring layout of the circuit chip 700, 800 like a circuit chip 750, 850 illustrated in FIG. 1C. That is, in the stacked-type solid-state imaging device in the related art, in a case where the design of the pixel chip is changed, it is necessary to change the design of the circuit chip.

Conversely, in a case where the element/wiring layout of the circuit chip is changed, it is also necessary to change the element/wiring layout of the pixel chip in response to this change. That is, in the stacked-type solid-state imaging device in the related art, in a case where the design of the circuit chip is changed, it is necessary to change the design of the pixel chip.

Due to the above-described restrictions, in the stacked-type solid-state imaging device in the related art, it is necessary to redesign both the pixel chip and the circuit chip for development into derivative products, and there is room for improvement in terms of cost and ensuring reliability. Here, the chip refers to a chip on which an integrated circuit is mounted and that is a single chip separated from a wafer.

8

2. <Basic Concept of Present Technology>

The inventor has focused on a point that development into derivative products becomes easy if the design of one of a pixel chip or a circuit chip constituting an existing solid-state imaging device is changed, and the design of the other can be used as it is.

Figure 2A:
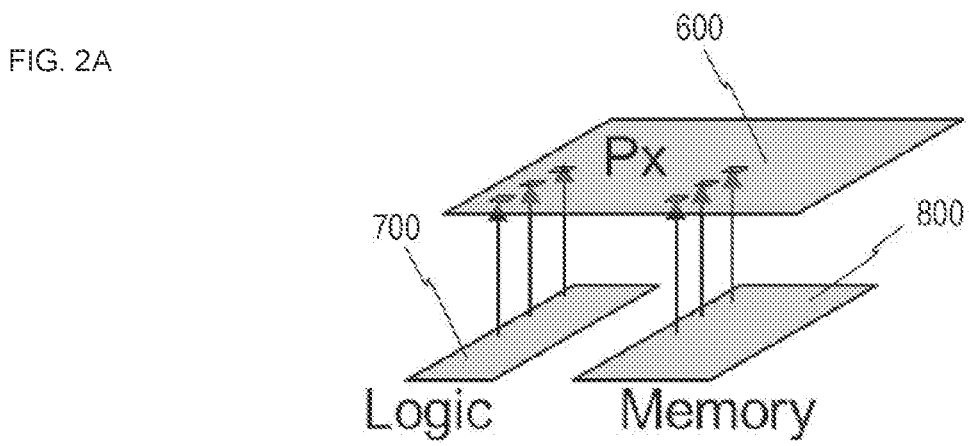
FIGS. 2A, 2B, and 2C are diagrams for describing a concept of the present technology.
Figure 2B:
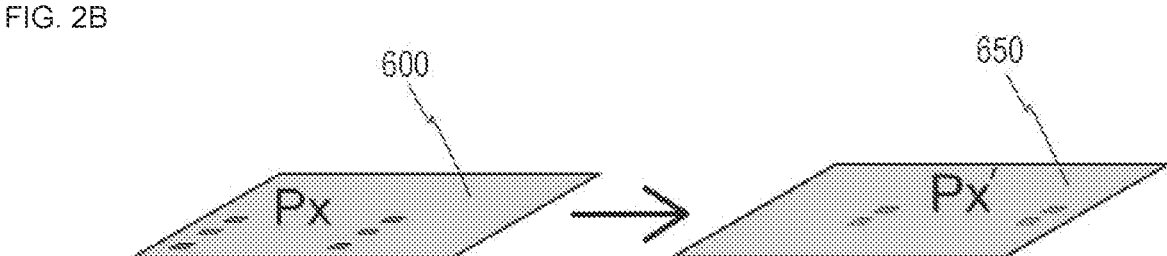
Figure 2C:
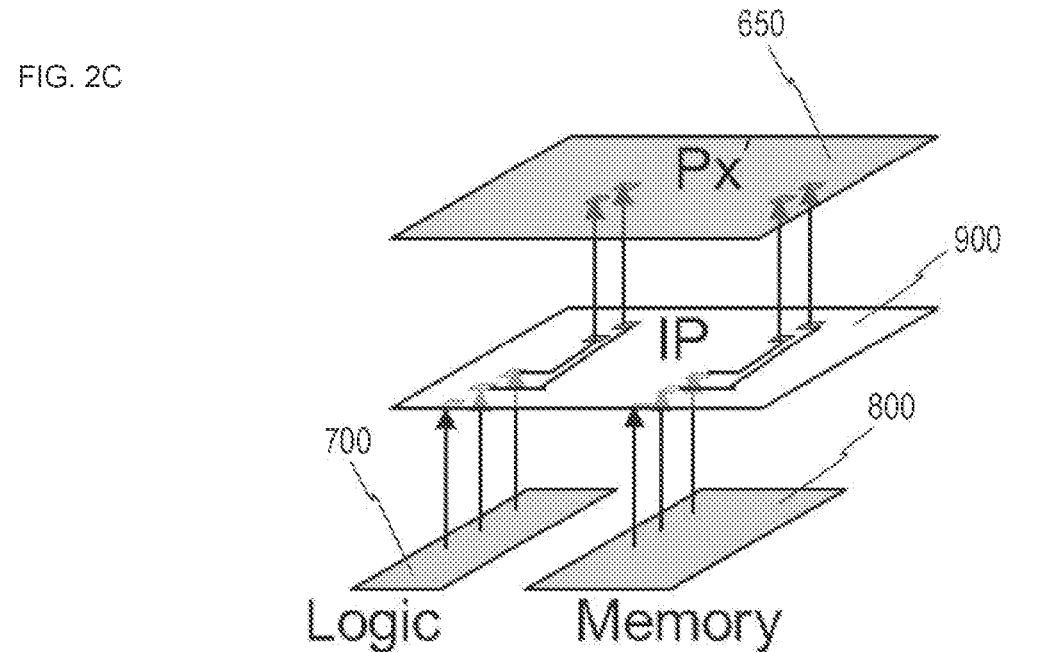

Specifically, in a stacked-type solid-state imaging device in which the pixel chip 600 including the pixel region Px and the at least one circuit chip 700, 800 (such as a Logic chip or a Memory chip) are stacked as illustrated in FIG. 2A, in a case where the element/wiring layout of the pixel chip 600 is changed to the element/wiring layout of the pixel chip 650 including the pixel region Px' as illustrated in FIG. 2B, for example, the pixel chip 650 subjected to a change in the element/wiring layout and the circuit chip 700, 800 having an existing design are stacked (electrically connected) with an interposer substrate 900 interposed between the pixel chip 650 and the circuit chip 700, 800. In the interposer substrate 900, wiring that electrically connects the pixel chip 650 and the circuit chip 700, 800 is provided. On a surface of the interposer substrate 900 adjacent to the pixel chip 650, a connecting terminal is provided at a position corresponding to a connecting terminal of the pixel chip 650. On a surface of the interposer substrate 900 adjacent to the circuit chip 700, 800, a connecting terminal is provided at a position corresponding to a connecting terminal of the circuit chip 700, 800.

Similarly, even in a case where the element/wiring layout of the circuit chip is changed, it is possible to stack (electrically connect) the pixel chip having an existing design and the circuit chip subjected to a change in element/wiring layout with the interposer substrate interposed between the pixel chip and the circuit chip.

3. <Application Example of Present Technology>

Figures 3A, 3B, 3C, 3D:
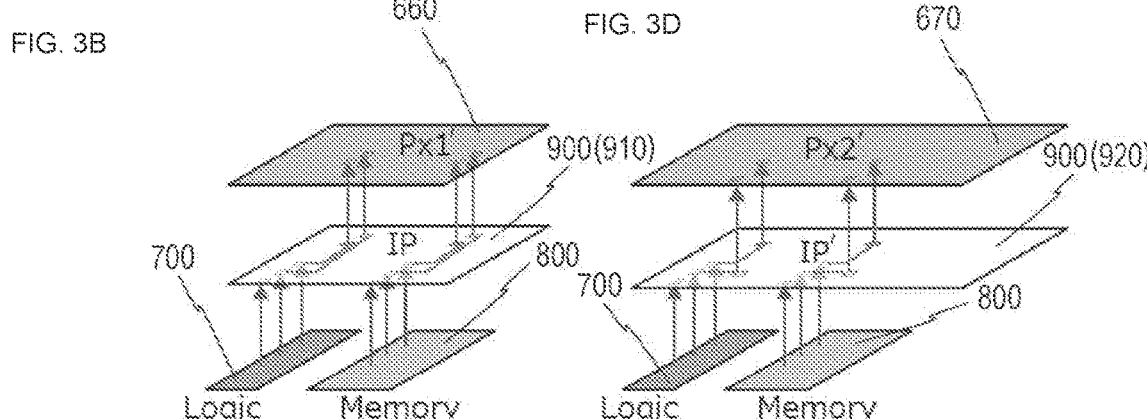
FIGS. 3A, 3B, 3C, and 3D are diagrams for more specifically describing the concept of the present technology.
Figure 4:
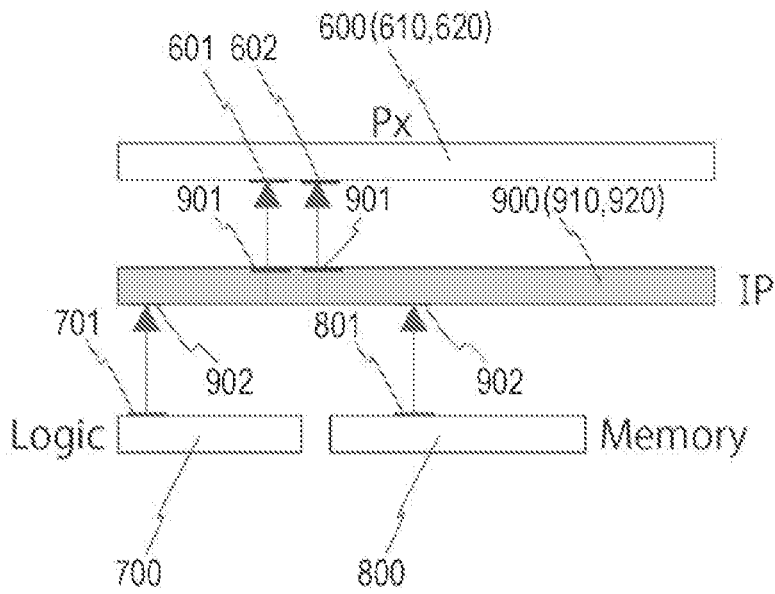
FIG. 4 is a cross-sectional view for catching a foot of FIGS. 3A, 3B, 3C, and 3D.

In a case where the element/wiring layout of the pixel chip 600 having an existing design (for example, a pixel chip 610 including a pixel region Px1) of a solid-state imaging device including the pixel chip 610 and two circuit chips 700 and 800 each having an existing design (such as a Logic chip and a Memory chip) illustrated in FIGS. 3A and 4 is changed to an element/wiring layout of a pixel chip 660 including a pixel region Px1' illustrated in FIG. 3B, it is possible to manufacture a derived solid-state imaging device by bonding the pixel chip 660 subjected to a change in the element/wiring layout and the two circuit chips 700 and 800 each having the existing design with the interposer substrate 900 (for example, an interposer substrate 910) interposed between the pixel chip 660 and the two circuit chips 700 and 800.

In a case where the element/wiring layout of the pixel chip 600 having an existing design (for example, a pixel chip 620 including a pixel region Px2) of a solid-state imaging device including the pixel chip 620 and the two circuit chips 700 and 800 each having an existing design (such as a Logic chip and a Memory chip) illustrated in FIGS. 3C and 4 is changed to an element/wiring layout of a pixel chip 670 including a pixel region Px2' illustrated in FIG. 3D, it is possible to manufacture a derived solid-state imaging device bonding a pixel chip 670 subjected to a change in the element/wiring layout and the two circuit chips 700 and 800 each having the existing design with the interposer substrate 900 (for example, an interposer substrate 920) interposed between the pixel chip 670 and the two circuit chips 700 and 800.

Note that, as illustrated in FIG. 4, on a surface of the interposer substrate 900 (910, 920) adjacent to the pixel chip 600 (610, 620), connecting terminals 901 are provided at positions corresponding to connecting terminals 601 and

602 of the pixel chip 600. On a surface of the interposer substrate 900 adjacent to the circuit chips 700 and 800, connecting terminals 902 are provided at positions corresponding to connecting terminals 701 and 801 of the circuit chips 700 and 800.

Hereinafter, details of the present technology will be described with reference to some embodiments.

4. <Solid-State Imaging Device According to First Embodiment of Present Technology>

(1) Configuration of Solid-State Imaging Device

Figure 5:
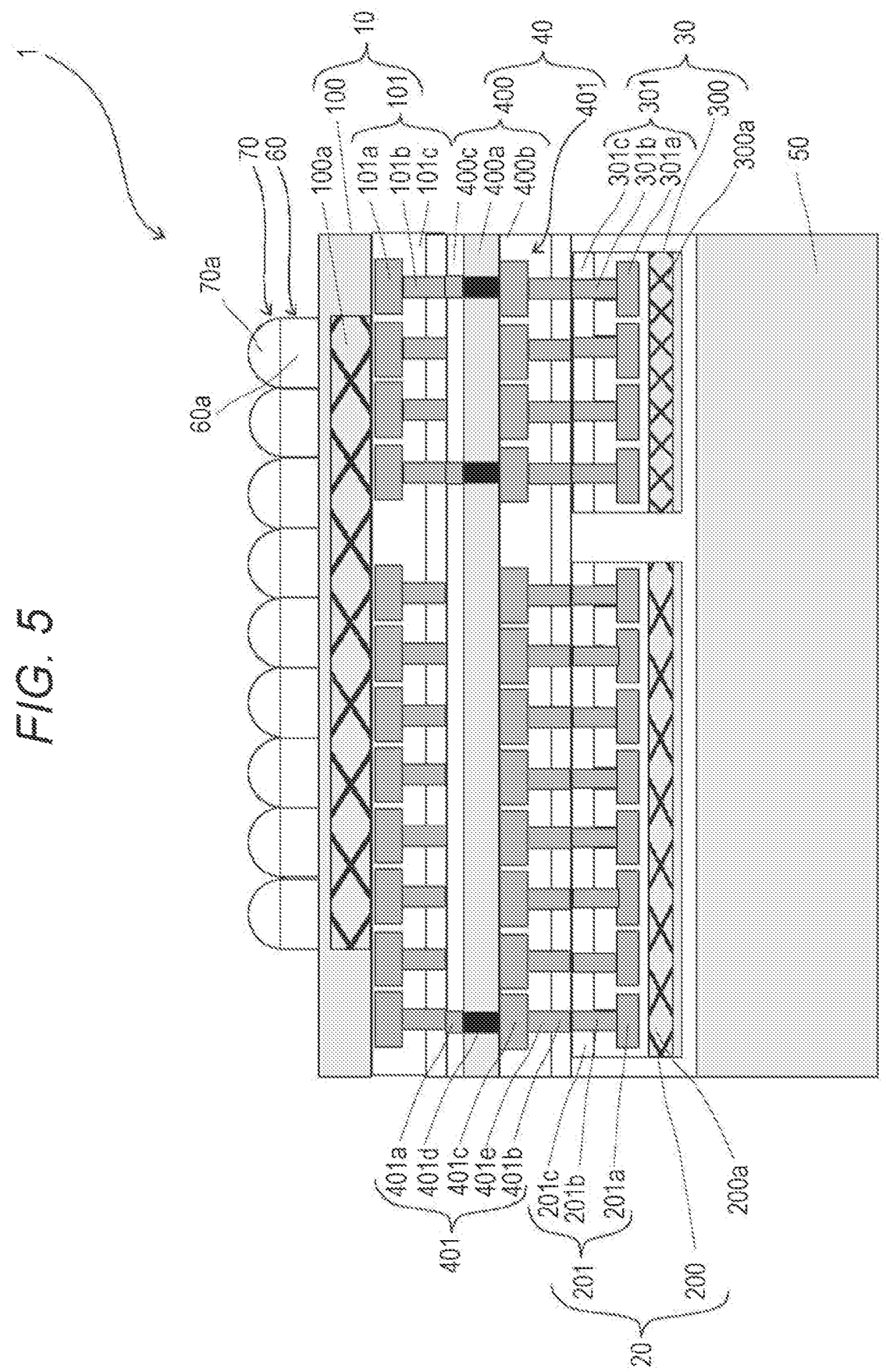
FIG. 5 is a schematic cross-sectional view of a solid-state imaging device according to a first embodiment of the present technology.
Figure 6:
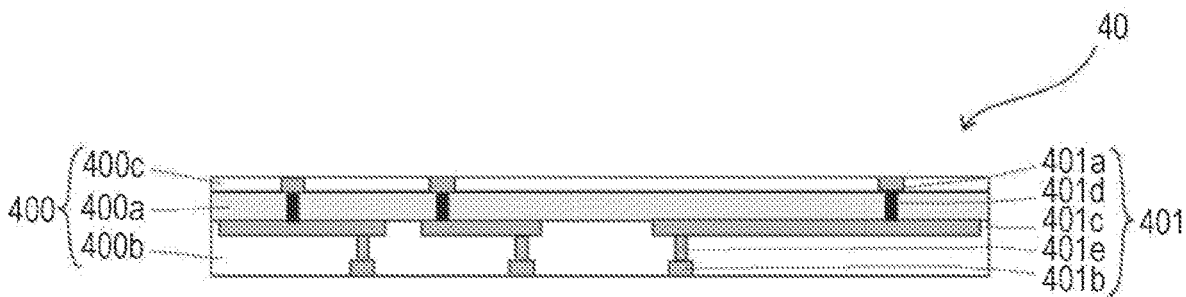
FIG. 6 is a schematic cross-sectional view of a configuration of a connecting substrate of the solid-state imaging device according to the first embodiment of the present technology.

FIG. 5 is a cross-sectional view schematically illustrating a solid-state imaging device 1 according to the first embodiment. FIG. 6 is a detailed cross-sectional view of a connecting substrate in FIG. 5. Hereinafter, the upper side of FIGS. 5 and 6 will be referred to as an "upper side", and the lower side will be referred to as a "lower side".

The solid-state imaging device 1 includes a pixel chip 10, at least one circuit chip 20 and 30 (for example, two circuit chips 20 and 30), and a connecting substrate 40. The connecting substrate 40 is also referred to as an "interposer substrate". Hereinafter, the circuit chips 20 and 30 are also referred to as a "circuit chip group".

In the solid-state imaging device 1, the pixel chip 10, the connecting substrate 40, and the circuit chip group are stacked in this order. Hereinafter, a direction in which the pixel chip 10, the connecting substrate 40, and the circuit chip group are stacked is also simply referred to as a "stacking direction".

The solid-state imaging device 1 further includes a support substrate 50 (for example, a semiconductor substrate) that supports the two circuit chips 20 and 30 from below. The solid-state imaging device 1 is generally referred to as an "image sensor". An image sensor including pixels arranged two-dimensionally is referred to as an "area image sensor".

(Pixel Chip)

The pixel chip 10 includes a pixel having a photoelectric conversion element. The photoelectric conversion element is, for example, a photodiode (PD). More specifically, the photoelectric conversion element is, for example, a PN photodiode, a PIN photodiode, a single photon avalanche photodiode (SPAD), an avalanche photo diode (APD), or the like.

As an example, the pixel chip 10 includes a plurality of pixels arranged two-dimensionally (for example, arranged in a matrix).

As an example, the pixel chip 10 includes a first semiconductor substrate 100 and a first wiring layer 101 disposed on a side of the first semiconductor substrate 100 adjacent to the connecting substrate 40.

The first semiconductor substrate 100 is, for example, a Si substrate, a Ge substrate, a GaAs substrate, an InGaAs substrate, or the like.

As an example, the plurality of pixels and a control circuit (analog circuit) that controls each pixel are formed in the first semiconductor substrate 100. The control circuit includes, for example, a circuit element such as a transistor. More specifically, as an example, the control circuit includes a plurality of pixel transistors (that is, MOS transistors). The plurality of pixel transistors may include, for example, three transistors, a transfer transistor, a reset transistor, and an amplification transistor. Alternatively, the plurality of pixel transistors can include four transistors further including a selection transistor. An equivalent circuit of the unit pixel is similar to a normal circuit, so that no detailed description will be given of the equivalent circuit. The pixel may be configured as one unit pixel. Furthermore, the pixel may have a shared pixel structure. This shared pixel structure is a structure in which a plurality of photodiodes shares a floating diffusion constituting a transfer transistor and transistors other than the transfer transistor.

As an example, each pixel is a back-illuminated pixel that is irradiated with light from a back surface side, the back surface being opposite from a front surface, the front surface being a surface of the first semiconductor substrate 100 adjacent to the first wiring layer 101.

Hereinafter, a region of the first semiconductor substrate 100 where the plurality of pixels is arranged is referred to as a "pixel region 100a".

As an example, a color filter array 60 including a plurality of color filters 60a corresponding to the plurality of pixels is formed on the pixel region 100a of the semiconductor substrate 100. As an example, a microlens array 70 including a plurality of microlenses 70a corresponding to the plurality of color filters 60a is formed on the color filter array 60.

The first wiring layer 101 has wiring that electrically connects the first semiconductor substrate 100 and the connecting substrate 40 provided in an insulating film 101c. The wiring includes, for example, wiring 101a and a connecting terminal 101b.

The first wiring layer 101 may be a single-layer wiring layer in which the wiring 101a is provided in a single-layer structure in the insulating film 101c, or may be a multilayer wiring layer in which the wiring 101a is provided in a multilayer structure in the insulating film 101c.

In the first wiring layer 101, the wiring 101a and the connecting terminal 101b are formed using, for example, copper (Cu), aluminum (Al), tungsten (W), or the like, and the insulating film 101c is formed using, for example, a silicon oxide film, a silicon nitride film, or the like.

(Circuit Chip)

The circuit chips 20 and 30 each include a circuit that processes a signal generated in the pixel of the pixel chip 10 (an electrical signal obtained as a result of photoelectrical conversion performed by the photoelectric conversion element). The circuit includes, for example, a circuit element such as a transistor.

The circuit chip 20 includes, for example, a memory circuit 200a. The circuit chip 30 includes, for example, a logic circuit 300a and an A/D conversion circuit (analog circuit that performs A/D conversion). The A/D conversion circuit converts an analog signal generated in the pixel of the pixel chip 10 into a digital signal. The logic circuit 300a processes the digital signal generated by the A/D conversion circuit. The memory circuit 200a temporarily stores and holds the digital signal generated by the A/D conversion circuit and/or the digital signal processed by the logic circuit 300a.

As an example, the circuit chips 20 and 30 are arranged side by side (arranged in a direction orthogonal to the stacking direction).

As an example, each circuit chip is smaller than the pixel chip 10 and smaller than the connecting substrate 40.

As an example, the circuit chip 20 is larger than the circuit chip 30.

As an example, the circuit chip 20 includes a second semiconductor substrate 200 in which the memory circuit 200a is formed and a second wiring layer 201 disposed on a side of the second semiconductor substrate 200 adjacent to the connecting substrate 40.

The second semiconductor substrate 200 is, for example, a Si substrate, a Ge substrate, a GaAs substrate, an InGaAs substrate, or the like.

In the second wiring layer 201, wiring that electrically connects the second semiconductor substrate 200 and the connecting substrate 40 is provided in an insulating film 201*c*. The wiring includes, for example, wiring 201*a* and a connecting terminal 201*b*.

The second wiring layer 201 may be a single-layer wiring layer in which the wiring 201*a* is provided in a single-layer structure in the insulating film 201*c*, or may be a multilayer wiring layer in which the wiring 201*a* is provided in a multilayer structure in the insulating film 201*c*.

As an example, the circuit chip 30 includes a second semiconductor substrate 300 in which the logic circuit 300*a* and the A/D conversion circuit are formed, and a second wiring layer 301 disposed on a side of the second semiconductor substrate 300 adjacent to the connecting substrate 40.

The second semiconductor substrate 300 is, for example, a Si substrate, a Ge substrate, a GaAs substrate, an InGaAs substrate, or the like.

In the second wiring layer 301, wiring that electrically connects the second semiconductor substrate 300 and the connecting substrate 40 is provided in an insulating film 301*c*. The wiring includes, for example, wiring 301*a* and a connecting terminal 301*b*.

The second wiring layer 301 may be a single-layer wiring layer in which the wiring 301*a* is provided in a single-layer structure in the insulating film 301*c*, or may be a multilayer wiring layer in which the wiring 301*a* is provided in a multilayer structure in the insulating film 301*c*.

(Connecting Substrate)

The connecting substrate 40 electrically connects the pixel chip 10 and the circuit chips 20 and 30.

Here, the connecting substrate 40 is identical in size to the pixel chip 10, but may be slightly larger or slightly smaller than the pixel chip 10.

As an example, the connecting substrate 40 includes a substrate body 400 and wiring 401 provided in the substrate body 400 to connect the pixel chip 10 and the circuit chips 20 and 30.

The substrate body 400 is not provided with a transistor, for example.

As an example, the substrate body 400 includes a semiconductor substrate 400*a*, a first insulating layer 400*b* disposed on a side of the semiconductor substrate 400*a* adjacent to the circuit chip group, and a second insulating layer 400*c* disposed on a side of the semiconductor substrate 400*a* adjacent to the pixel chip 10.

The semiconductor substrate 400*a* is, for example, a Si substrate, a Ge substrate, a GaAs substrate, an InGaAs substrate, or the like.

A thickness of the semiconductor substrate 400*a* is preferably less than or equal to 10 μm and more preferably less than or equal to 5 μm, for example. The thickness of the semiconductor substrate 400*a* is preferably greater than or equal to 1 μm and more preferably greater than or equal to 3 μm, for example.

As illustrated in FIG. 6, as an example, at least one through electrode 401*d* (for example, a plurality of through electrodes 401*d*) passing through in a thickness direction is provided in the semiconductor substrate 400*a*.

The first insulating layer 400*b* and the second insulating layer 400*c* each include an insulator such as SiO, SiO₂, or SiN.

The wiring 401 is provided in the semiconductor substrate 400*a*, the first insulating layer 400*b*, and the second insulating layer 400*c*. Specifically, the wiring 401 is provided throughout the semiconductor substrate 400*a*, the first insulating layer 400*b*, and the second insulating layer 400*c*. Note that FIG. 5 illustrates the wiring 401 in a simplified manner.

More specifically, as illustrated in FIGS. 5 and 6, the wiring 401 has a first connecting terminal 401*a* provided on a surface of the substrate body 400 adjacent to the first wiring layer 101 at a position corresponding to the connecting terminal 101*b* of the wiring provided in the first wiring layer 101, and has a second connecting terminal 401*b* provided on a surface of the substrate body 400 adjacent to the second wiring layers 201 and 301 at a position corresponding to each of the connecting terminals 201*b* and 301*b* of the wiring provided in the second wiring layers 201 and 301.

The first connecting terminal 401*a* is disposed in the second insulating layer 400*c* so as to make a surface bonded to the connecting terminal 101*b* of the wiring of the first wiring layer 101 roughly flush with an upper surface of the second insulating layer 400*c*. The first connecting terminal 401*a* includes metal such as Cu, for example.

The second connecting terminal 401*b* is disposed in the first insulating layer 400*b* so as to make a surface bonded to the connecting terminals 201*b* and 301*b* of the wiring of the second wiring layers 201 and 301 roughly flush with a lower surface of the first insulating layer 400*b*. The second connecting terminal 401*b* includes metal such as Cu, for example.

The wiring 401 further includes wiring 401*c* provided in the first insulating layer 400*b* along an upper surface of the first insulating layer 400*b*.

The wiring 401*c* is connected to the first connecting terminal 401*a* through the through electrode 401*d* passing through the semiconductor substrate 400*a* and is connected to the second connecting terminal 401*b* through a via 401*e* formed in the first insulating layer 400*b*. The through electrode 401*d* includes metal such as Cu, W, or Al, for example.

The connecting terminal 101*b* of the wiring formed in the first wiring layer 101 is provided on a surface of the first wiring layer 101 adjacent to the connecting substrate 40, and the connecting terminal 101*b* and the first connecting terminal 401*a* are bonded by metal-metal bonding (for example, Cu—Cu bonding).

The respective connecting terminals 201*b* and 301*b* of the wiring formed in the second wiring layers 201 and 301 are provided on surfaces of the second wiring layers 201 and 301 adjacent to the connecting substrate 40, and the connecting terminals 201*b* and 301*b* and corresponding second connecting terminals 401*b* are bonded by metal-metal bonding (for example, Cu—Cu bonding).

(2) Operation of Solid-State Imaging Device

Light (image light) from a subject impinges on the pixel region 100*a* through the microlens array 70 and the color filter array 60 of the solid-state imaging device 1. Light concentrated by each microlens 70*a* and transmitted through a corresponding color filter 60*a* impinges on the photoelectric conversion element of a corresponding pixel. The photoelectric conversion element photoelectrically converts the incident light. An electrical signal (analog signal) obtained as a result of the photoelectric conversion performed by the photoelectric conversion element is transmitted to the A/D conversion circuit of the circuit chip 30 through the connecting substrate 40 to be converted into a digital signal, then temporarily stored and held in the memory circuit 200*a* of the circuit chip 20, and sequentially transmitted to the logic circuit 300*a*. The logic circuit 300*a* processes the transmitted digital signal. Note that the digital signal can also be temporarily stored and held in the memory circuit 200*a* during and/or after processing in the logic circuit 300*a*.

(3) Solid-State Imaging Device of Comparative Example

Figures 7A, 7B:
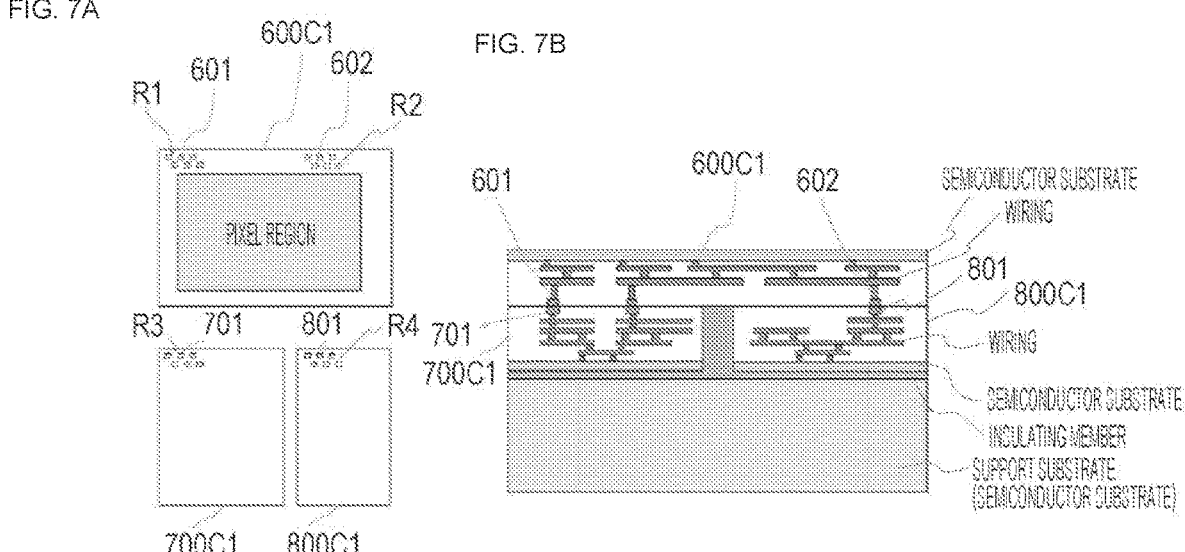
FIG. 7A is a schematic plan view of a pixel chip, a first circuit chip, and a second circuit chip of a solid-state imaging device of a comparative example 1.
FIG. 7B is a schematic cross-sectional view the solid-state imaging device of the comparative example 1.

FIG. 7A illustrates a plan view of a pixel chip 600C1 and circuit chips 700C1 and 800C1 of a solid-state imaging device of a comparative example 1. FIG. 7B illustrates a cross-sectional view of the solid-state imaging device of the comparative example 1.

As illustrated in FIG. 7B, in the solid-state imaging device of the comparative example 1, the pixel chip 600C1 and the circuit chip group are stacked. The circuit chip group includes the circuit chips 700C1 and 800C1 and is supported by a support substrate. The circuit chips 700C1 and 800C1 are connected to each other via wiring.

As illustrated in the upper diagram of FIG. 7A, in the solid-state imaging device of the comparative example 1, a plurality of connecting terminals 601 for connection with the circuit chip 700C1 is laid out in a horizontally long manner as a whole in a first region R1 of the pixel chip 600C1, and a plurality of connecting terminals 602 for connection with the circuit chip 800C1 is laid out in a horizontally long manner as a whole in a second region R2 of the pixel chip 600C1.

As illustrated in the lower diagram of FIG. 7A, in the solid-state imaging device of the comparative example 1, a plurality of connecting terminals 701 each bonded to a corresponding one of the plurality of connecting terminals 601 provided in the first region R1 of the pixel chip 600C1 is laid out in a horizontally long manner as a whole in a third region R3 of the circuit chip 700C1 corresponding to the first region R1. A plurality of connecting terminals 801 each bonded to a corresponding one of the plurality of connecting terminals 602 provided in the second region R2 of the pixel chip 600C1 is laid out in a horizontally long manner as a whole in a fourth region R4 of the circuit chip 800C1 corresponding to the second region R2.

Figures 8A, 8B:
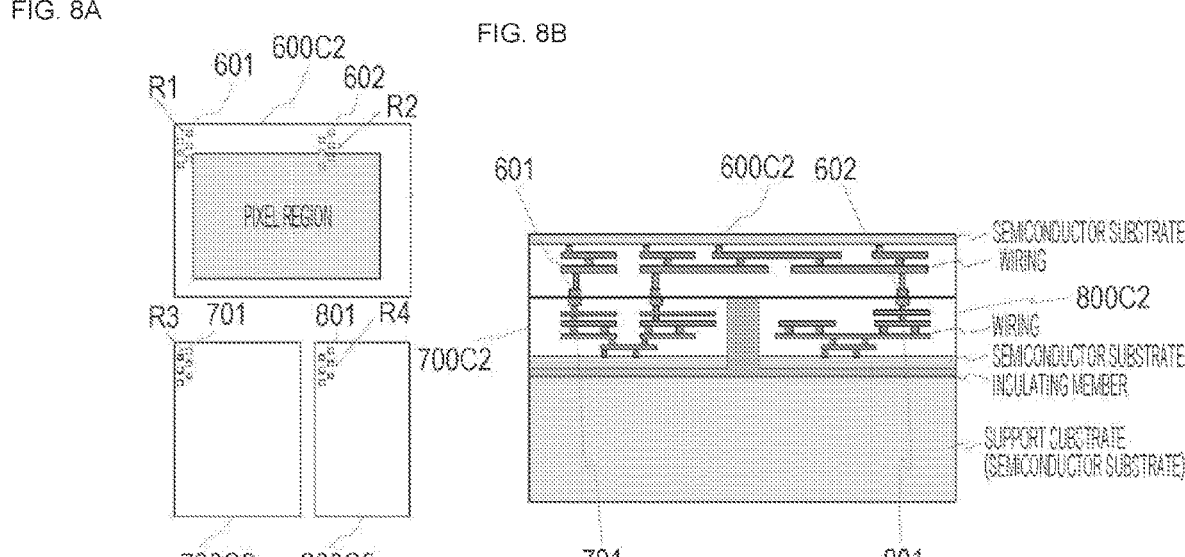
FIG. 8A is a schematic plan view of a pixel chip, a first circuit chip, and a second circuit chip of a solid-state imaging device of a comparative example 2.
FIG. 8B is a schematic cross-sectional view the solid-state imaging device of the comparative example 2.

FIG. 8A illustrates a plan view of a pixel chip 600C2 and circuit chips 700C2 and 800C2 of a solid-state imaging device of a comparative example 2. FIG. 8B illustrates a cross-sectional view of the solid-state imaging device of the comparative example 2.

As illustrated in FIG. 8B, in the solid-state imaging device of the comparative example 2, the pixel chip 600C2 and the circuit chip group are stacked. The circuit chip group includes the circuit chips 700C2 and 800C2 and is supported by a support substrate. The circuit chips 700C2 and 800C2 are connected to each other via wiring.

As illustrated in the upper diagram of FIG. 8A, in the solid-state imaging device of the comparative example 2, a plurality of connecting terminals 601 for connection with the circuit chip 700C2 is laid out in a vertically long manner as a whole in a first region R1 of the pixel chip 600C2, and a plurality of connecting terminals 602 for connection with the circuit chip 800C2 is laid out in a vertically long manner as a whole in a second region R2 of the pixel chip 600C2.

As illustrated in the lower diagram of FIG. 8A, in the solid-state imaging device of the comparative example 2, a plurality of connecting terminals 701 each bonded to a corresponding one of the plurality of connecting terminals 601 provided in the first region R1 of the pixel chip 600C2 is laid out in a vertically long manner as a whole in a third region R3 of the circuit chip 700C2 corresponding to the first region R1. A plurality of connecting terminals 801 each bonded to a corresponding one of the plurality of connecting terminals 602 provided in the second region R2 of the pixel chip 600C2 is laid out in a vertically long manner as a whole in a fourth region R4 of the circuit chip 800C2 corresponding to the second region R2.

As described above, in the solid-state imaging devices of the comparative examples 1 and 2, the pixel chip and each circuit chip are directly bonded (stacked), so that the connecting terminal of the pixel chip and the connecting terminal of each circuit chip need to be provided at positions corresponding to each other (positions bonded to each other).

For example, in the solid-state imaging device of the comparative example 1, in a case where the design of the pixel chip 600C1 is changed to the design of the pixel chip 600C2 of the solid-state imaging device of the comparative example 2, it is also necessary to change, in response to this change, the designs of the circuit chips 700C1 and 800C1 to the designs of the circuit chips 700C2 and 800C2 of the solid-state imaging device of the comparative example 2.

For example, in the solid-state imaging device of the comparative example 2, in a case where the design of the pixel chip 600C2 is changed to the design of the pixel chip 600C1 of the solid-state imaging device of the comparative example 1, it is also necessary to change, in response to this change, the designs of the circuit chips 700C2 and 800C2 to the designs of the circuit chips 700C1 and 800C1 of the solid-state imaging device 1 of the comparative example 1.

That is, in the solid-state imaging devices of the comparative examples 1 and 2, when the element/wiring layout of the pixel chip is changed, it is necessary to change, in response to this change, the element/wiring layout of each circuit chip. Therefore, for example, in a case where it is desired to change the design of the pixel chip, each circuit chip having an existing design cannot be used as it is, and there is room for improvement in terms of cost and reliability.

For example, in the solid-state imaging device of the comparative example 1, in a case where the designs of the circuit chips 700C1 and 800C1 are changed to the designs of the circuit chips 700C2 and 800C2 of the solid-state imaging device of the comparative example 2, it is also necessary to change, in response to this change, the design of the pixel chip 600C1 to the design of the pixel chip 600C2 of the solid-state imaging device of the comparative example 2.

For example, in the solid-state imaging device of the comparative example 2, in a case where the designs of the circuit chips 700C2 and 800C2 are changed to the designs of the circuit chips 700C1 and 800C1 of the solid-state imaging device of the comparative example 1, it is also necessary to change, in response to this change, the design of the pixel chip 600C2 to the design of the pixel chip 600C1 of the solid-state imaging device of the comparative example 1.

That is, in the solid-state imaging devices of the comparative examples 1 and 2, when the element/wiring layout of each circuit chip is changed, it is also necessary to change, in response to this change, the element/wiring layout of the pixel chip. Therefore, for example, in a case where it is desired to change the design of each circuit chip, a pixel chip having an existing design cannot be used as it is, and there is room for improvement in terms of cost and reliability.

(4) Solid-State Imaging Device of Example

Figures 9A, 9B:
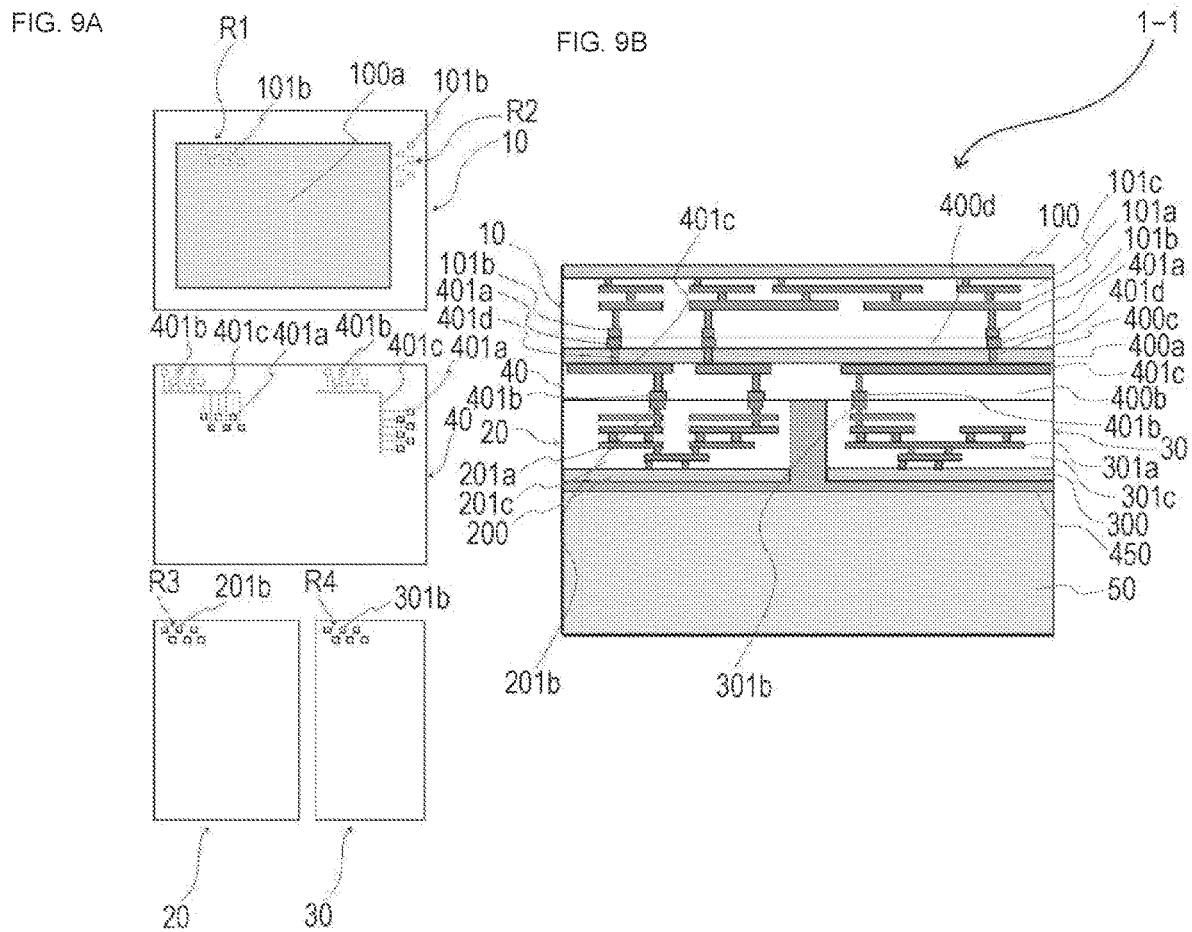
FIG. 9A is a schematic plan view a pixel chip, a connecting substrate, and two circuit chips of a solid-state imaging device according to an example 1 of the first embodiment of the present technology.
FIG. 9B is a schematic cross-sectional view of the solid-state imaging device according to the example 1 of the first embodiment of the present technology.

FIG. 9A illustrates a plan view of a pixel chip 10, a connecting substrate 40, and two circuit chips 20 and 30 of a solid-state imaging device 1-1 of an example 1 of the first embodiment. FIG. 9B illustrates a cross-sectional view of the solid-state imaging device 1-1 of the example 1 of the first embodiment. Note that FIGS. 9A and 9B illustrate neither the color filter array 60 nor the microlens array 70.

As an example, as illustrated in the upper diagram of FIG. 9A, in the solid-state imaging device 1-1 of the example 1 of the first embodiment of the present technology, a plurality of connecting terminals 101b is laid out in a horizontally long manner as a whole in a first region R1 of the pixel chip 10, and a plurality of connecting terminals 101b is laid out in a vertically long manner as a whole in a second region R2 of the pixel chip 10.

As an example, as illustrated in the lower diagram of FIG. 9A, in the solid-state imaging device 1-1, a plurality of connecting terminals 201b is laid out in a horizontally long manner as a whole in a third region R3 of the circuit chip 20, and a plurality of connecting terminals 301b is laid out in a horizontally long manner as a whole in a fourth region R4 of the circuit chip 30.

As an example, as illustrated in the middle diagram of FIG. 9A, in the solid-state imaging device 1-1, a plurality of first connecting terminals 401a is laid out in a horizontally long manner as a whole in a region of the connecting substrate 40 corresponding to the first region R1 of the pixel chip 10 so as to correspond (be bonded), on a one-to-one basis, to the plurality of connecting terminals 101b in the first region R1.

As an example, as illustrated in the middle diagram of FIG. 9A, in the solid-state imaging device 1-1, a plurality of first connecting terminals 401a is laid out in a vertically long manner as a whole in a region of the connecting substrate 40 corresponding to the second region R2 of the pixel chip 10 so as to correspond (be bonded), on a one-to-one basis, to the plurality of connecting terminals 101b in the second region R2.

As an example, as illustrated in the middle diagram of FIG. 9A, in the solid-state imaging device 1-1, a plurality of second connecting terminals 401b is laid out in a horizontally long manner as a whole in a region of the connecting substrate 40 corresponding to the third region R3 of the circuit chip 20 so as to correspond (be bonded), on a one-to-one basis, to the plurality of connecting terminals 201b in the third region R3.

As an example, as illustrated in the middle diagram of FIG. 9A, in the solid-state imaging device 1-1, a plurality of second connecting terminals 401b is laid out in a horizontally long manner as a whole in a region of the connecting substrate 40 corresponding to the fourth region R4 of the circuit chip 30 so as to correspond (be bonded), on a one-to-one basis, to the plurality of connecting terminals 301b in the fourth region R4.

Figures 10A, 10B:
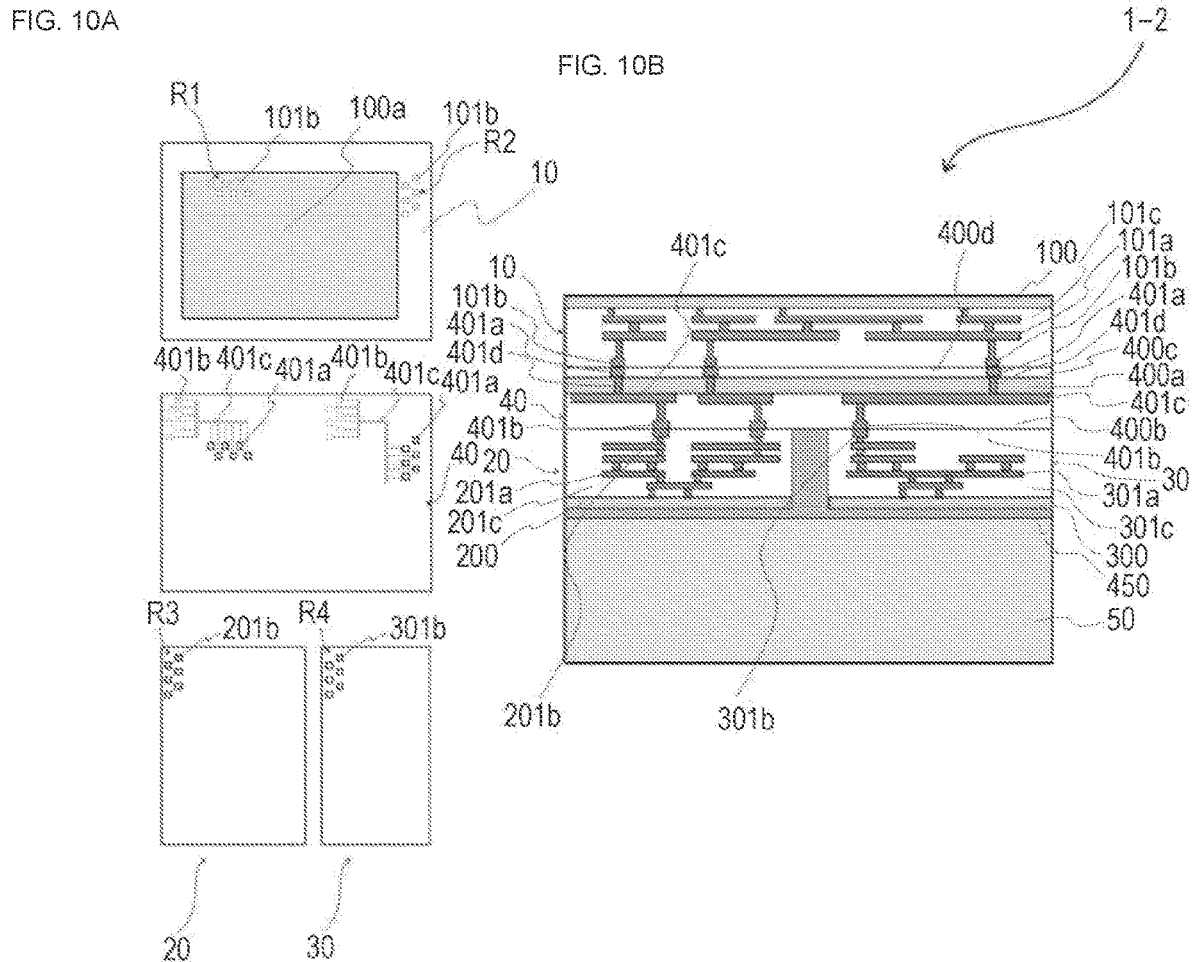
FIG. 10A is a schematic plan view a pixel chip, a connecting substrate, and two circuit chips of a solid-state imaging device according to an example 2 of the first embodiment of the present technology.
FIG. 10B is a schematic cross-sectional view of the solid-state imaging device according to the example 2 of the first embodiment of the present technology.

FIG. 10A illustrates a plan view of a pixel chip 10, a connecting substrate 40, and two circuit chips 20 and 30 of a solid-state imaging device 1-2 of an example 2 of the first embodiment. FIG. 10B illustrates a cross-sectional view of the solid-state imaging device 1-2 of the example 2 of the first embodiment. Note that FIGS. 10A and 10B illustrate neither the color filter array 60 nor the microlens array 70.

As an example, as illustrated in the upper diagram of FIG. 10A, in the solid-state imaging device 1-2 of the example 2 of the first embodiment of the present technology, a plurality of connecting terminals 101b is laid out in a horizontally long manner as a whole in a first region R1 of the pixel chip 10, and a plurality of connecting terminals 101b is laid out in a vertically long manner as a whole in a second region R2 of the pixel chip 10.

As an example, as illustrated in the lower diagram of FIG. 10A, in the solid-state imaging device 1-2, a plurality of connecting terminals 201b is laid out in a vertically long manner as a whole in a third region R3 of the circuit chip 20, and a plurality of connecting terminals 301b is laid out in a vertically long manner as a whole in a fourth region R4 of the circuit chip 30.

As an example, as illustrated in the middle diagram of FIG. 10A, in the solid-state imaging device 1-2, a plurality of first connecting terminals 401a is laid out in a horizontally long manner as a whole in a region of the connecting substrate 40 corresponding to the first region R1 of the pixel chip 10 so as to correspond (be bonded), on a one-to-one basis, to the plurality of connecting terminals 101b in the first region R1.

As an example, as illustrated in the middle diagram of FIG. 10A, in the solid-state imaging device 1-2, a plurality of first connecting terminals 401a is laid out in a vertically long manner as a whole in a region of the connecting substrate 40 corresponding to the second region R2 of the pixel chip 10 so as to correspond (be bonded), on a one-to-one basis, to the plurality of connecting terminals 101b in the second region R2.

As an example, as illustrated in the middle diagram of FIG. 10A, in the solid-state imaging device 1-2, a plurality of second connecting terminals 401b is laid out in a vertically long manner as a whole in a region of the connecting substrate 40 corresponding to the third region R3 of the circuit chip 20 so as to correspond (be bonded), on a one-to-one basis, to the plurality of connecting terminals 201b in the third region R3.

As an example, as illustrated in the middle diagram of FIG. 10A, in the solid-state imaging device 1-2, a plurality of second connecting terminals 401b is laid out in a vertically long manner as a whole in a region of the connecting substrate 40 corresponding to the fourth region R4 of the circuit chip 30 so as to correspond (be bonded), on a one-to-one basis, to the plurality of connecting terminals 301b in the fourth region R4.

For example, in the solid-state imaging device 1-1 of the example 1, in a case where the designs of the circuit chips 20 and 30 are changed to the designs of the circuit chips 20 and 30 of the solid-state imaging device 1-2 of the example 2, it is only required that the design of the connecting substrate 40 be changed, in response to this change, to the design of the connecting substrate 40 of the solid-state imaging device 1-2 of the example 2, and the design of the pixel chip 10 need not be changed.

For example, in the solid-state imaging device 1-2 of the example 2, in a case where the designs of the circuit chips 20 and 30 are changed to the designs of the circuit chips 20 and 30 of the solid-state imaging device 1-1 of the example 1, it is only required that the design of the connecting substrate 40 be changed, in response to this change, to the design of the connecting substrate 40 of the solid-state imaging device 1-1 of the example 1, and the design of the pixel chip 10 need not be changed.

In any of the above-described cases, it is possible to stack and electrically connect the pixel chip 10, and the circuit chips 20 and 30 subjected to the design change with the connecting substrate 40 subjected to the design change interposed between the pixel chip 10, and the circuit chips 20 and 30 without changing the element/wiring layout of the pixel chip 10.

As described above, the solid-state imaging devices 1-1 and 1-2 of the examples 1 and 2 each have the connecting substrate 40 between the pixel chip 10 and each circuit chip, so that it is not necessary to provide the connecting terminals of the pixel chip 10 and the connecting terminals of each corresponding circuit chip at positions corresponding to each other (positions bonded to each other). This means that even if the design of one of the pixel chip 10 or the circuit chip group is changed, designing the connecting substrate 40 so as to accommodate this change allows the other having an existing design to be used as it is. Here, rather than changing the design of the pixel chip 10 including an element or the design of the circuit chip group including an element, changing the design of the connecting substrate 40 having a simple configuration without an element such as a transistor is much better in terms of cost and ensuring reliability.

(5) Method for Manufacturing Solid-State Imaging Device

Hereinafter, a method for manufacturing the solid-state imaging device 1 of the first embodiment is performed in accordance with a procedure of flowcharts illustrated in FIGS. 11 and 12.

In step S1 in FIG. 11, pixel chip formation processing is performed.

(Pixel Chip Formation Processing)

Figure 13:
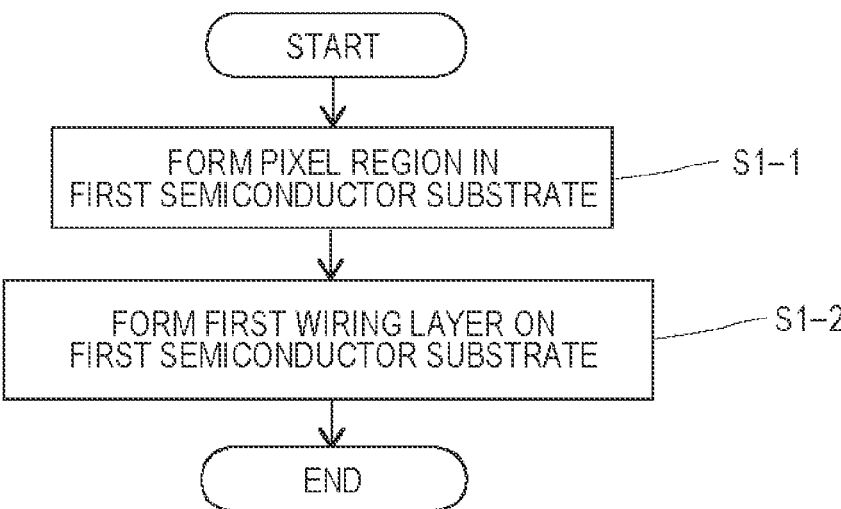
FIG. 13 is a flowchart for describing pixel chip formation processing.

The pixel chip formation processing is performed in a semiconductor manufacturing process using a semiconductor manufacturing device in accordance with a procedure (step S1-1, S1-2) of a flowchart illustrated in FIG. 13 as an example. In the pixel chip formation processing, the plurality of pixel chips 10 is formed collectively (as a single piece) in the first semiconductor substrate 100 (one wafer).

Figure 14A:
FIGS. 14A, 14B, 14C, and 14D are cross-sectional views, on a process-by-process basis, of the pixel chip formation processing.
Figure 14B:
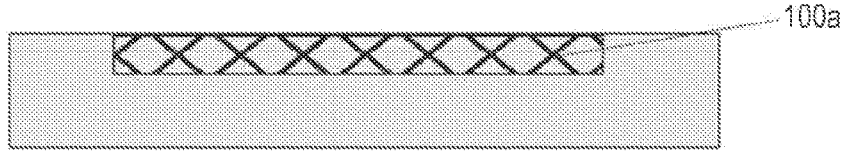

In step S1-1, in the first semiconductor substrate 100 (see FIG. 14A), a plurality of pixel regions 100a is formed (see FIG. 14B). Note that, for the sake of convenience, only one pixel region 100a formed in the first semiconductor substrate 100 is illustrated in FIGS. 14A, 14B, 14C, and 14D. Each pixel region 100a is formed as a result of forming an epitaxial layer on the first semiconductor substrate 100 and creating a plurality of photoelectric conversion elements and a control circuit by photolithography.

In step S1-2, the first wiring layer 101 is formed on the first semiconductor substrate 100.

Figure 14C:
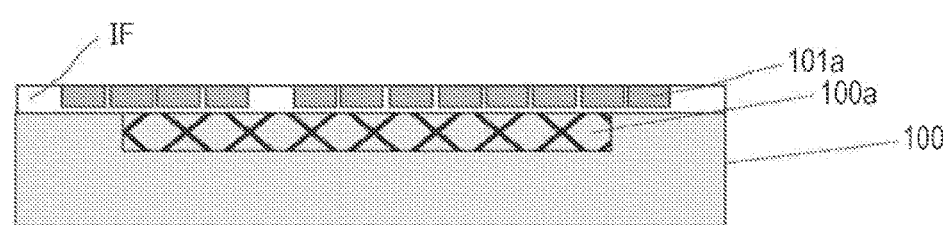
Figure 14D:
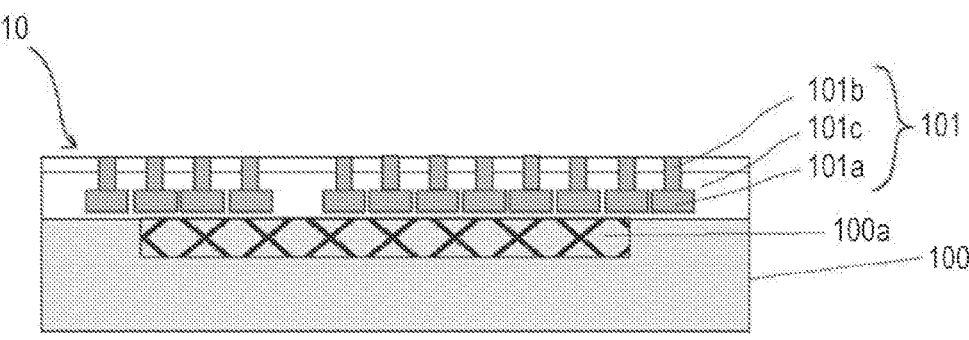

Specifically, an insulating film IF that is a material of the insulating film 101c of the first wiring layer 101 is first formed on the first semiconductor substrate 100 and etched to form an opening, and a metal material (for example, Cu) is embedded in the opening at least once (for example, a plurality of times) to form the wiring 101a (see FIG. 14C). Next, the insulating film IF that is the material of the insulating film 101c is further formed and etched to form an opening, and a metal material (for example, Cu) is embedded in the opening to form the connecting terminal 101b having a metal bonding surface (for example, a Cu bonding surface) at a position roughly flush with the surface of the insulating film 101c (see FIG. 14D).

In step S2 in FIG. 11, circuit chip formation processing is performed.

(Circuit Chip Formation Processing)

Figure 15:
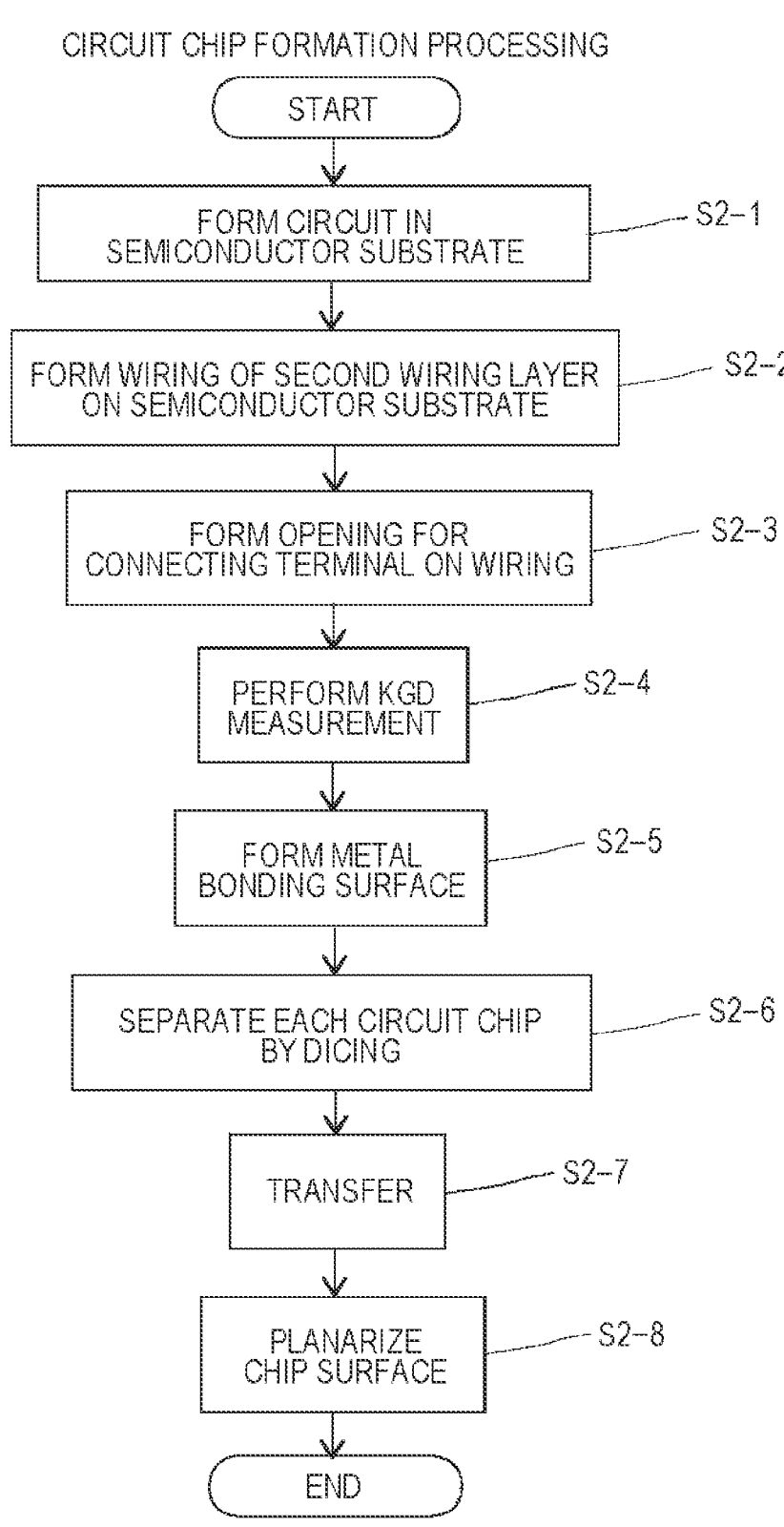
FIG. 15 is a flowchart for describing circuit chip formation processing.

The circuit chip formation processing is performed in the semiconductor manufacturing process using the semiconductor manufacturing device in accordance with a procedure of a flowchart illustrated in FIG. 15 (steps S2-1 to S2-8) as an example.

Figures 16A, 16B, 16C, 16D, 16E:
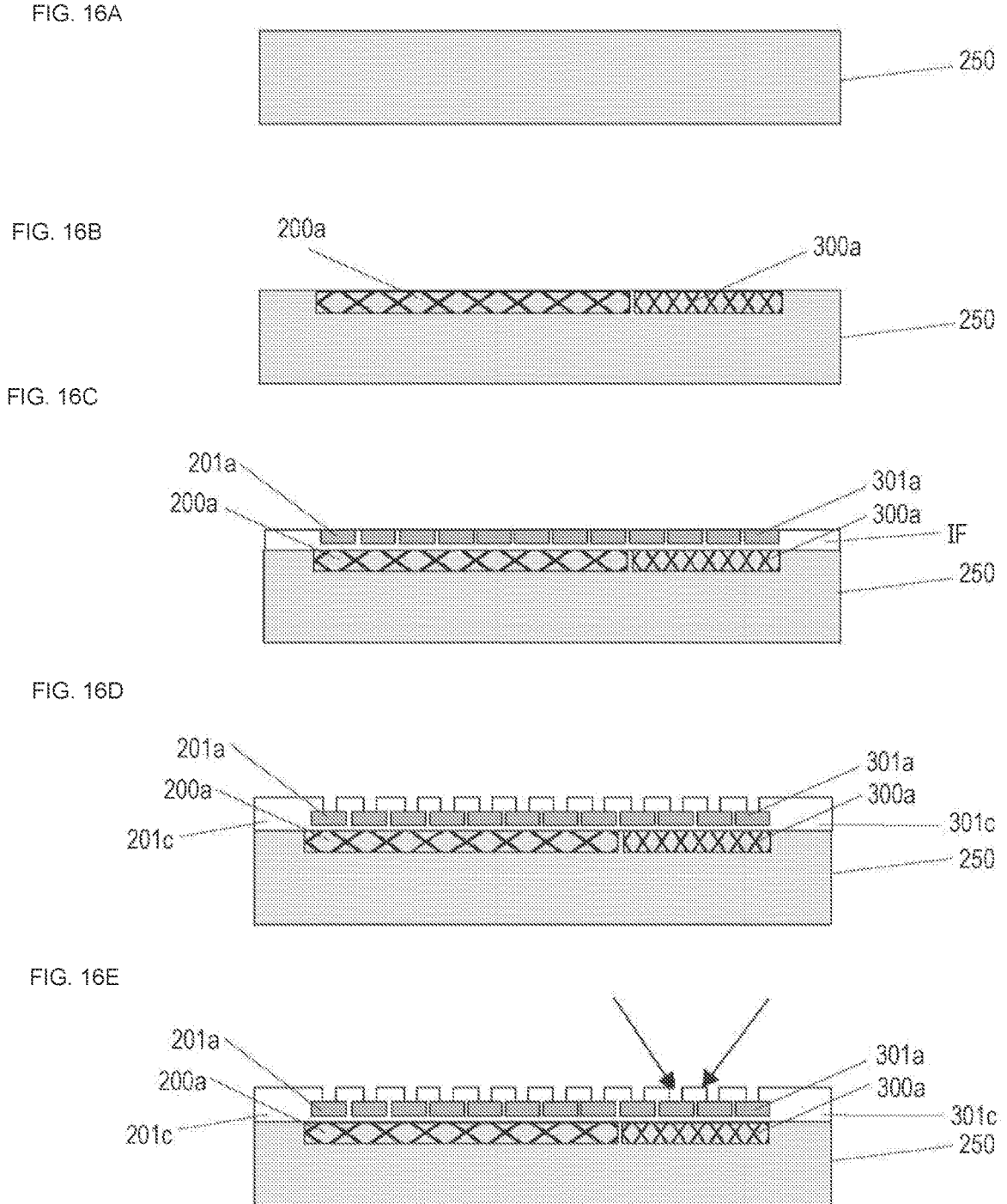
FIGS. 16A, 16B, 16C, 16D, and 16E are cross-sectional views, on a process-by-process basis, of the circuit chip formation processing.

In step S2-1, two circuits being the memory circuit 200a and the logic circuit 300a are formed in a semiconductor substrate 250 (see FIG. 16A) being the second semiconductor substrates 200 and 300 (see FIG. 16B).

In step S2-2, the wiring 201a of the second wiring layer 201 and the wiring 301a of the second wiring layer 301 are formed on the semiconductor substrate 250 (see FIG. 16C).

Specifically, a material of the insulating films 201c and 301c of the second wiring layers 201 and 301 is first formed into a film on a surface of the semiconductor substrate 250 and etched to form an opening, and a metal material (for example, Cu) is embedded in the opening at least once (for example, a plurality of times) to form the wiring 201a and 301a.

In step S2-3, an opening for connecting terminal is formed on the wiring 201a and 301a (see FIG. 16D).

Specifically, first, the material of the insulating films 201c and 301c is further formed into the insulating films 201c and 301c. Next, the insulating films 201c and 301c are etched to form the opening for connecting terminal.

In step S2-4, KGD measurement is performed (see FIG. 16E). That is, it is guaranteed that products are good products by subjecting the products formed in step S2-3 to electrical measurement or a burn-in test for detecting an initial failure to remove a defective product.

Figure 17A:
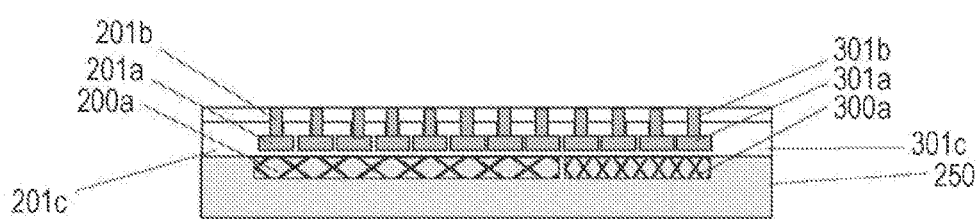
FIGS. 17A, 17B, 17C, and 17D are cross-sectional views, on a process-by-process basis, of the circuit chip formation processing.

In step S2-5, a metal bonding surface is formed. Specifically, a metal material (for example, Cu) is embedded in the opening for connecting terminal formed in the insulating films 201c and 301c to form the connecting terminal 301b having a metal bonding surface (for example, a Cu bonding surface) at a position roughly flush with the surfaces of the insulating films 201c and 301c (see FIG. 17A).

Figure 17B:
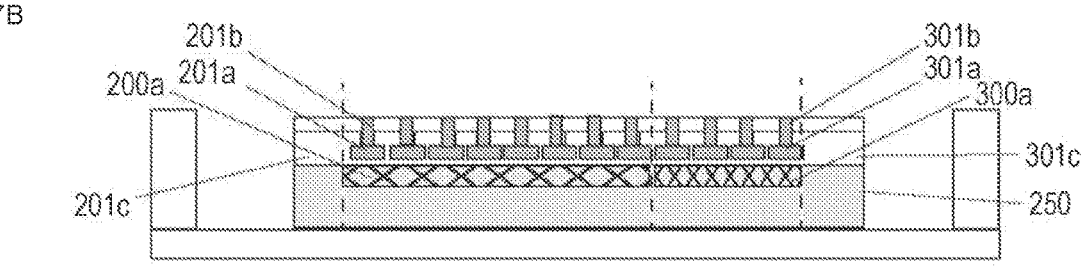

In step S2-6, each circuit chip is separated by dicing (see FIG. 17B). Specifically, the circuit chip 20 and the circuit chip 30 are cut out by dicing.

Figure 17C:
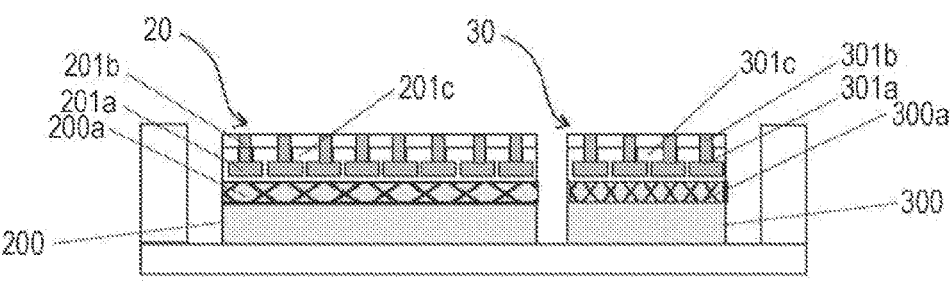

In step S2-7, transfer is performed (see FIG. 17C). Specifically, the circuit chips 20 and 30 are transferred into a CMP polishing device.

Figure 17D:
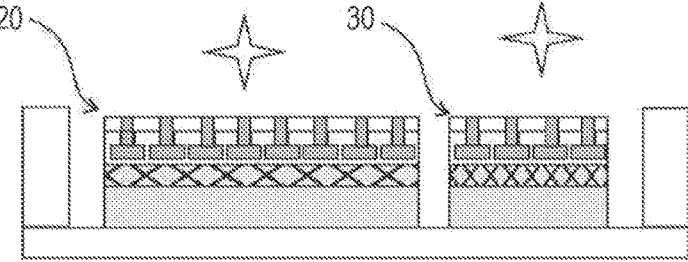

In step S2-8, the chip surface is planarized (see FIG. 17D). Specifically, the surfaces of the circuit chips 20 and 30 are polished and planarized by the CMP polishing device.

In step S3 in FIG. 11, connecting substrate base member formation processing 1 is performed.

(Connecting Substrate Base Member Formation Processing 1)

Figure 18:
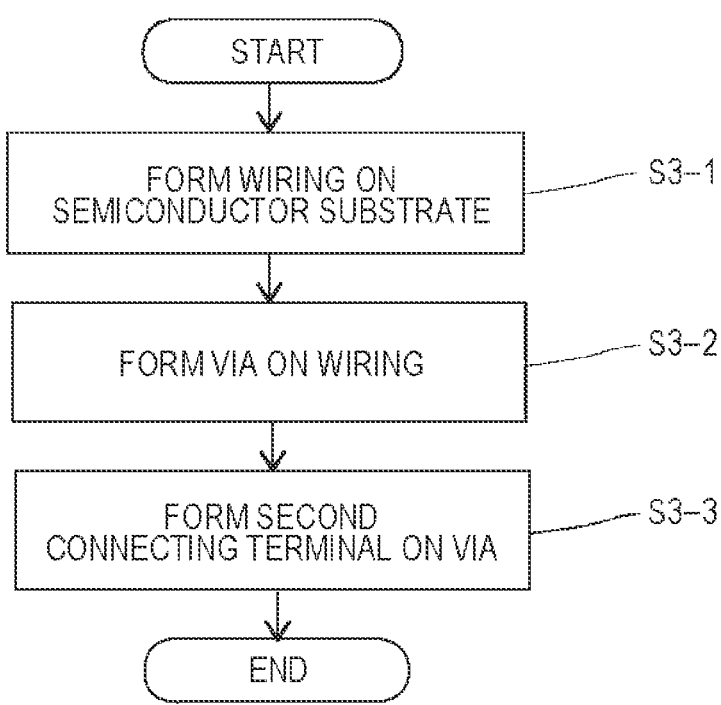
FIG. 18 is a flowchart for describing connecting substrate base member formation processing 1.

The connecting substrate base member formation processing 1 is performed in the semiconductor manufacturing process using the semiconductor manufacturing device in accordance with a procedure of a flowchart in FIG. 18 (steps S3-1 to S3-3) as an example. The connecting substrate base member formation processing 1 is processing of forming a connecting substrate base member 40B being the connecting substrate 40.

Figure 19A:
FIGS. 19A, 19B, 19C, and 19D are cross-sectional views, on a process-by-process basis, of the connecting substrate base member formation processing 1.
Figure 19B:
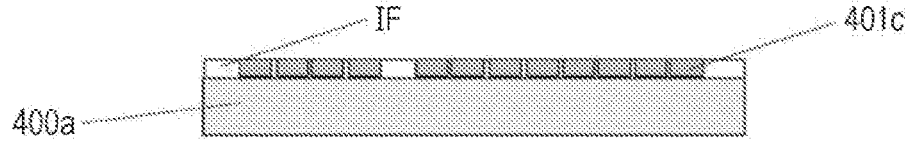

In step S3-1, on the semiconductor substrate 400a (see FIG. 19A), the wiring 401c of the wiring 401 is formed (see FIG. 19B). Specifically, the insulating film IF that is a material of the first insulating layer 400b is formed on the semiconductor substrate 400a and etched to form an opening, and a metal material (for example, Cu) is embedded in the opening to form the wiring 401c.

Figure 19C:
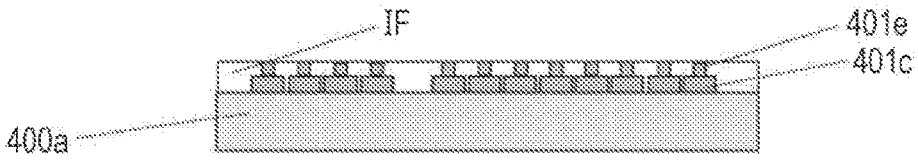

In step S3-2, the via 401e is formed on the wiring 401c (see FIG. 19C). Specifically, the material of the first insulating layer 400b is further formed into a film and etched to form an opening at a position corresponding to the wiring 401c, and a metal material (for example, Cu) is embedded in the opening to form the via 401e.

Figure 19D:
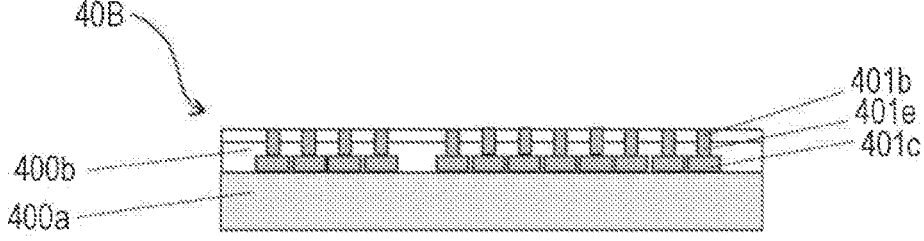

In step S3-3, the second connecting terminal 401b is formed on the via 401e (see FIG. 19D). Specifically, the material of the first insulating layer 400b is further formed into a film and etched to form an opening at a position corresponding to the via 401e, and a metal material (for example, Cu) is embedded in the opening to form the second connecting terminal 401b having a metal bonding surface (for example, a Cu bonding surface) at a position roughly flush with the surface of the first insulating layer 400b.

As described above, the connecting substrate base member 40B is formed.

In step S4 in FIG. 11, the circuit chips 20 and 30, and the connecting substrate base member 40B are subjected to plasma activation (see FIG. 20). Specifically, plasma processing is performed on the circuit chips 20 and 30, and the connecting substrate base member 40B by, for example, a plasma processing device of a standalone type to activate the metal bonding surfaces of the circuit chips 20 and 30 and the metal bonding surface of the connecting substrate base member 40B.

Figure 21:
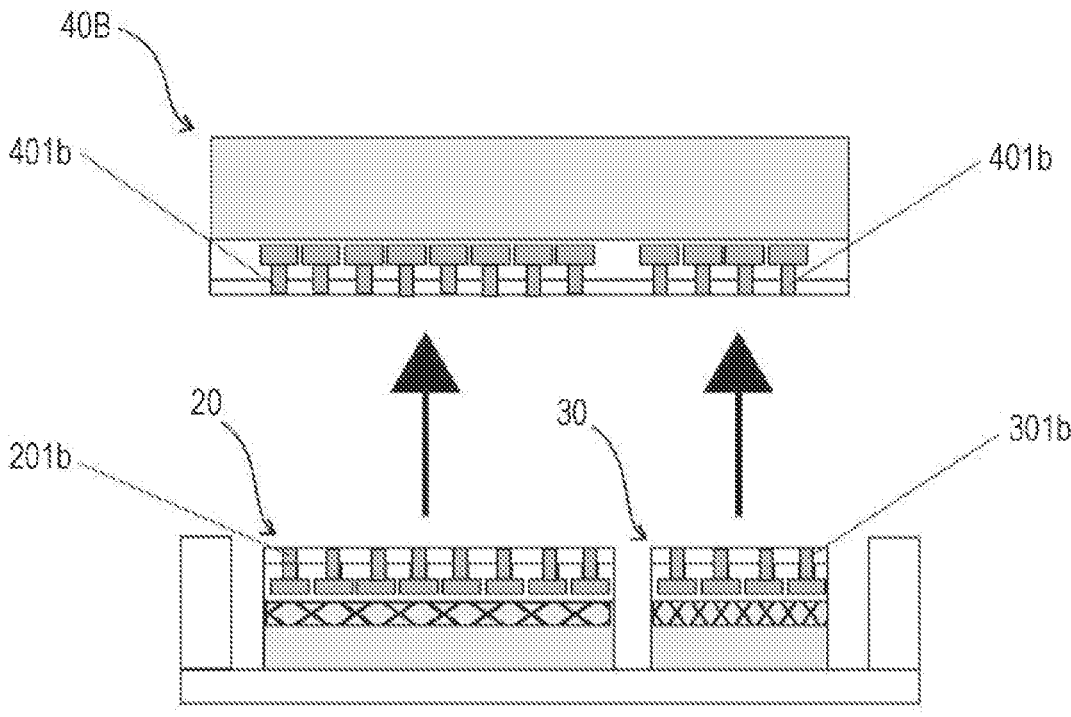
FIG. 21 is a cross-sectional view illustrating a process of attaching the two circuit chips to the connecting substrate base member.
Figure 22:
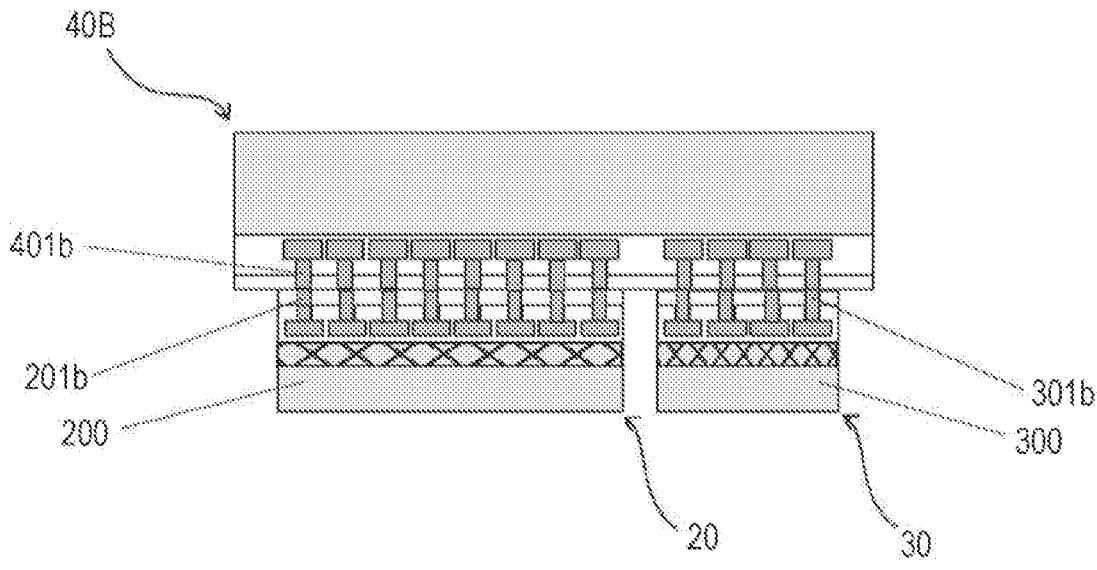
FIG. 22 is a cross-sectional view illustrating a state where the two circuit chips are attached to the connecting substrate base member.

In step S5 in FIG. 11, the circuit chips 20 and 30 are attached to the connecting substrate base member 40B (see FIG. 21). At this time, with respect to the inverted connecting substrate base member 40B, the connecting terminal 201b of the circuit chip 20 and a corresponding second connecting terminal 401b of the connecting substrate base member 40B are bonded by metal-metal bonding (for example, Cu—Cu bonding), and the connecting terminal 301b of the circuit chip 30 and a corresponding second connecting terminal 401b of the connecting substrate base member 40B are bonded by metal-metal bonding (for example, Cu—Cu bonding) (see FIG. 22).

Figure 23:
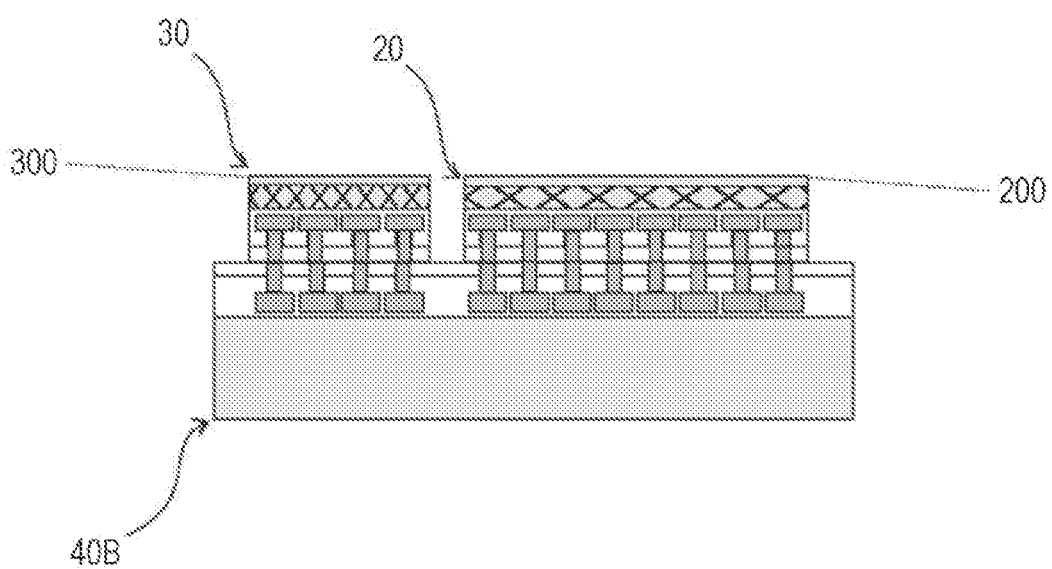
FIG. 23 is a cross-sectional view illustrating a state where semiconductor substrates of the two circuit chips are made thinner.

In step S6 in FIG. 11, the semiconductor substrates of the circuit chips 20 and 30 are made thinner (see FIG. 23). Specifically, the back surfaces of the second semiconductor substrates 200 and 300 of the inverted circuit chips 20 and 30 are polished to be thinner.

Figure 24:
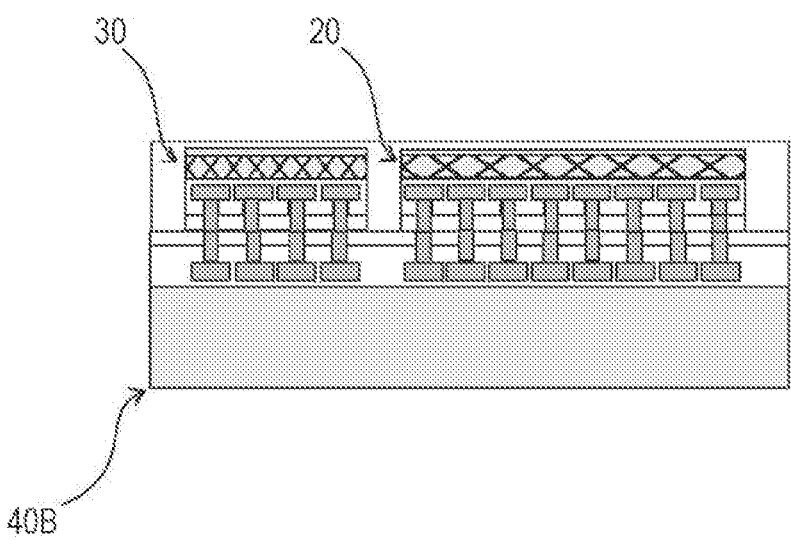
FIG. 24 is a cross-sectional view illustrating a state where the two circuit chips attached to the connecting substrate base member are planarized.

In step S7 in FIG. 11, step filling planarization is performed (see FIG. 24). Specifically, a step (see FIG. 23) formed by the circuit chips 20 and 30 and the connecting substrate base member 40B is filled with an insulating material for planarization.

Figure 25:
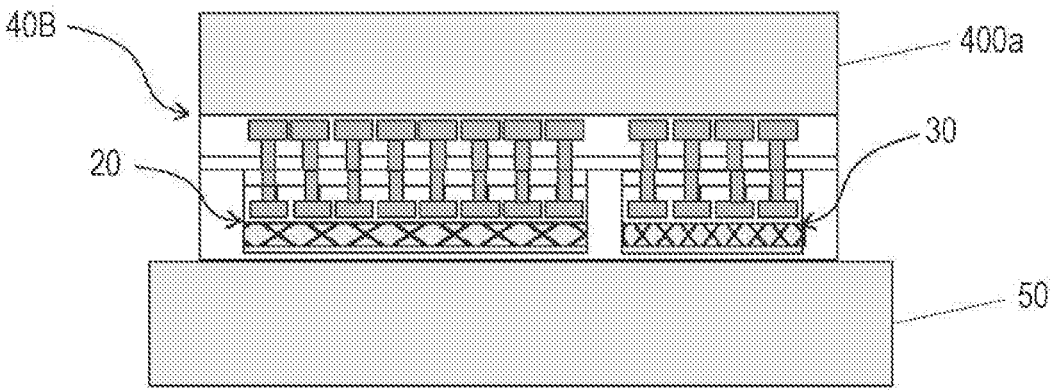
FIG. 25 is a cross-sectional view illustrating a state where the two circuit chips thus planarized are bonded to a support substrate.

In step S8 in FIG. 11, the planarized circuit chips 20 and are bonded to the support substrate 50 (see FIG. 25). Specifically, the planarized circuit chips 20 and 30 are inverted and bonded to the support substrate 50.

Figure 12:
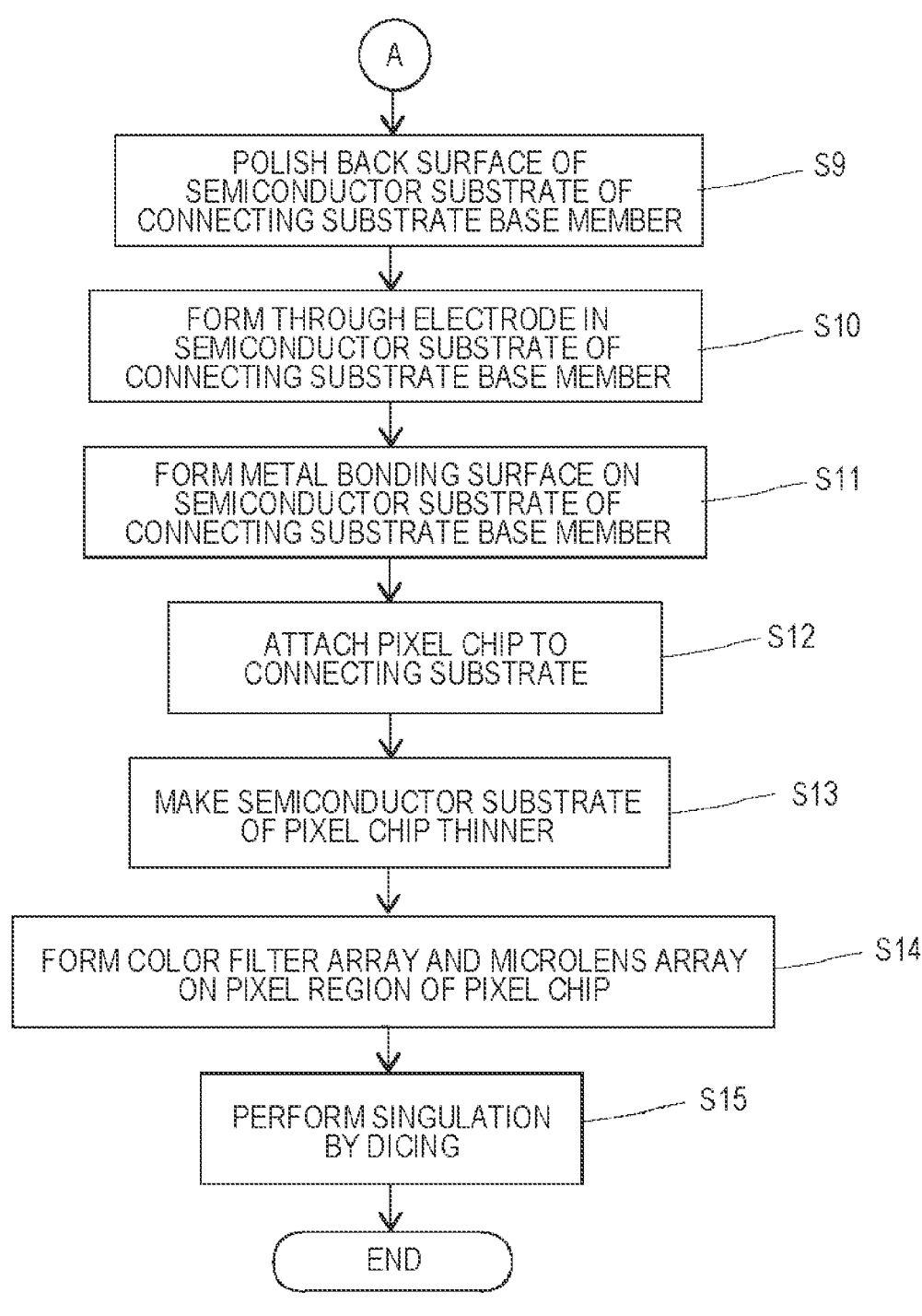
FIG. 12 is a second half of the flowchart for describing the method for manufacturing the solid-state imaging device according to the first embodiment of the present technology.
Figure 26:
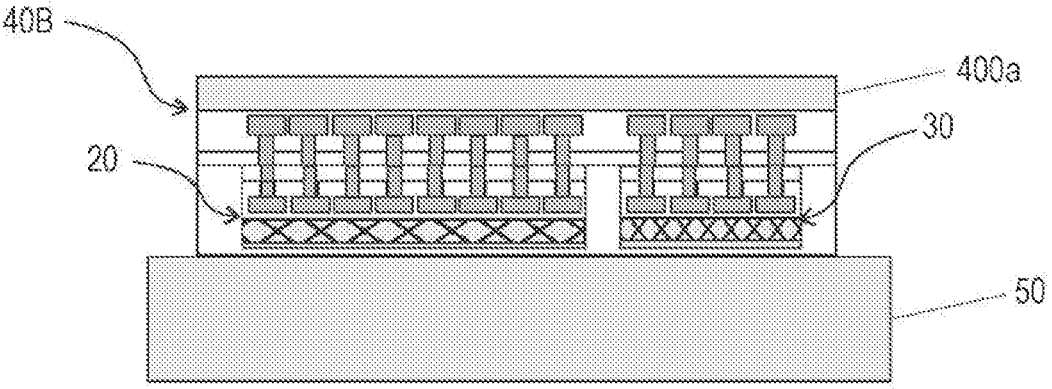
FIG. 26 is a cross-sectional view illustrating a state where a back surface of a semiconductor substrate of the connecting substrate base member is polished.

In step S9 in FIG. 12, the back surface of the semiconductor substrate 400a of the connecting substrate base member 40B is polished (see FIG. 26).

Figure 27:
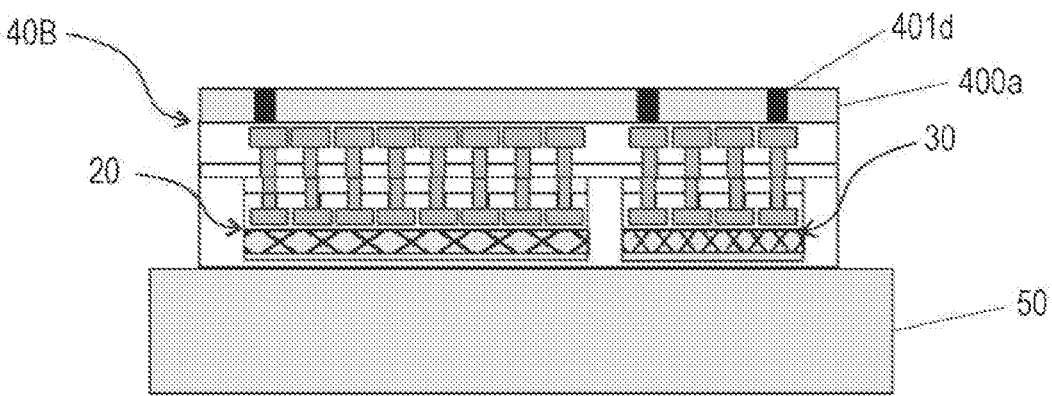
FIG. 27 is a cross-sectional view illustrating a state where a through electrode is formed in the semiconductor substrate of the connecting substrate base member.

In step S10 in FIG. 12, the through electrode 401d is formed in the semiconductor substrate 400a of the connecting substrate base member 40B (see FIG. 27). Specifically, a through hole is formed in the semiconductor substrate 400a by etching, and a metal material (for example, Cu, W, Al, or the like) is embedded in the through hole to form the through electrode 401d.

Figure 28:
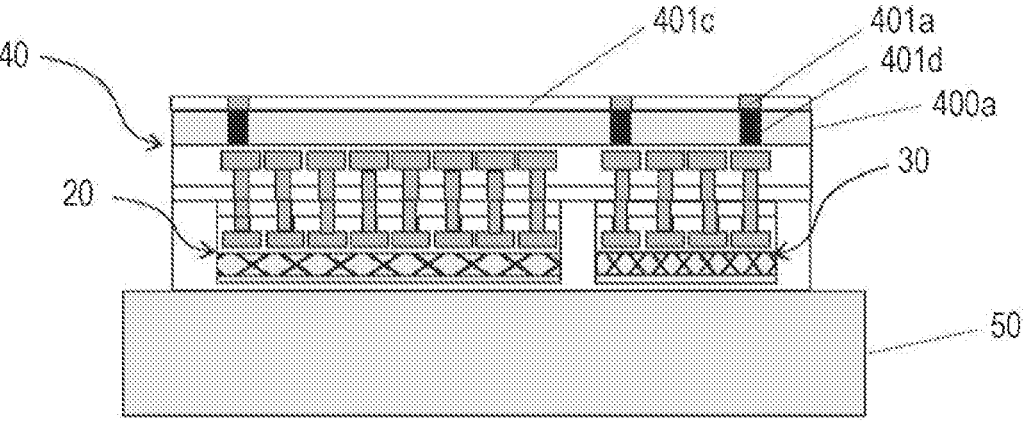
FIG. 28 is a cross-sectional view illustrating a state where a metal bonding surface is formed on the semiconductor substrate of the connecting substrate base member.

In step S11 in FIG. 12, a metal bonding surface (for example, a Cu bonding surface) is formed on the semiconductor substrate 400a of the connecting substrate base member 40B (see FIG. 28). Specifically, the second insulating layer 400c is formed on the semiconductor substrate 400a and etched to form an opening, and a metal material (for example, Cu) is embedded in the opening to form the first connecting terminal 401a having a metal bonding surface (for example, Cu bonding surface) at a position roughly flush with the surface of the second insulating layer 400c.

Figure 29:
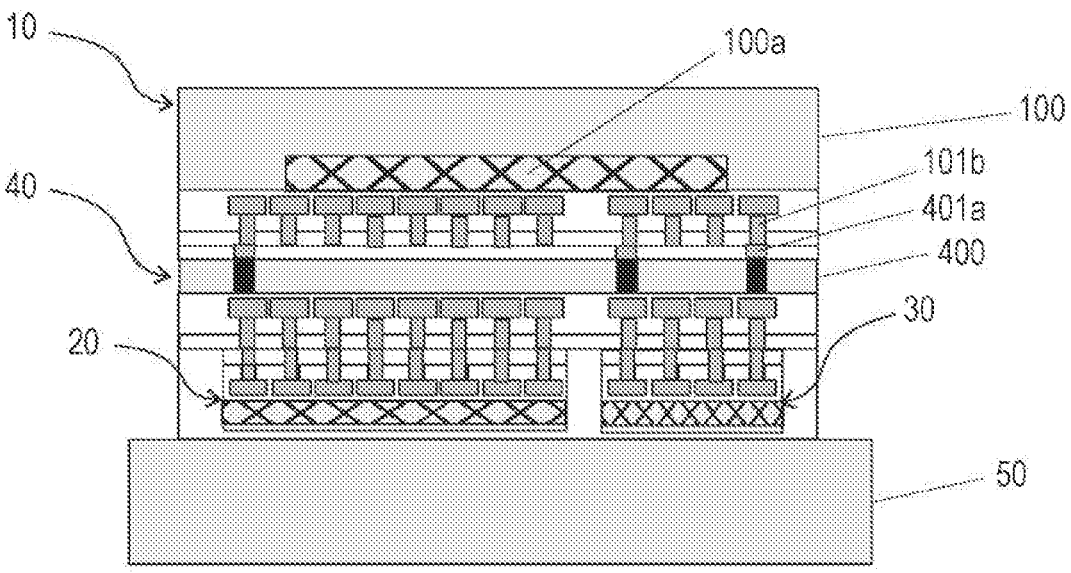
FIG. 29 is a cross-sectional view illustrating a state where the pixel chip is attached to the connecting substrate.

In step S12 in FIG. 12, the pixel chip 10 is attached to the connecting substrate 40 (see FIG. 29). Specifically, the connecting terminal 101b of the inverted pixel chip 10 and the corresponding first connecting terminal 401a of the connecting substrate base member 40B are bonded by metal-metal bonding (for example, Cu—Cu bonding).

Figure 30:
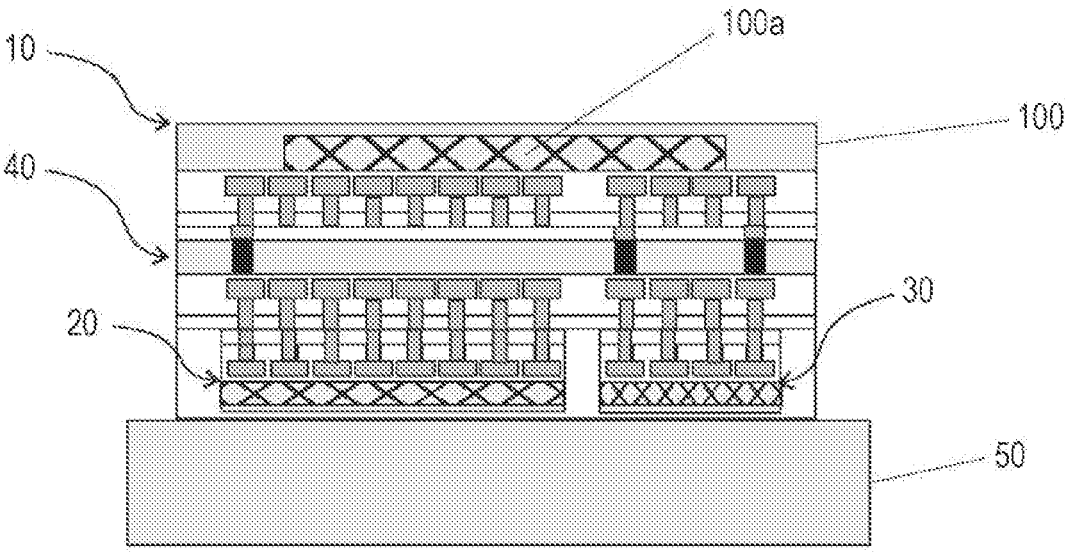
FIG. 30 is a cross-sectional view illustrating a state where a back surface of a semiconductor substrate of the pixel chip is polished.

In step S13 in FIG. 12, the first semiconductor substrate 100 of the pixel chip 10 is made thinner. (See FIG. 30). Specifically, the back surface of the first semiconductor substrate 100 of the pixel chip 10 is polished to be thinner.

Figure 31:
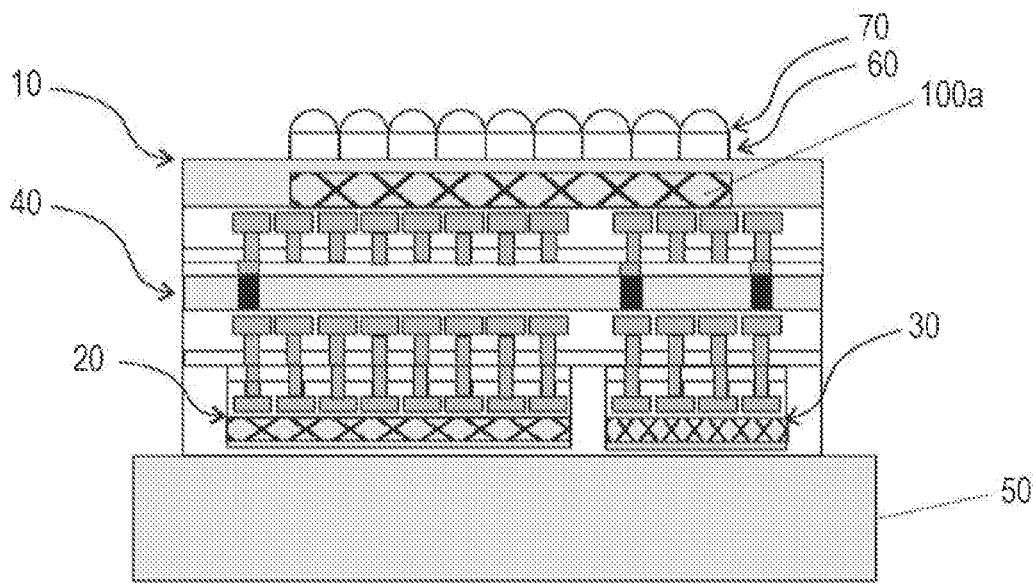
FIG. 31 is a diagram illustrating a state where a color filter array and a microlens array are formed on a pixel region of the pixel chip.
Figure 32:
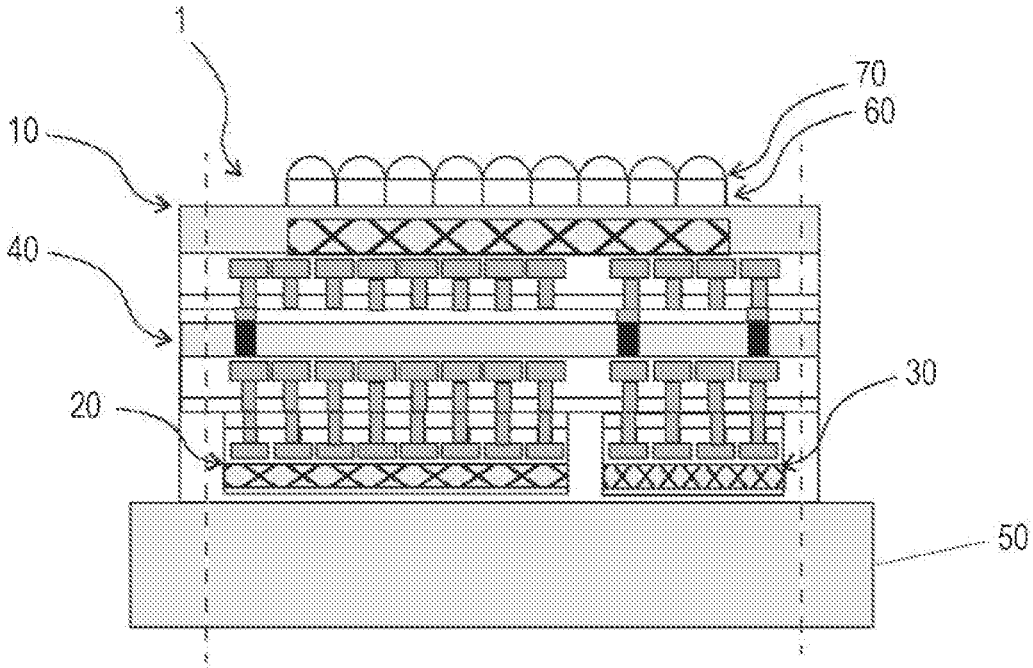
FIG. 32 is a diagram illustrating a process of subjecting the solid-state imaging device to singulation.

In step S14 in FIG. 12, the color filter array 60 and the microlens array 70 are formed on the pixel region 100a of the pixel chip 10 (see FIG. 31). Specifically, the color filter array 60 is formed so as to place each color filter 60a of the color filter array 60 on a corresponding pixel. The microlens array 70 is formed so as to place each microlens 70a of the microlens array 70 on a corresponding pixel and a corresponding color filter 60a.

In step S15 in FIG. 12, singulation is performed by dicing. Specifically, a plurality of the solid-state imaging devices 1 formed as a single piece is divided by dicing into separate chip-shaped solid-state imaging devices 1.

(6) Effects of Solid-State Imaging Device and Manufacturing Method Thereof

The solid-state imaging device 1 according to the first embodiment of the present technology described above includes the pixel chip 10 including a pixel having a photoelectric conversion element, the at least one circuit chip 20 and 30 including a circuit that processes a signal generated in the pixel of the pixel chip 10, and the connecting substrate 40 that electrically connects the pixel chip 10 and the circuit chip group including the circuit chips 20 and 30, and the pixel chip 10, the connecting substrate 40, and the circuit chips 20 and 30 are stacked in this order.

In this case, in the solid-state imaging device 1, even in a case where the design of one of the pixel chip 10 or the circuit chip group is changed, if the design of the connecting substrate 40 is changed in response to the change or if the connecting substrate 40 is designed to accommodate the change, the other can be used as it is (the design of the other need not be changed).

As a result, according to the solid-state imaging device 1, it is possible to provide the solid-state imaging device 1 that readily accommodate a design change of the pixel chip 10 or the circuit chip group.

Figure 33A:
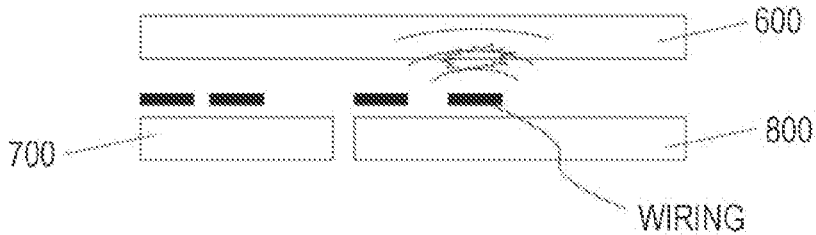
FIGS. 33A and 33B are diagrams for describing a shielding effect produced by the connecting substrate.

Meanwhile, in the related art, as illustrated in FIG. 33A, since the pixel chip 600 and the circuit chips 700 and 800 are directly stacked with the wiring interposed between the pixel chip 600, and the circuit chips 700 and 800, it is necessary to take measures against noise caused by coupling, which makes the degree of freedom in the design of the wiring low.

Figure 33B:
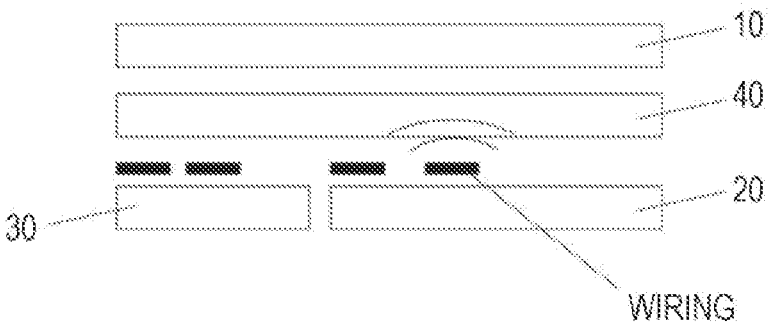

On the other hand, in the solid-state imaging device 1, as illustrated in FIG. 33B, sine the pixel chip 10, and the circuit chips 20 and 30 are stacked with the connecting substrate 40 interposed between the pixel chip 10, and the circuit chips 20 and 30, the influence of coupling is reduced by the electromagnetic wave shielding effect produced by the connecting substrate 40, which increases the degree of freedom in the design of the wiring of the circuit chips 20 and 30.

The connecting substrate 40 includes the substrate body 400 and the wiring 401 provided in the substrate body 400 to connect the pixel chip 10 and the circuit chips 20 and 30. As a result, the connecting substrate 40 has only a capability of electrically connecting the pixel chip 10 and the circuit chips 20 and 30, which makes the design of the connecting substrate 40 extremely simple.

The substrate body 400 is not provided with a transistor. This eliminates the need for forming a transistor, and moreover, the configuration without a transistor increases the degree of freedom in the design of the wiring. As a result, the design of the connecting substrate 40 becomes extremely simple. Furthermore, the connecting substrate 40 only needs to be subjected to a continuity test.

Figure 34A:
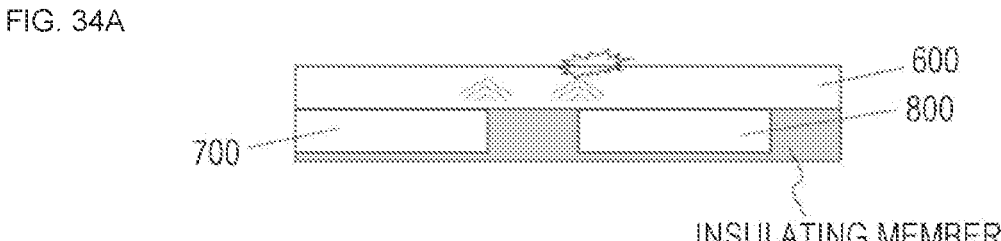
FIGS. 34A and 34B are diagrams for describing a reinforcing effect produced by the connecting substrate.

Meanwhile, in the related art, as illustrated in FIG. 34A, since the pixel chip 600 and the circuit chips 700 and 800 are directly stacked, if each of the circuit chips 700 and 800 is smaller than the pixel chip 600, shearing stress acting on the pixel chip 600 from each corner of the circuit chips 700 and 800 may affect image quality or cause the pixel chip 600 to crack.

Figure 34B:
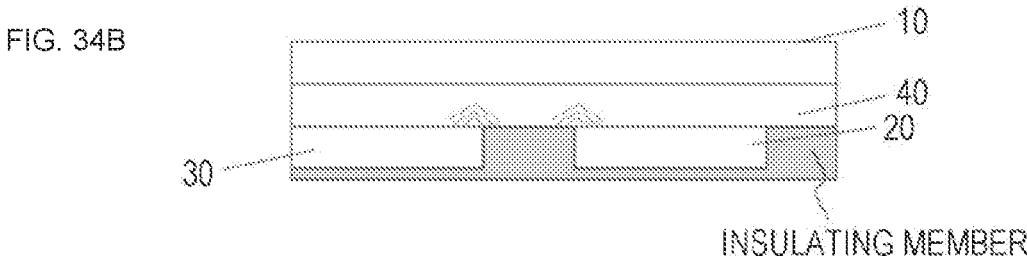

On the other hand, in the solid-state imaging device 1, as illustrated in FIG. 34B, even if each of the circuit chips 20 and 30 is smaller than the pixel chip 10, the connecting substrate 40 stacked between the pixel chip 10 and each of the circuit chips 20 and 30 serves as a cushioning member, so that it is possible to prevent the image quality from being affected or the pixel chip 10 from cracking.

The circuit chips 20 and 30 are smaller than the connecting substrate 40. It is therefore possible to place the connecting substrate 40 between the pixel chip 10, and the circuit chips 20 and 30 without a gap, so that it is possible to ensure the effectiveness of the above-described electromagnetic wave shielding effect.

The at least one circuit chip is a plurality of circuit chips arranged side by side. It is therefore possible to arrange circuit chips having different functions in the same layer.

The substrate body 400 includes the semiconductor substrate 400a, the first insulating layer 400b disposed on a side of the semiconductor substrate 400a adjacent to the circuit chips 20 and 30, and the second insulating layer 400c disposed on a side of the semiconductor substrate 400a adjacent to the pixel chip and the wiring 401 is provided in the semiconductor substrate 400a, the first insulating layer 400b, and the second insulating layer 400c. It is therefore possible to make the connecting substrate 40 simple in configuration.

The pixel chip 10 includes the first semiconductor substrate 100 in which pixels are formed and the first wiring layer 101 disposed on a side of the first semiconductor substrate 100 adjacent to the connecting substrate 40. The circuit chips 20 and 30 include the second semiconductor substrates 200 and 300 in which circuits are formed and the second wiring layers 201 and 301 disposed on sides of the second semiconductor substrates 200 and 300 adjacent to the connecting substrate 40. The wiring 401 has the first connecting terminal 401a on a surface of the substrate body 400 adjacent to the first wiring layer 101 at a position corresponding to the connecting terminal 101b of the wiring provided in the first wiring layer 101, and has the second connecting terminal 401b on a surface of the substrate body 400 adjacent to the second wiring layers 201 and 301 at a position corresponding to each of the connecting terminals 201b and 301b of the wiring provided in the second wiring layers 201 and 301. It is therefore possible to bond the connecting terminal 101b and the first connecting terminal 401a, and bond each of the connecting terminals 201b and 301b and a corresponding second connecting terminal 401b.

The connecting terminal 101b of the wiring formed in the first wiring layer 101 is provided on a surface of the first wiring layer 101 adjacent to the connecting substrate 40, and the connecting terminal 101b and the first connecting terminal 401a are bonded. It is therefore possible to bond the connecting terminal 101b and the first connecting terminal 401a by metal-metal bonding, for example.

The connecting terminals 201b and 301b of the wiring formed in the second wiring layers 201 and 301 are provided on surfaces of the second wiring layers 201 and 301 adjacent to the connecting substrate 40, and the connecting terminals 201b and 301b, and the second connecting terminal 401b are bonded. It is therefore possible to bond the connecting terminals 201b and 301b, and a corresponding second connecting terminal 401b by metal-metal bonding, for example.

The method for manufacturing the solid-state imaging device 1 according to the first embodiment of the present technology includes preparing (for example, forming) the pixel chip 10 including a pixel having a photoelectric conversion element, preparing (for example, forming) a circuit chip group including at least one circuit chip 20 and 30 including a circuit that processes a signal generated in the pixel of the pixel chip 10, forming the connecting substrate base member 40B that is a base member of the connecting substrate 40 that electrically connects the pixel chip 10 and the circuit chips 20 and 30, and stacking the pixel chip 10, the connecting substrate base member 40B, and the circuit chip group in this order.

According to the method for manufacturing the solid-state imaging device 1, it is possible to manufacture the solid-state imaging device 1 that readily accommodates a design change of the pixel chip 10 or the circuit chip group.

For example, in the preparing the pixel chip 10, the pixel chip 10 obtained as a result of changing an existing design of the pixel chip 10 may be formed, and in the preparing the circuit chips 20 and 30, the circuit chips 20 and 30 each having an existing design may be formed, and in the forming the connecting substrate base member 40B, the connecting substrate base member 40B of the connecting substrate 40 that electrically connects the pixel chip subjected to the design change and the circuit chips 20 and 30 each having an existing design may be formed.

In this case, it is possible to manufacture the solid-state imaging device 1 using the pixel chip 10 subjected to the design change and the circuit chips 20 and 30 each having an existing design.

For example, in the preparing the pixel chip 10, the pixel chip 10 having an existing design may be formed, and in the preparing the circuit chips 20 and 30, the circuit chips 20 and obtained as a result of changing an existing design of the circuit chips 20 and 30 may be formed, and in the forming the connecting substrate base member 40B, the connecting substrate base member 40B of the connecting substrate 40 that electrically connects the pixel chip 10 having an existing design and the circuit chips 20 and 30 subjected to the design change may be formed.

In this case, it is possible to manufacture the solid-state imaging device 1 using the pixel chip 10 having an existing design and the circuit chips 20 and 30 subjected to the design change.

The stacking includes attaching the circuit chips 20 and 30 to one surface of the connecting substrate base member 40B and attaching the pixel chip 10 to the other surface of the connecting substrate base member 40B. It is therefore possible to manufacture the solid-state imaging device 1 with high efficiency.

<Solid-State Imaging Device According to Second Embodiment of Present Technology>

(1) Configuration of Solid-State Imaging Device

Hereinafter, a configuration of a solid-state imaging device 2 according to a second embodiment of the present technology will be described with reference to FIGS. 35 and 36.

Figure 35:
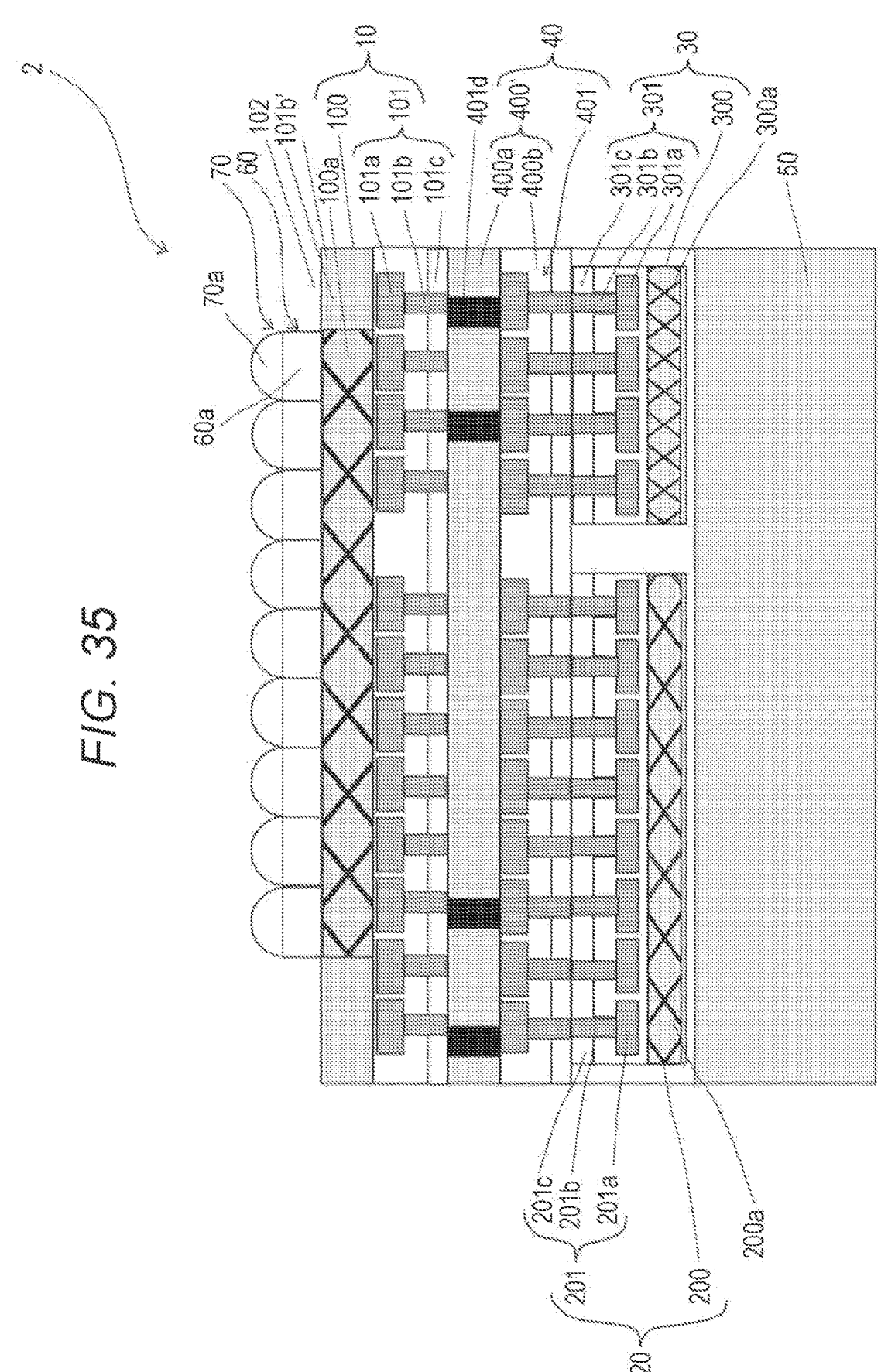
FIG. 35 is a schematic cross-sectional view of a solid-state imaging device according to a second embodiment of the present technology.

As illustrated in FIG. 35, the solid-state imaging device 2 according to the second embodiment is similar in configuration to the solid-state imaging device 1 according to the first embodiment except that the configuration for connecting the pixel chip and the connecting substrate is different.

Figure 36:
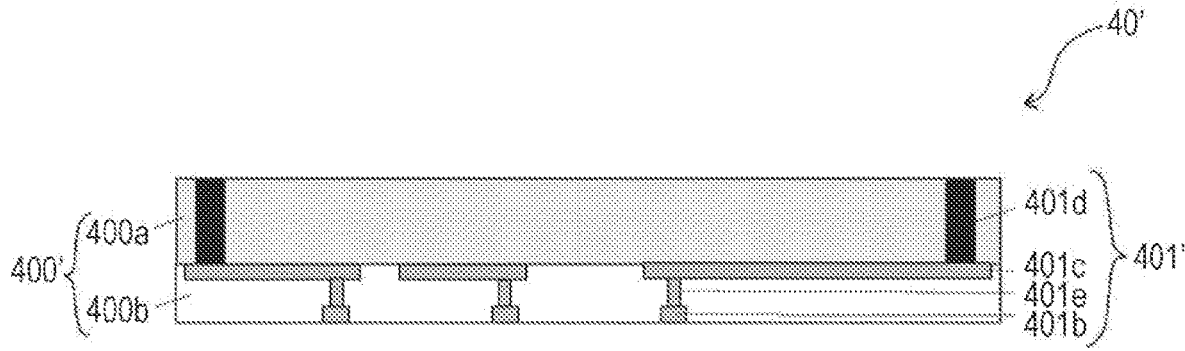
FIG. 36 is a schematic cross-sectional view of a configuration of a connecting substrate of the solid-state imaging device according to the second embodiment of the present technology.

More specifically, as illustrated in FIGS. 35 and 36, a substrate body 400' of a connecting substrate 40' of the solid-state imaging device 2 is different from the substrate body 400 (see FIG. 6) of the connecting substrate 40 of the solid-state imaging device 1 in that neither the second insulating layer 400c nor the first connecting terminal 401a is provided.

A substrate of the substrate body 400' of the connecting substrate 40' is the semiconductor substrate 400a, but may be, for example, a glass substrate such as alkali-free glass. A thickness of the substrate of the substrate body 400' is preferably several μm to several thousands μm, and more preferably several tens μm to several hundreds μm, for example.

As illustrated in FIG. 36, wiring 401' of the connecting substrate 40' is different from the wiring 401 (see FIG. 6) of the connecting substrate 40 in that an end of the through electrode 401d adjacent to the pixel chip 10 serves as the first connecting terminal.

That is, in the solid-state imaging device 2, the connecting terminal 101b of the wiring provided in the first wiring layer 101 of the pixel chip 10 and the through electrode 401d of the wiring 401' of the connecting substrate 40' are bonded.

(2) Solid-State Imaging Device of Example

Figures 37A, 37B:
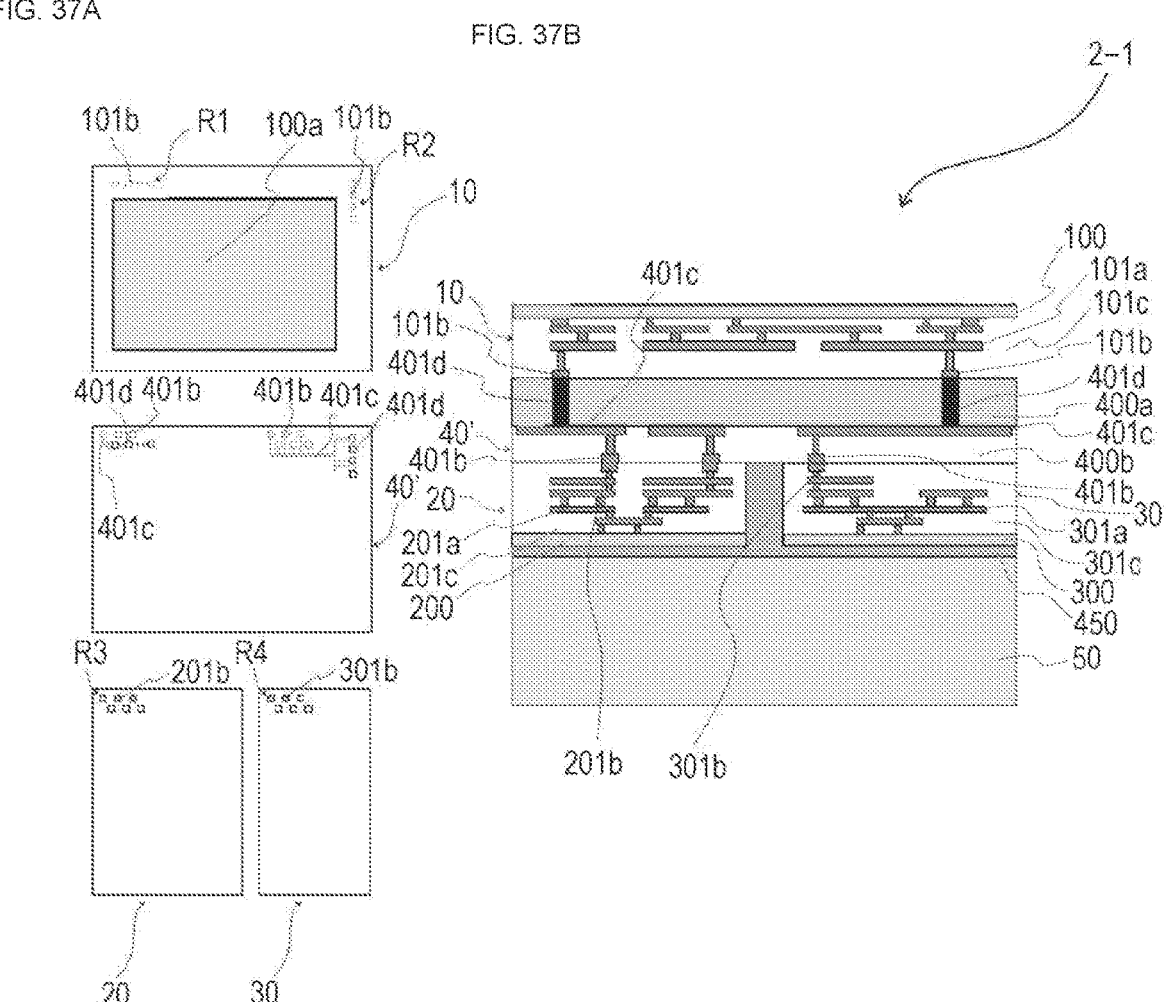
FIG. 37A is a schematic plan view a pixel chip, a connecting substrate, and two circuit chips of a solid-state imaging device according to an example 1 of the second embodiment of the present technology.
FIG. 37B is a schematic cross-sectional view of the solid-state imaging device according to the example 1 of the second embodiment of the present technology.

FIG. 37A illustrates a plan view of a pixel chip 10, a connecting substrate 40', and two circuit chips 20 and 30 of a solid-state imaging device 1-2 of an example 1 of the second embodiment. FIG. 37B illustrates a cross-sectional view of the solid-state imaging device 2-1 of the example 1 of the second embodiment. Note that FIGS. 37A and 37B illustrate neither the color filter array 60 nor the microlens array 70.

As an example, as illustrated in the upper diagram of FIG. 37A, in the solid-state imaging device 2-1 of the example 1 of the second embodiment of the present technology, a plurality of connecting terminals 101b is laid out in a horizontally long manner as a whole in a first region R1 of the pixel chip 10, and a plurality of connecting terminals 101b is laid out in a vertically long manner as a whole in a second region R2 of the pixel chip 10.

As an example, as illustrated in the lower diagram of FIG. 37A, in the solid-state imaging device 2-1, a plurality of connecting terminals 201b is laid out in a horizontally long manner as a whole in a third region R3 of the circuit chip 20, and a plurality of connecting terminals 301b is laid out in a horizontally long manner as a whole in a fourth region R4 of the circuit chip 30.

As an example, as illustrated in the middle diagram of FIG. 37A, in the solid-state imaging device 2-1, a plurality of through electrodes 401d is laid out in a horizontally long manner as a whole in a region of the connecting substrate 40' corresponding to the first region R1 of the pixel chip 10 so as to correspond (be bonded), on a one-to-one basis, to the plurality of connecting terminals 101b in the first region R1.

As an example, as illustrated in the middle diagram of FIG. 37A, in the solid-state imaging device 2-1, a plurality of through electrodes 401d is laid out in a vertically long manner as a whole in a region of the connecting substrate 40' corresponding to the second region R2 of the pixel chip 10 so as to correspond (be bonded), on a one-to-one basis, to the plurality of connecting terminals 101b in the second region R2.

As an example, as illustrated in the middle diagram of FIG. 37A, in the solid-state imaging device 2-1, a plurality of second connecting terminals 401b is laid out in a horizontally long manner as a whole in a region of the connecting substrate 40' corresponding to the third region R3 of the circuit chip 20 so as to correspond (be bonded), on a one-to-one basis, to the plurality of connecting terminals 201b in the third region R3.

As an example, as illustrated in the middle diagram of FIG. 37A, in the solid-state imaging device 2-1, a plurality of second connecting terminals 401b is laid out in a horizontally long manner as a whole in a region of the connecting substrate 40' corresponding to the fourth region R4 of the circuit chip 30 so as to correspond (be bonded), on a one-to-one basis, to the plurality of connecting terminals 301b in the fourth region R4.

Figures 38A, 38B:
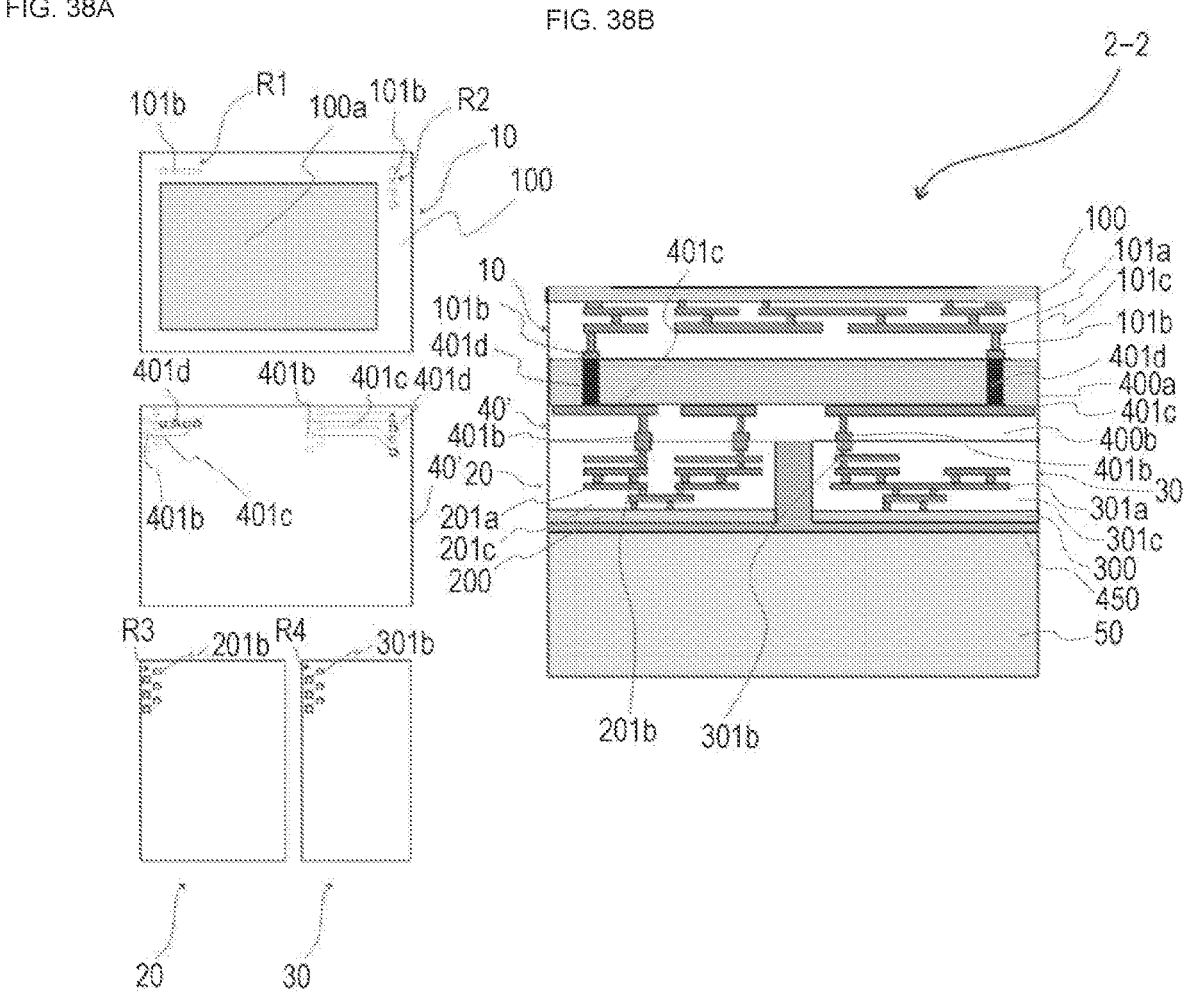
FIG. 38A is a schematic plan view of a pixel chip, a connecting substrate, and two circuit chips of a solid-state imaging device according to an example 2 of the second embodiment of the present technology.
FIG. 38B is a schematic cross-sectional view of the solid-state imaging device according to the example 2 of the second embodiment of the present technology.

FIG. 38A illustrates a plan view of a pixel chip 10, a connecting substrate 40', and two circuit chips 20 and 30 of a solid-state imaging device 2-2 of an example 2 of the second embodiment. FIG. 38B illustrates a cross-sectional view of the solid-state imaging device 2-2 of the example 2 of the second embodiment. Note that FIGS. 38A and 38B illustrate neither the color filter array 60 nor the microlens array 70.

As an example, as illustrated in the upper diagram of FIG. 38A, in the solid-state imaging device 2-2 of the example 2 of the second embodiment of the present technology, a plurality of connecting terminals 101b is laid out in a horizontally long manner as a whole in a first region R1 of the pixel chip 10, and a plurality of connecting terminals 101b is laid out in a vertically long manner as a whole in a second region R2 of the pixel chip 10.

As an example, as illustrated in the lower diagram of FIG. 38A, in the solid-state imaging device 2-2, a plurality of connecting terminals 201b is laid out in a vertically long manner as a whole in a third region R3 of the circuit chip 20, and a plurality of connecting terminals 301b is laid out in a vertically long manner as a whole in a fourth region R4 of the circuit chip 30.

As an example, as illustrated in the middle diagram of FIG. 38A, in the solid-state imaging device 2-2, a plurality of through electrodes 401d is laid out in a horizontally long manner as a whole in a region of the connecting substrate 40' corresponding to the first region R1 of the pixel chip 10 so as to correspond (be bonded), on a one-to-one basis, to the plurality of connecting terminals 101b in the first region R1.

As an example, as illustrated in the middle diagram of FIG. 38A, in the solid-state imaging device 2-2, a plurality of through electrodes 401d is laid out in a vertically long manner as a whole in a region of the connecting substrate 40' corresponding to the second region R2 of the pixel chip 10 so as to correspond (be bonded), on a one-to-one basis, to the plurality of connecting terminals 101b in the second region R2.

As an example, as illustrated in the middle diagram of FIG. 38A, in the solid-state imaging device 2-2, a plurality of second connecting terminals 401b is laid out in a vertically long manner as a whole in a region of the connecting substrate 40' corresponding to the third region R3 of the circuit chip 20 so as to correspond (be bonded), on a one-to-one basis, to the plurality of connecting terminals 201b in the third region R3.

As an example, as illustrated in the middle diagram of FIG. 38A, in the solid-state imaging device 2-2, a plurality of second connecting terminals 401b is laid out in a vertically long manner as a whole in a region of the connecting substrate 40' corresponding to the fourth region R4 of the circuit chip 30 so as to correspond (be bonded), on a one-to-one basis, to the plurality of connecting terminals 301b in the fourth region R4.

For example, in the solid-state imaging device 2-1 of the example 1, in a case where the designs of the circuit chips 20 and 30 are changed to the designs of the circuit chips 20 and 30 of the solid-state imaging device 2-2 of the example 2, it is only required that the design of the connecting substrate 40 be changed, in response to this change, to the design of the connecting substrate 40' of the solid-state imaging device 2-2 of the example 2, and the design of the pixel chip 10 need not be changed.

For example, in the solid-state imaging device 2-2 of the example 2, in a case where the designs of the circuit chips 20 and 30 are changed to the designs of the circuit chips 20 and 30 of the solid-state imaging device 2-1 of the example 1, it is only required that the design of the connecting substrate 40 be changed, in response to this change, to the design of the connecting substrate 40' of the solid-state imaging device 2-1 of the example 1, and the design of the pixel chip 10 need not be changed.

In any of the above-described cases, it is possible to stack and electrically connect the pixel chip 10, and the circuit chips 20 and 30 subjected to the design change with the connecting substrate 40' subjected to the design change interposed between the pixel chip 10, and the circuit chips 20 and 30 without changing the element/wiring layout of the pixel chip 10.

As described above, the solid-state imaging devices 2-1 and 2-2 of the examples 1 and 2 each have the connecting substrate 40' between the pixel chip 10 and each circuit chip, so that it is not necessary to provide the connecting terminals of the pixel chip 10 and the connecting terminals of each corresponding circuit chip at positions corresponding to each other (positions bonded to each other). This means that even if the design of one of the pixel chip 10 or the circuit chip group is changed, designing the connecting substrate 40' so as to accommodate this change allows the other having an existing design to be used as it is. Here, rather than changing the design of the pixel chip 10 including an element or the design of the circuit chip group including an element, changing the design of the connecting substrate 40 having a simple configuration without an element such as a transistor is much better in terms of cost and ensuring reliability.

(3) Method for Manufacturing Solid-State Imaging Device

Hereinafter, a method for manufacturing the solid-state imaging device 2 of the second embodiment is performed in accordance with a procedure of flowcharts illustrated in FIGS. 39 and 40.

In step S101 in FIG. 39, pixel chip formation processing is performed. The pixel chip formation processing is as described above.

In step S102 in FIG. 39, circuit chip formation processing is performed. The circuit chip formation processing is as described above.

In step S103 in FIG. 39, connecting substrate base member formation processing 2 is performed.

(Connecting Substrate Base Member Formation Processing 2)

Figure 41:
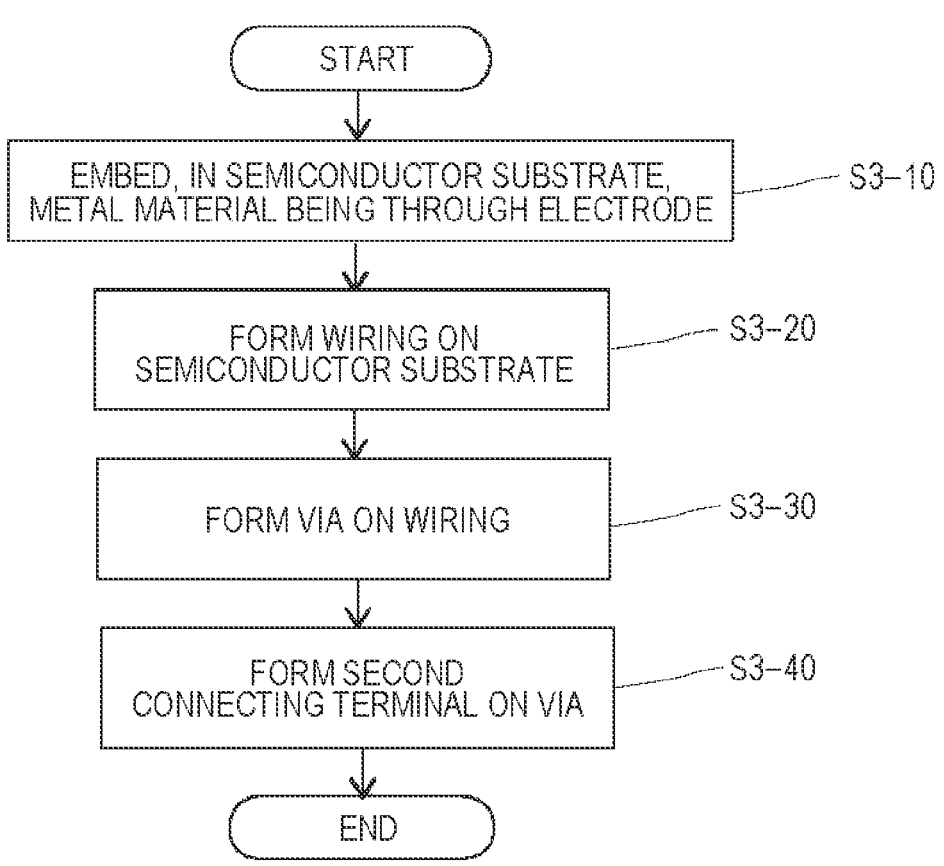
FIG. 41 is a flowchart for describing connecting substrate base member formation processing 2.

The connecting substrate base member formation processing 1 is performed in the semiconductor manufacturing process using the semiconductor manufacturing device in accordance with a procedure of a flowchart in FIG. 41 (steps S3-10 to S3-40) as an example. The connecting substrate base member formation processing 2 is processing of forming a connecting substrate base member 40B' being the connecting substrate 40'.

Figure 42A:
FIGS. 42A, 42B, 42C, 42D, and 42E are cross-sectional views, on a process-by-process basis, of the connecting substrate base member formation processing 2.
Figure 42B:
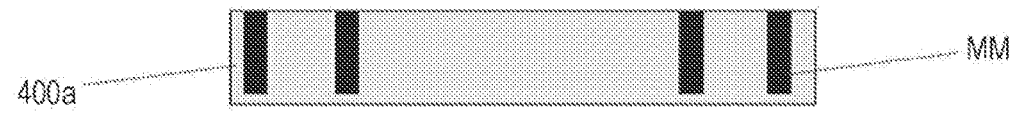

In step S3-10, in the semiconductor substrate 400a (see FIG. 42A), a metal material MM being the through electrode 401d is embedded (see FIG. 42B). Specifically, a trench (groove) is formed by etching the semiconductor substrate 400a, and the metal material MM (for example, Cu, W, Al, and the like) is embedded in the trench.

Figure 42C:
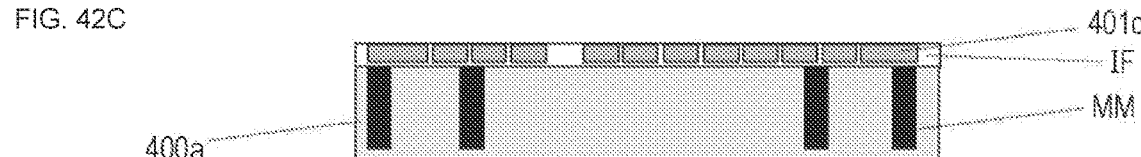

In step S3-20, on the semiconductor substrate 400a (see FIG. 42B), the wiring 401c of the wiring 401 is formed (see FIG. 42C). Specifically, the insulating film IF that is a material of the first insulating layer 400b is formed on the semiconductor substrate 400a into which the metal material MM has been embedded and etched to form an opening, and a metal material (for example, Cu) is embedded into the opening to form the wiring 401c.

Figure 42D:
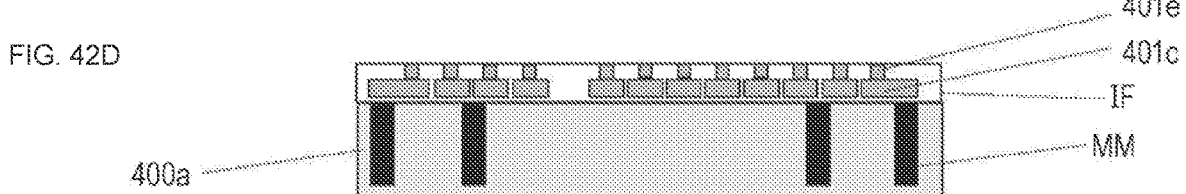

In step S3-30, the via 401e is formed on the wiring 401c (see FIG. 42D). Specifically, the insulating film IF that is the material of the first insulating layer 400b is further formed and etched to form an opening at a position corresponding to the wiring 401c, and a metal material (for example, Cu) is embedded in the opening to form the via 401e.

Figure 42E:
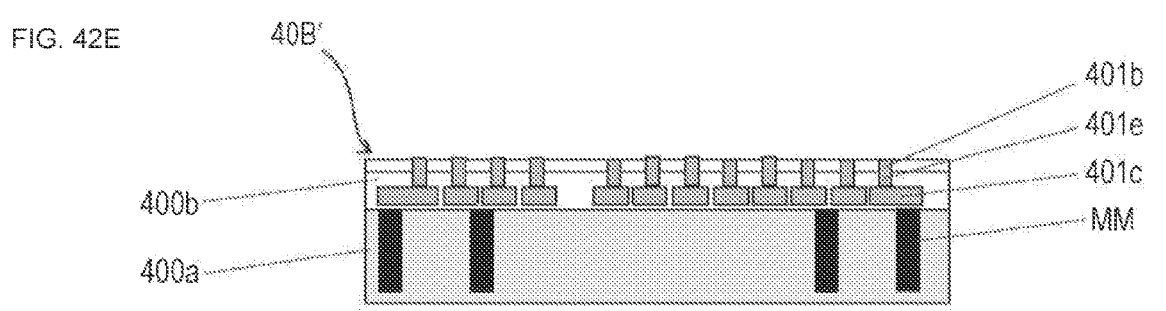

In step S3-40, the second connecting terminal 401b is formed on the via 401e (see FIG. 42E). Specifically, the material of the first insulating layer 400b is further formed into a film and etched to form an opening at a position corresponding to the via 401e, and a metal material (for example, Cu) is embedded in the opening to form the second connecting terminal 401b having a metal bonding surface (for example, a Cu bonding surface) at a position roughly flush with the surface of the first insulating layer 400b. As described above, the connecting substrate base member 40B' is formed.

In step S104 in FIG. 39, the circuit chips 20 and 30, and the connecting substrate base member 40B' are subjected to plasma activation (see FIG. 43). Specifically, plasma processing is performed on the circuit chips 20 and 30, and the connecting substrate base member 40B' by, for example, a plasma processing device of a standalone type to activate the metal bonding surfaces of the circuit chips 20 and 30 and the metal bonding surface of the connecting substrate base member 40B'.

Figure 44:
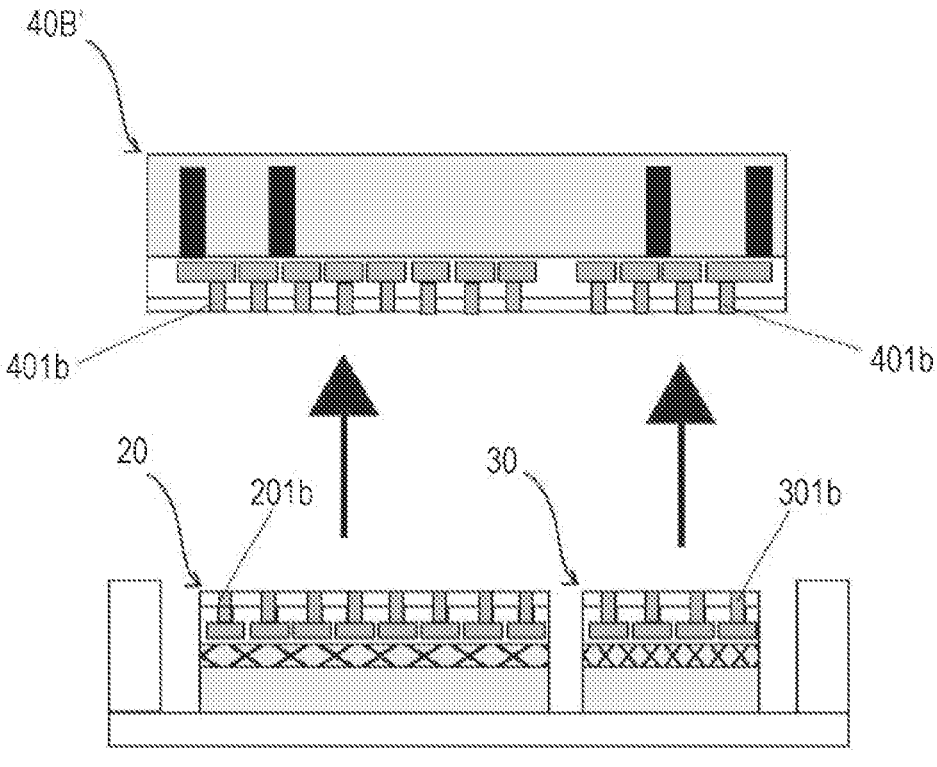
FIG. 44 is a cross-sectional view illustrating a process of attaching the two circuit chips to the connecting substrate base member.
Figure 45:
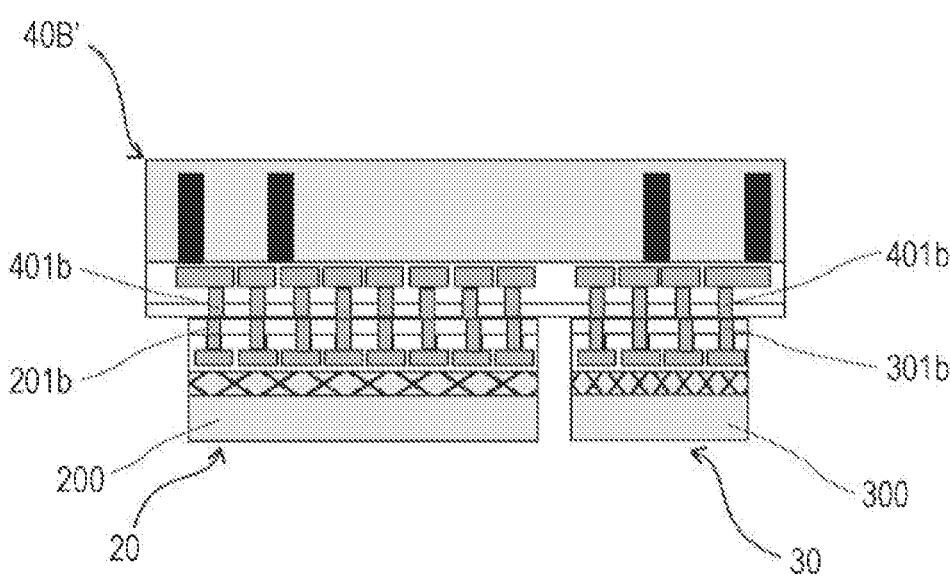
FIG. 45 is a cross-sectional view illustrating a state where the two circuit chips are attached to the connecting substrate base member.

In step S105 in FIG. 39, the circuit chips 20 and 30 are attached to the connecting substrate base member 40B' (see FIG. 44). At this time, with respect to the inverted connecting substrate base member 40B', the connecting terminal 201b of the circuit chip 20 and a corresponding second connecting terminal 401b of the connecting substrate base member 40B' are bonded by metal-metal bonding (for example, Cu—Cu bonding), and the connecting terminal 301b of the circuit chip 30 and a corresponding second connecting terminal 401b of the connecting substrate base member 40B' are bonded by metal-metal bonding (for example, Cu—Cu bonding) (see FIG. 45).

Figure 46:
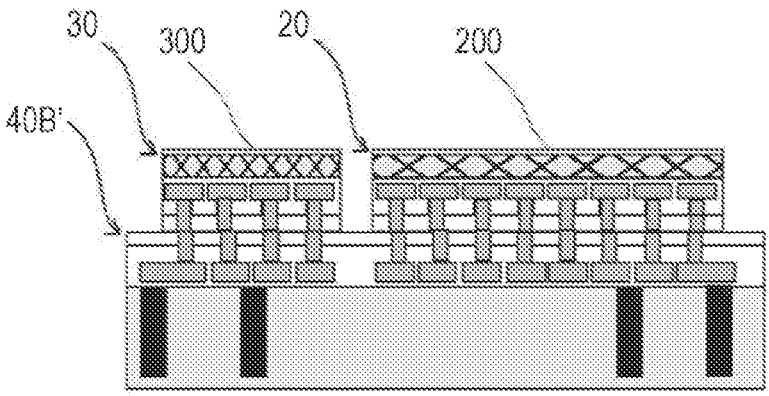
FIG. 46 is a cross-sectional view illustrating a state where semiconductor substrates of the two circuit chips are made thinner.

In step S106 in FIG. 39, the semiconductor substrates of the inverted circuit chips 20 and 30 are made thinner (see FIG. 46). Specifically, the back surfaces of the second semiconductor substrates 200 and 300 of the circuit chips 20 and are polished to be thinner.

Figure 47:
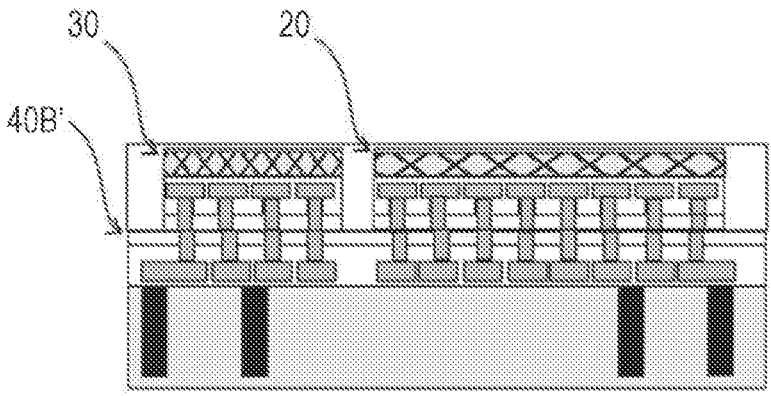
FIG. 47 is a cross-sectional view illustrating a state where the two circuit chips attached to the connecting substrate base member are planarized.

In step S107 in FIG. 39, step filling planarization is performed (see FIG. 47). Specifically, a step (see FIG. 46) formed by the circuit chips 20 and 30 and the connecting substrate base member 40B' is filled with an insulating material for planarization.

Figure 48:
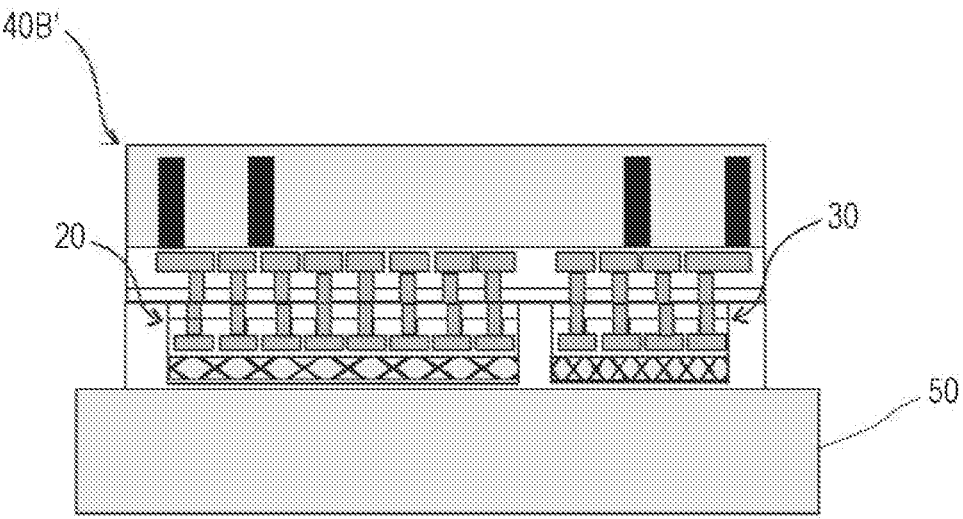
FIG. 48 is a cross-sectional view illustrating a state where the two circuit chips thus planarized are bonded to a support substrate.

In step S108 in FIG. 39, the planarized circuit chips 20 and 30 are bonded to the support substrate 50 (see FIG. 48). Specifically, the planarized circuit chips 20 and 30 are inverted and bonded to the support substrate 50.

Figure 40:
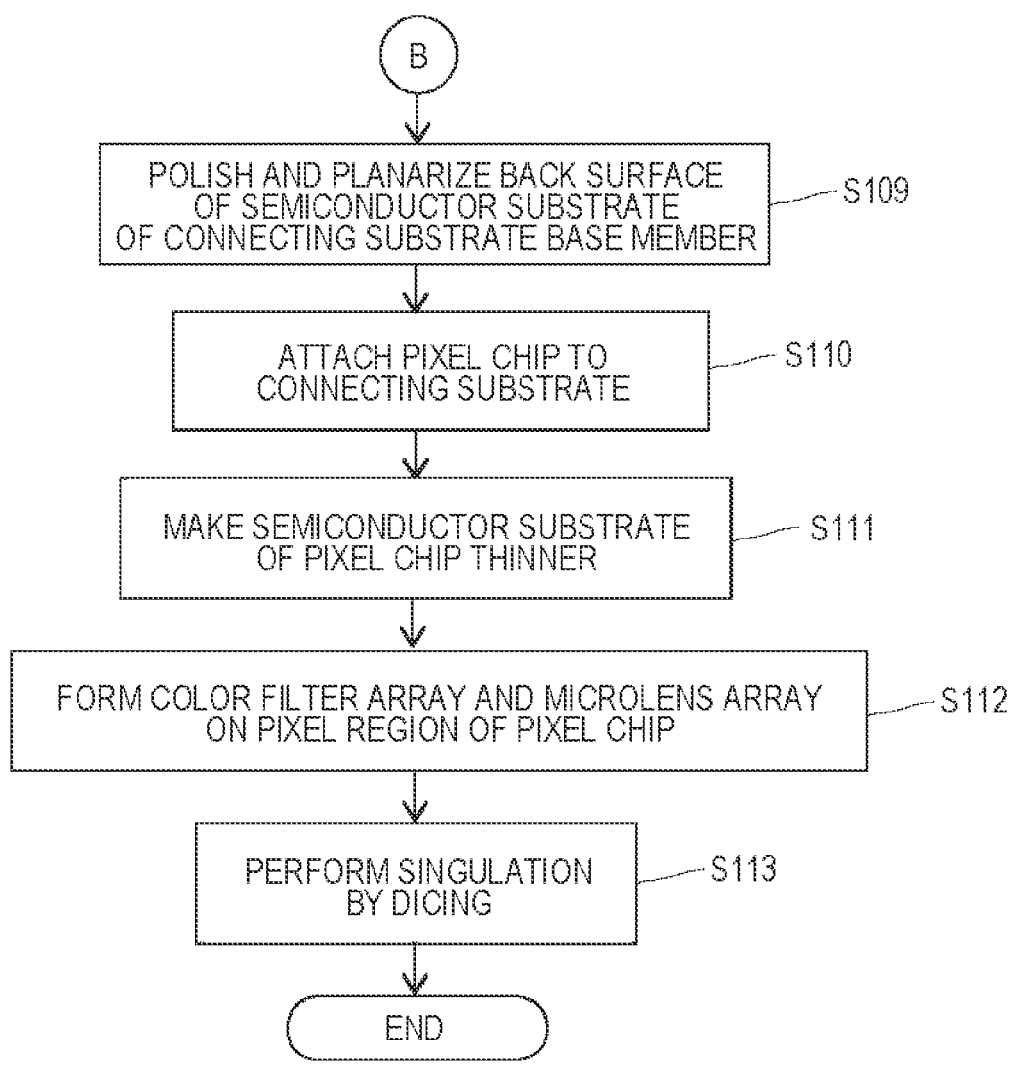
FIG. 40 is a second half of the flowchart for describing the method for manufacturing the solid-state imaging device according to the second embodiment of the present technology.
Figure 49:
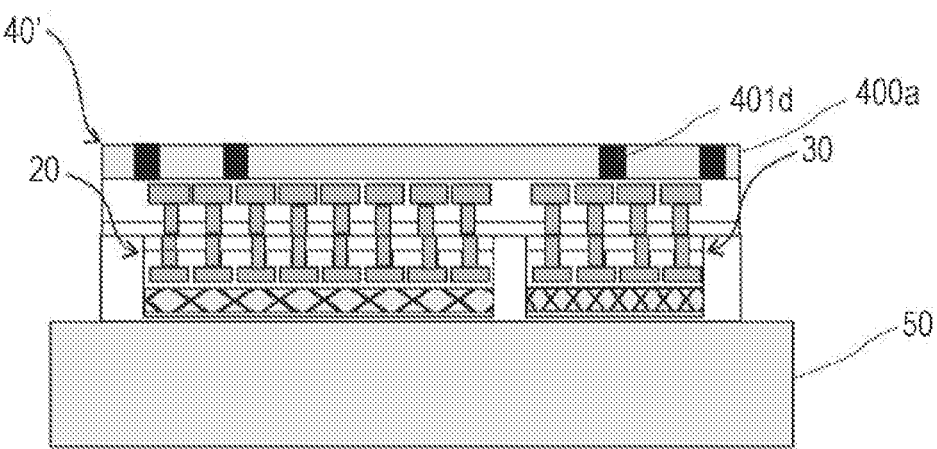
FIG. 49 is a cross-sectional view illustrating a state where a back surface of a semiconductor substrate of the connecting substrate base member is polished and planarized.

In step S109 in FIG. 40, the back surface of the semiconductor substrate 400a of the connecting substrate base member 40B' is polished and planarized (see FIG. 49). Specifically, the back surface of the semiconductor substrate 400a is polished to expose at least the metal material MM.

As a result, the through electrode 401*d* is formed in the semiconductor substrate 400*a*, which in turn forms the connecting substrate 40'.

Figure 50:
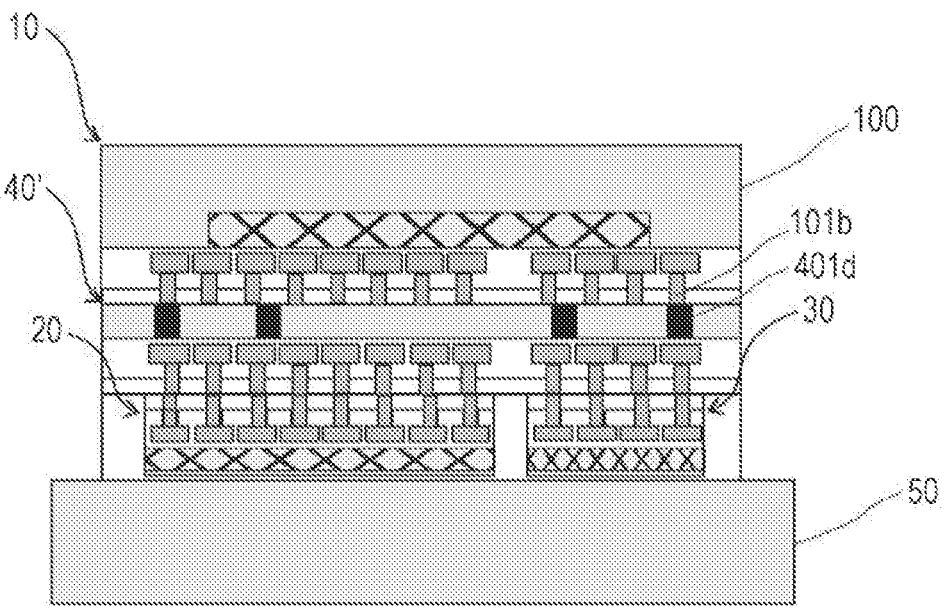
FIG. 50 is a cross-sectional view illustrating a state where the pixel chip is attached to the connecting substrate.

In step S110 in FIG. 40, the pixel chip 10 is attached to the connecting substrate 40' (see FIG. 50). Specifically, the connecting terminal 101*b* of the inverted pixel chip 10 is bonded to a corresponding through electrode 401*d* of the connecting substrate 40'.

Figure 51:
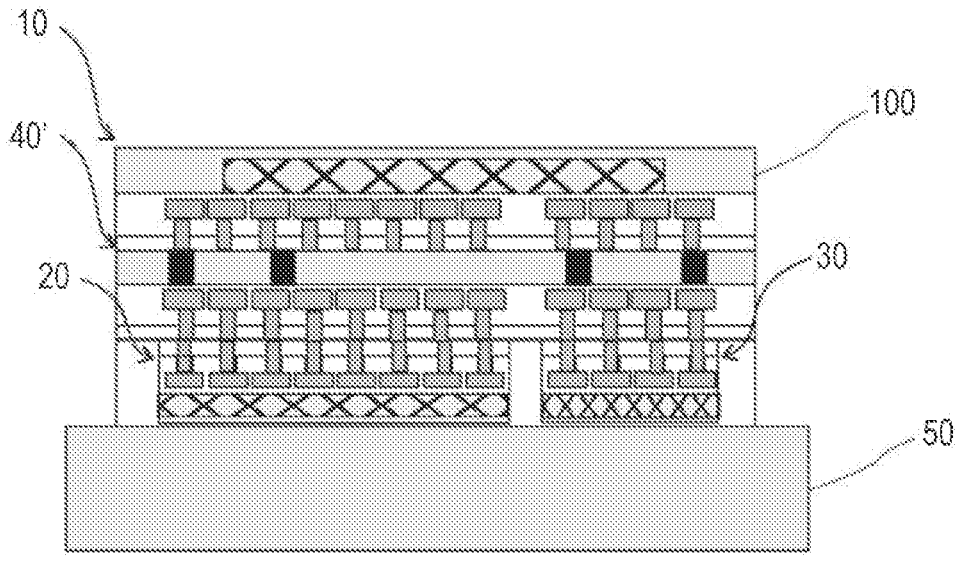
FIG. 51 is a cross-sectional view illustrating a state where a back surface of a semiconductor substrate of the pixel chip is polished.

In step S111 in FIG. 40, the first semiconductor substrate 100 of the pixel chip 10 is made thinner. (See FIG. 51). Specifically, the back surface of the first semiconductor substrate 100 of the pixel chip 10 is polished to be thinner.

Figure 52:
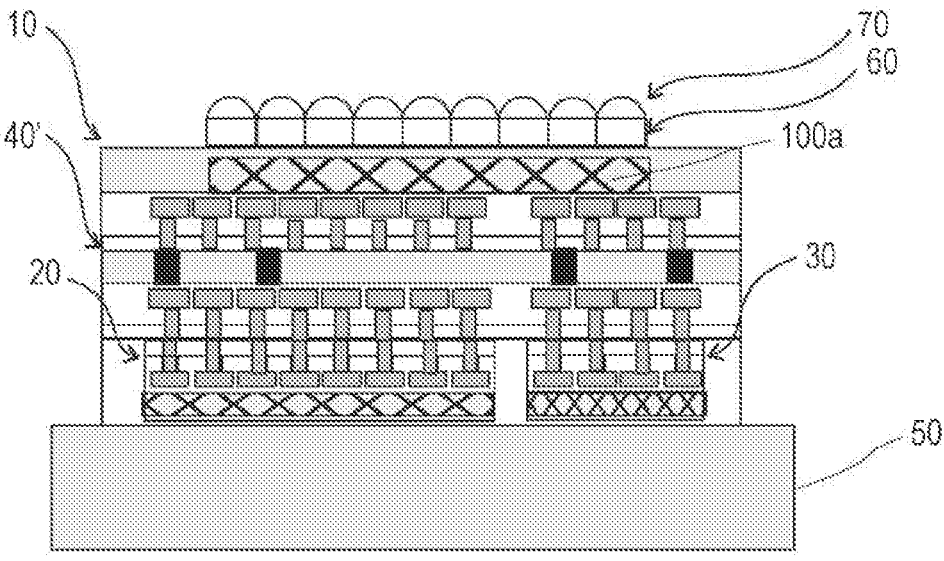
FIG. 52 is a diagram illustrating a state where a color filter array and a microlens array are formed on a pixel region of the pixel chip.

In step S112 in FIG. 40, the color filter array 60 and the microlens array 70 are formed on the pixel region 100*a* of the pixel chip 10 (see FIG. 52). Specifically, the color filter array 60 is formed so as to place each color filter 60*a* of the color filter array 60 on a corresponding pixel. The microlens array 70 is formed so as to place each microlens 70*a* of the microlens array 70 on a corresponding pixel and a corresponding color filter 60*a*.

Figure 53:
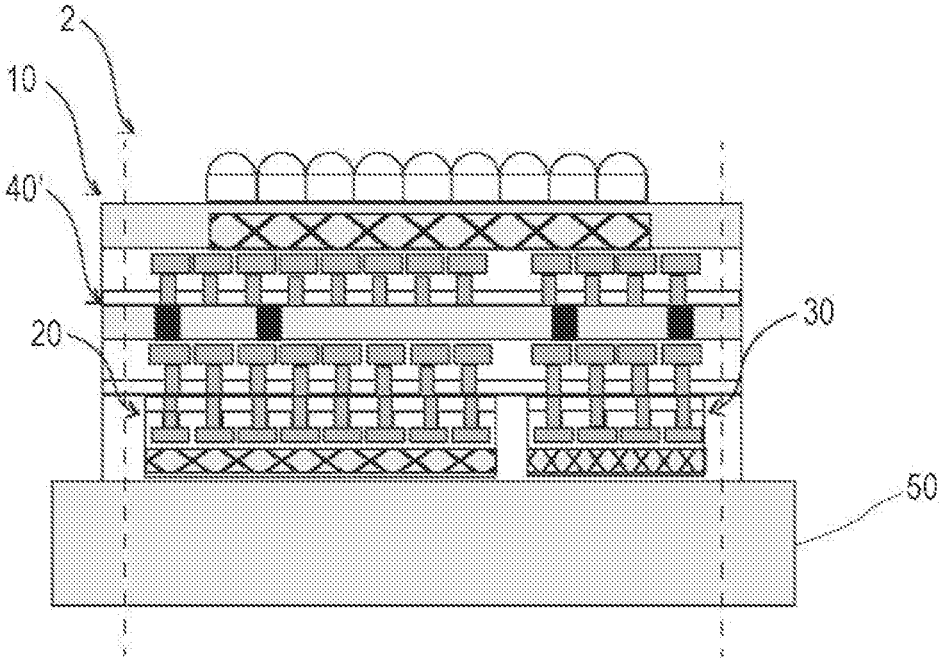
FIG. 53 is a diagram illustrating a process of subjecting the solid-state imaging device to singulation.

In step S113 in FIG. 40, singulation is performed by dicing. (see FIG. 53). Specifically, a plurality of the solid-state imaging devices 2 formed as a single piece is divided by dicing into separate chip-shaped solid-state imaging devices 2.

The solid-state imaging device 2 of the second embodiment described above is also similar in actions and effects to the solid-state imaging device 1 of the first embodiment.

The method for manufacturing the solid-state imaging device 2 of the second embodiment is also similar in effects to the method for manufacturing the solid-state imaging device 1 of the first embodiment.

6. <Solid-State Imaging Device According to Third Embodiment of Present Technology>

(1) Configuration of Solid-State Imaging Device

Hereinafter, a configuration of a solid-state imaging device 2 according to a third embodiment of the present technology will be described with reference to FIG. 54.

Figure 54:
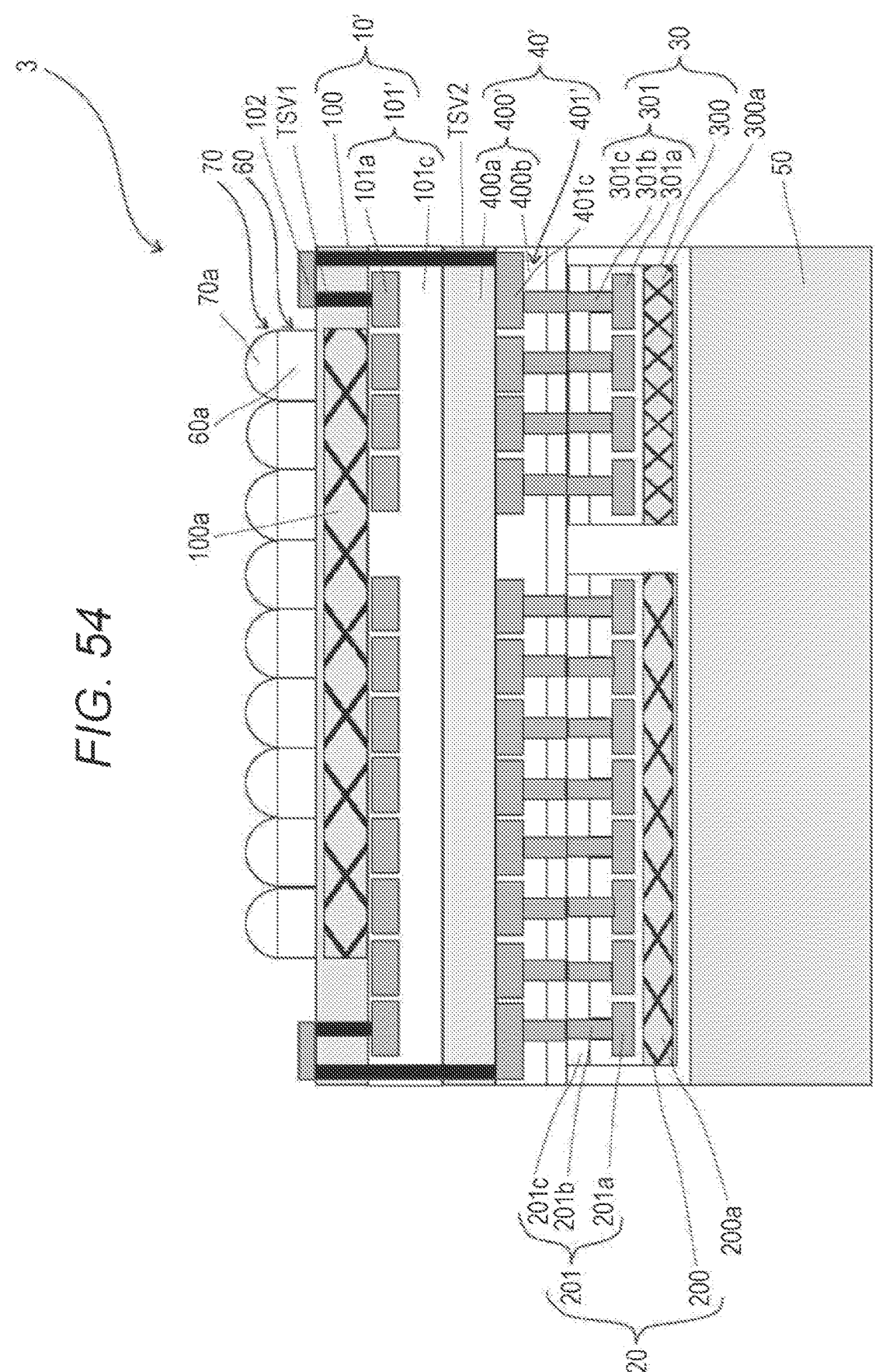
FIG. 54 is a schematic cross-sectional view of a solid-state imaging device according to a third embodiment of the present technology.

As illustrated in FIG. 54, the solid-state imaging device 3 according to the third embodiment is similar in configuration to the solid-state imaging device 2 according to the second embodiment except that the configuration of the pixel chip is different.

In a pixel chip 10' of the solid-state imaging device 3, a first wiring layer 101' has no connecting terminal 101*b*.

The solid-state imaging device 3 is provided with a first through electrode TSV1 passing through a first semiconductor substrate 100 of the pixel chip 10', and a second through electrode TSV2 passing through the first semiconductor substrate 100 and the first wiring layer 101' of the pixel chip 10' and a semiconductor substrate 400*a* of a connecting substrate 40'.

That is, the pixel chip 10' has the first through electrode TSV1 and a part (upper part) of the second through electrode TSV2. The connecting substrate 40' has the other part (lower part) of the second through electrode TSV2 as a through electrode 401*d* passing through the semiconductor substrate 400*a*.

The first through electrode TSV1 passes through the first semiconductor substrate 100 to connect wiring 101*a* of the first wiring layer 101' of the pixel chip 10' and a conductive pad 102 formed on the first semiconductor substrate 100. The second through electrode TSV2 passes through the pixel chip 10 and the semiconductor substrate 400*a* to connect wiring 401*c* of wiring 401' of the connecting substrate 40' and the conductive pad 102.

As a result, the wiring 101*a* of the pixel chip 10' and the wiring 401*c* of the connecting substrate 40' are connected via the first through electrode TSV1, the conductive pad 102, and the second through electrode TSV2.

(2) Solid-State Imaging Device of Example

Figures 55A, 55B:
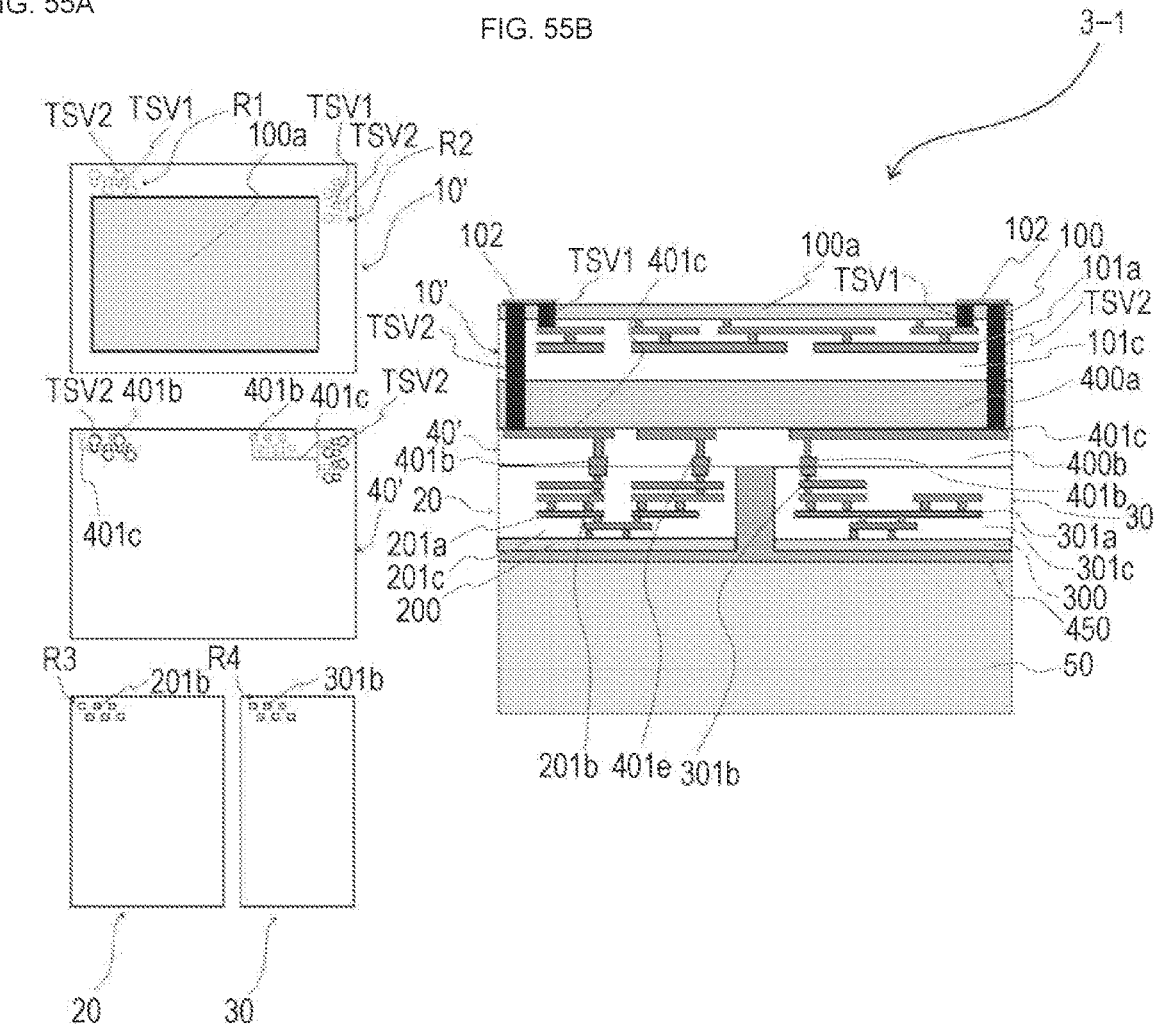
FIG. 55A is a schematic plan view a pixel chip, a connecting substrate, and two circuit chips of a solid-state imaging device according to an example 1 of the third embodiment of the present technology.
FIG. 55B is a schematic cross-sectional view of the solid-state imaging device according to the example 1 of the third embodiment of the present technology.

FIG. 55A illustrates a plan view of a pixel chip 10', a connecting substrate 40', and two circuit chips 20 and 30 of a solid-state imaging device 3-1 of an example 1 of the third embodiment. FIG. 55B illustrates a cross-sectional view of the solid-state imaging device 3-1 of the example 1 of the third embodiment. Note that FIGS. 55A and 55B illustrate neither the color filter array 60 nor the microlens array 70.

As an example, as illustrated in the upper diagram of FIG. 55A, in the solid-state imaging device 3-1 of the example 1 of the third embodiment of the present technology, a plurality of the first through electrodes TSV1 is laid out in a horizontally long manner as a whole and parts (upper parts) of a plurality of the second through electrodes TSV2 are laid out in a horizontally long manner as a whole in a first region R1 of the pixel chip 10'.

As an example, as illustrated in the upper diagram of FIG. 55A, in the solid-state imaging device 3-1, a plurality of through electrodes TSV1 is laid out in a vertically long manner as a whole and parts (upper parts) of a plurality of second through electrodes TSV2 are laid out in a vertically long manner as a whole in a second region R2 of the pixel chip 10'.

As an example, as illustrated in the lower diagram of FIG. 55A, in the solid-state imaging device 3-1, a plurality of connecting terminals 201*b* is laid out in a horizontally long manner as a whole in a third region R3 of the circuit chip 20, and a plurality of connecting terminals 301*b* is laid out in a horizontally long manner as a whole in a fourth region R4 of the circuit chip 30.

As an example, as illustrated in the middle diagram of FIG. 55A, in the solid-state imaging device 3-1, the other parts (lower parts) of the plurality of second through electrodes TSV2 are laid out in a horizontally long manner as a whole in a region of the connecting substrate 40' corresponding to the first region R1 of the pixel chip 10' so as to correspond (connect), on a one-to-one basis, to the parts (upper parts) of the plurality of second through electrodes TSV2 in the first region R1.

As an example, as illustrated in the middle diagram of FIG. 55A, in the solid-state imaging device 3-1, the other parts (lower parts) of the plurality of second through electrodes TSV2 are laid out in a vertically long manner as a whole in a region of the connecting substrate 40' corresponding to the second region R2 of the pixel chip 10' so as to correspond (connect), on a one-to-one basis, to the parts (upper parts) of the plurality of second through electrodes TSV2 in the second region R2.

As an example, as illustrated in the middle diagram of FIG. 55A, in the solid-state imaging device 3-1, a plurality of second connecting terminals 401*b* is laid out in a horizontally long manner as a whole in a region of the connecting substrate 40' corresponding to the third region R3 of the circuit chip 20 so as to correspond (be bonded), on a one-to-one basis, to the plurality of connecting terminals 201*b* in the third region R3.

As an example, as illustrated in the middle diagram of FIG. 55A, in the solid-state imaging device 3-1, a plurality of second connecting terminals 401*b* is laid out in a horizontally long manner as a whole in a region of the connecting substrate 40' corresponding to the fourth region R4 of the circuit chip 30 so as to correspond (be bonded), on a one-to-one basis, to the plurality of connecting terminals 301*b* in the fourth region R4.

Figures 56A, 56B:
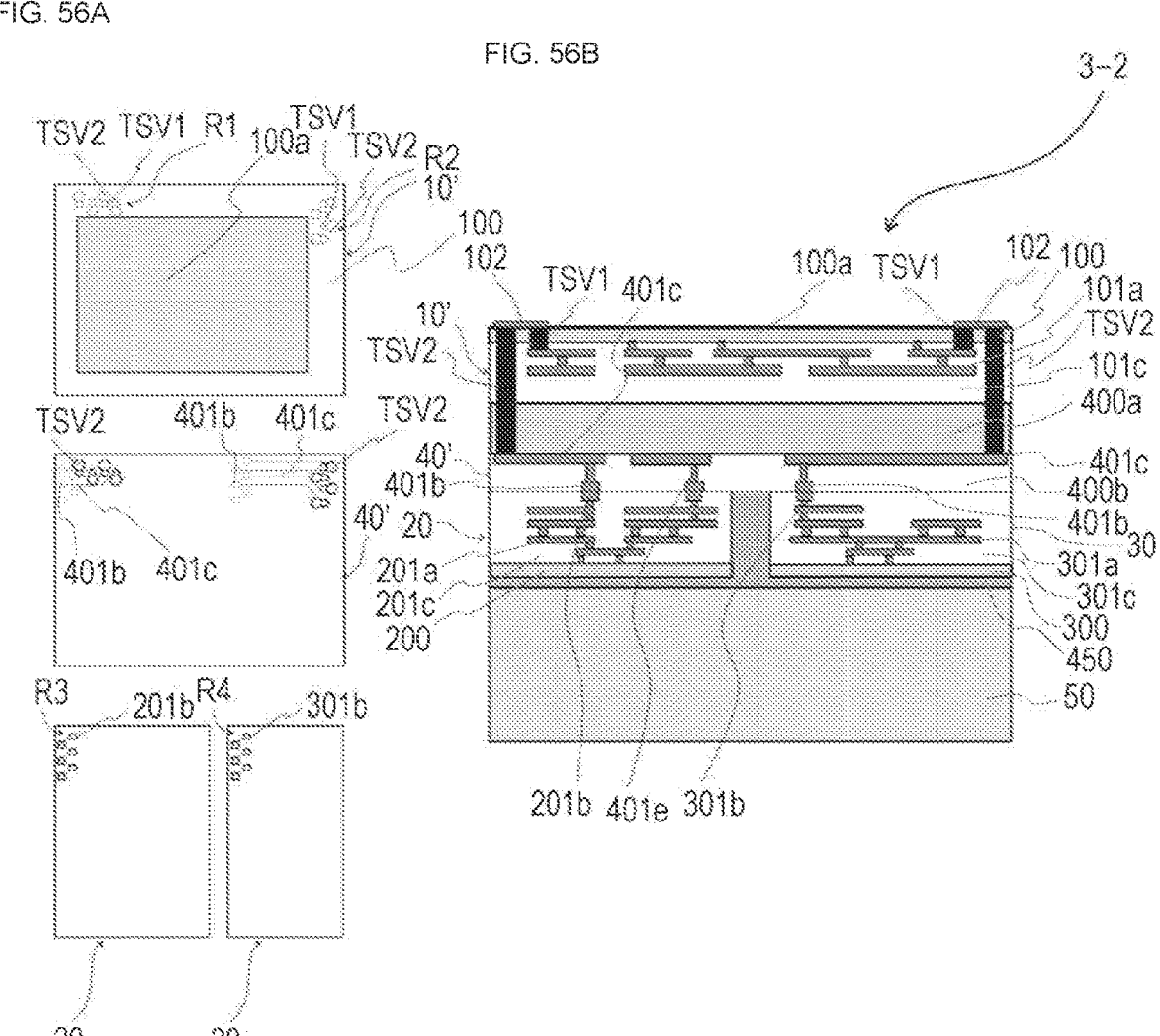
FIG. 56A is a schematic plan view of a pixel chip, a connecting substrate, and two circuit chips of a solid-state imaging device according to an example 2 of the third embodiment of the present technology.
FIG. 56B is a schematic cross-sectional view of the solid-state imaging device according to the example 2 of the third embodiment of the present technology.

FIG. 56A illustrates a plan view of a pixel chip 10', a connecting substrate 40', and two circuit chips 20 and 30 of a solid-state imaging device 3-2 of an example 2 of the third embodiment. FIG. 56B illustrates a cross-sectional view of the solid-state imaging device 3-2 of the example 2 of the third embodiment. Note that FIGS. 56A and 56B illustrate neither the color filter array 60 nor the microlens array 70.

As an example, as illustrated in the upper diagram of FIG. 56A, in the solid-state imaging device 3-2 of the example 2 of the third embodiment of the present technology, a plurality of first through electrodes TSV1 is laid out in a horizontally long manner as a whole and parts (upper parts) of a plurality of second through electrodes TSV2 are laid out in a horizontally long manner as a whole in a first region R1 of the pixel chip 10'.

As an example, as illustrated in the upper diagram of FIG. 56A, in the solid-state imaging device 3-2, a plurality of through electrodes TSV1 is laid out in a vertically long manner as a whole and parts (upper parts) of a plurality of second through electrodes TSV2 are laid out in a vertically long manner as a whole in a second region R2 of the pixel chip 10'.

As an example, as illustrated in the lower diagram of FIG. 56A, in the solid-state imaging device 3-2, a plurality of connecting terminals 201*b* is laid out in a vertically long manner as a whole in a third region R3 of the circuit chip 20, and a plurality of connecting terminals 301*b* is laid out in a vertically long manner as a whole in a fourth region R4 of the circuit chip 30.

As an example, as illustrated in the middle diagram of FIG. 56A, in the solid-state imaging device 3-2, the other parts (lower parts) of the plurality of second through electrodes TSV2 are laid out in a horizontally long manner as a whole in a region of the connecting substrate 40' corresponding to the first region R1 of the pixel chip 10' so as to correspond (connect), on a one-to-one basis, to the parts (upper parts) of the plurality of second through electrodes TSV2 in the first region R1.

As an example, as illustrated in the middle diagram of FIG. 56A, in the solid-state imaging device 3-2, the other parts (lower parts) of the plurality of second through electrodes TSV2 are laid out in a vertically long manner as a whole in a region of the connecting substrate 40' corresponding to the second region R2 of the pixel chip 10' so as to correspond (connect), on a one-to-one basis, to the parts (upper parts) of the plurality of second through electrodes TSV2 in the second region R2.

As an example, as illustrated in the middle diagram of FIG. 56A, in the solid-state imaging device 3-2, a plurality of second connecting terminals 401*b* is laid out in a vertically long manner as a whole in a region of the connecting substrate 40' corresponding to the third region R3 of the circuit chip 20 so as to correspond (be bonded), on a one-to-one basis, to the plurality of connecting terminals 201*b* in the third region R3.

As an example, as illustrated in the middle diagram of FIG. 56A, in the solid-state imaging device 3-2, a plurality of second connecting terminals 401*b* is laid out in a vertically long manner as a whole in a region of the connecting substrate 40 corresponding to the fourth region R4 of the circuit chip 30 so as to correspond (be bonded), on a one-to-one basis, to the plurality of connecting terminals 301*b* in the fourth region R4.

For example, in the solid-state imaging device 3-1 of the example 1, in a case where the designs of the circuit chips

20 and 30 are changed to the designs of the circuit chips 20 and 30 of the solid-state imaging device 3-2 of the example 2, it is only required the design of the connecting substrate 40' be changed, in response to this change, to the design of the connecting substrate 40' of the solid-state imaging device 3-2 of the example 2, and the design of the pixel chip 10' need not be changed.

For example, in the solid-state imaging device 3-2 of the example 2, in a case where the designs of the circuit chips 20 and 30 are changed to the designs of the circuit chips 20 and 30 of the solid-state imaging device 3-1 of the example 1, it is only required that the design of the connecting substrate 40' be changed, in response to this change, to the design of the connecting substrate 40' of the solid-state imaging device 3-1 of the example 1, and the design of the pixel chip 10' need not be changed.

In any of the above-described cases, it is possible to stack and electrically connect the pixel chip 10', and the circuit chips 20 and 30 subjected to the design change with the connecting substrate 40 subjected to the design change interposed between the pixel chip 10, and the circuit chips 20 and 30 without changing the element/wiring layout of the pixel chip 10'.

As described above, the solid-state imaging devices 3-1 and 3-2 of the examples 1 and 2 each have the connecting substrate 40' between the pixel chip 10' and each circuit chip, so that it is not necessary to provide the connecting terminals of the pixel chip 10' and the connecting terminals of each corresponding circuit chip at positions corresponding to each other (positions bonded to each other). This means that even if the design of one of the pixel chip 10' or the circuit chip group is changed, designing the connecting substrate 40' so as to accommodate this change allows the other having an existing design to be used as it is. Here, rather than changing the design of the pixel chip 10' including an element or the design of the circuit chip group including an element, changing the design of the connecting substrate 40 having a simple configuration without an element such as a transistor is much better in terms of cost and ensuring reliability.

(3) Method for Manufacturing Solid-State Imaging Device

Hereinafter, a method for manufacturing the solid-state imaging device 3 is performed in accordance with a procedure of flowcharts illustrated in FIGS. 57 and 58.

Figure 57:
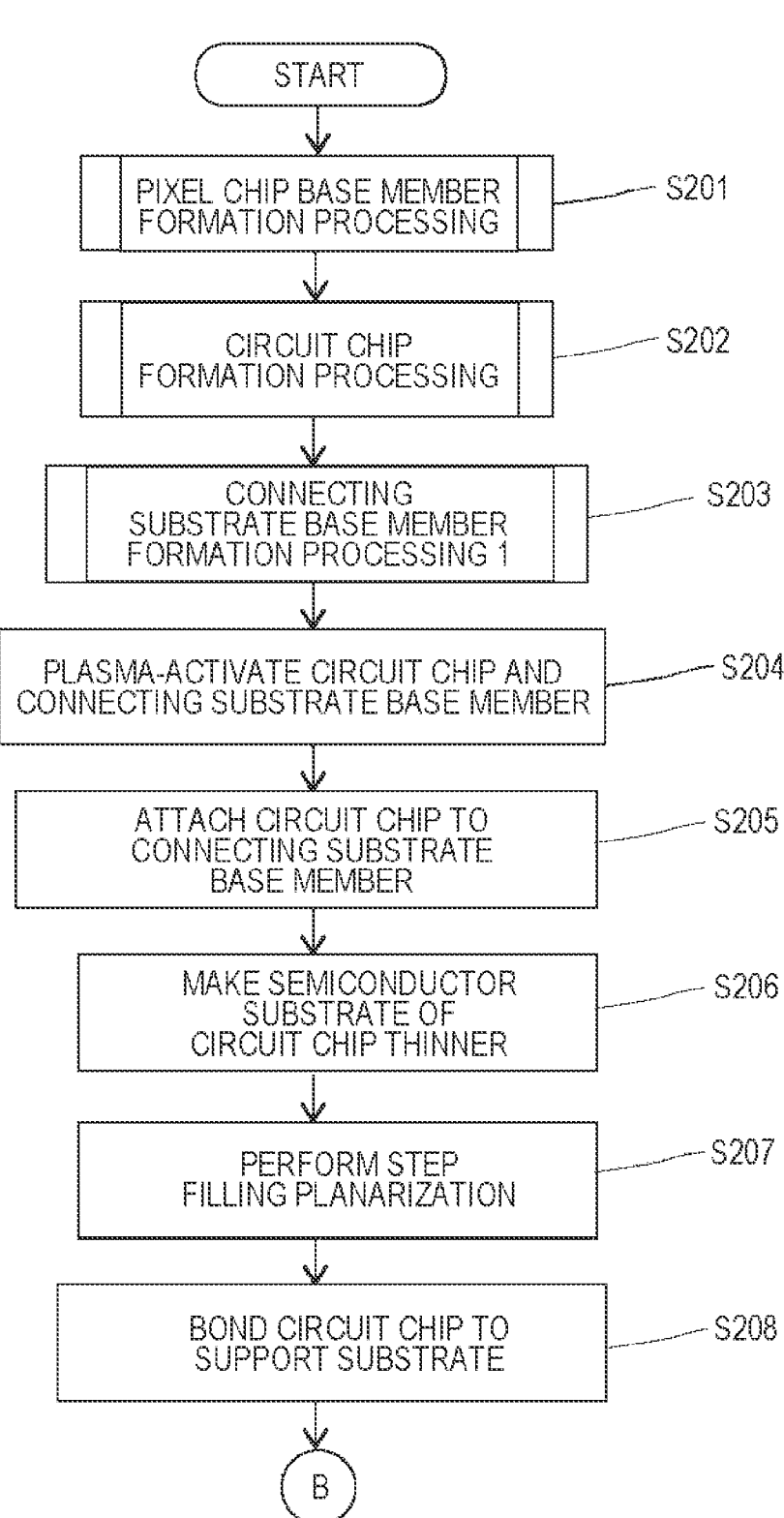
FIG. 57 is a first half of a flowchart for describing a method for manufacturing the solid-state imaging device according to the third embodiment of the present technology.

In step S201 in FIG. 57, pixel chip base member formation processing is performed. The pixel chip base member formation processing is processing of forming a pixel chip base member 10B that is a base member of the pixel chip 10' and is processing similar to the above-described pixel chip formation processing (step S1 in FIG. 11). That is, the pixel chip base member 10B is substantially the same as the pixel chip 10 of the solid-state imaging device 1 of the first embodiment and the pixel chip 10 of the solid-state imaging device 2 of the second embodiment.

In step S202 in FIG. 57, circuit chip formation processing is performed. The circuit chip formation processing is as described above.

In step S203 in FIG. 57, connecting substrate base member formation processing 1 is performed. The connecting substrate base member formation processing 2 is as described above.

In step S204 in FIG. 57, the circuit chips 20 and 30, and the connecting substrate base member 40B are subjected to plasma activation (see FIG. 59). Specifically, plasma processing is performed on the circuit chips 20 and 30, and the connecting substrate base member 40B by, for example, a plasma processing device of a standalone type to activate the metal bonding surfaces of the circuit chips 20 and 30 and the metal bonding surface of the connecting substrate base member 40B.

Figure 60:
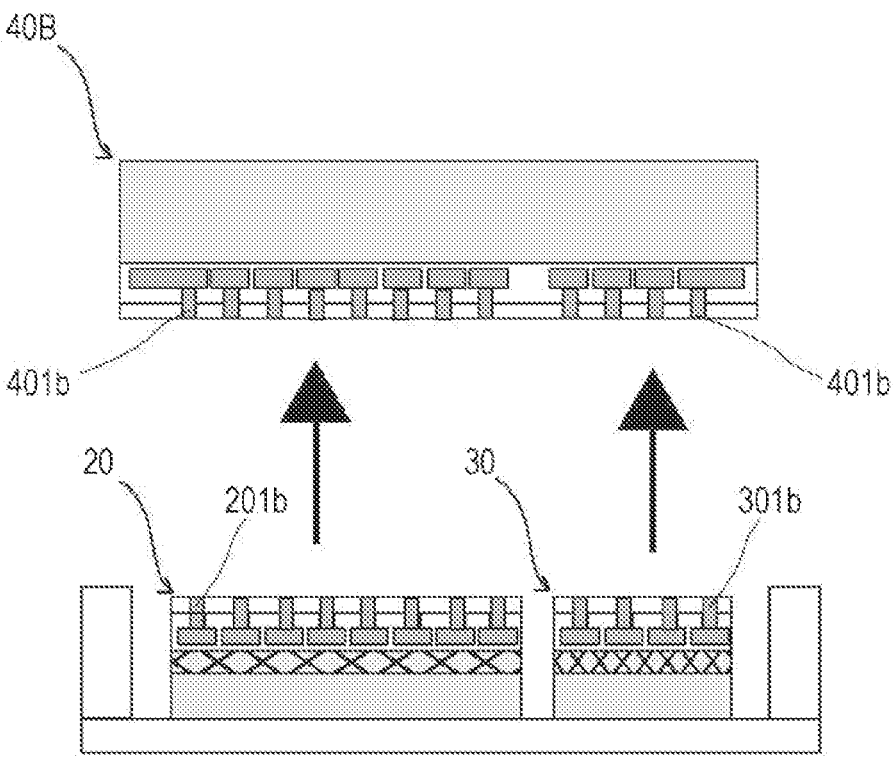
FIG. 60 is a cross-sectional view illustrating a process of attaching the two circuit chips to the connecting substrate base member.
Figure 61:
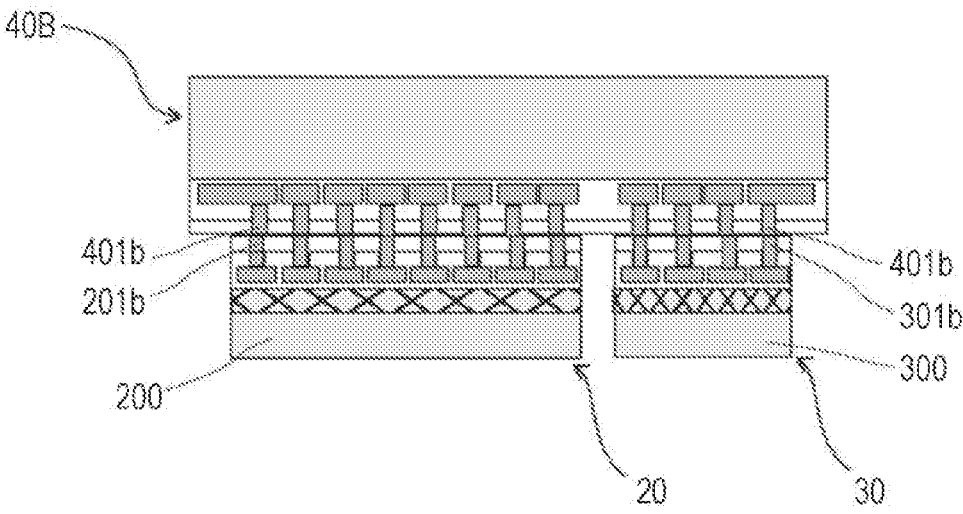
FIG. 61 is a cross-sectional view illustrating a state where the two circuit chips are attached to the connecting substrate base member.

In step S205 in FIG. 57, the circuit chips 20 and 30 are attached to the connecting substrate base member 40B (see FIG. 60). Specifically, with respect to the inverted connecting substrate base member 40B, each connecting terminal 201*b* of the circuit chip 20 and a corresponding second connecting terminal 401*b* of the connecting substrate base member 40B are bonded by metal-metal bonding (for example, Cu—Cu bonding), and each connecting terminal 301*b* of the circuit chip 30 and a corresponding second connecting terminal 401*b* of the connecting substrate base member 40B are bonded by metal-metal bonding (for example, Cu—Cu bonding) (see FIG. 61).

Figure 62:
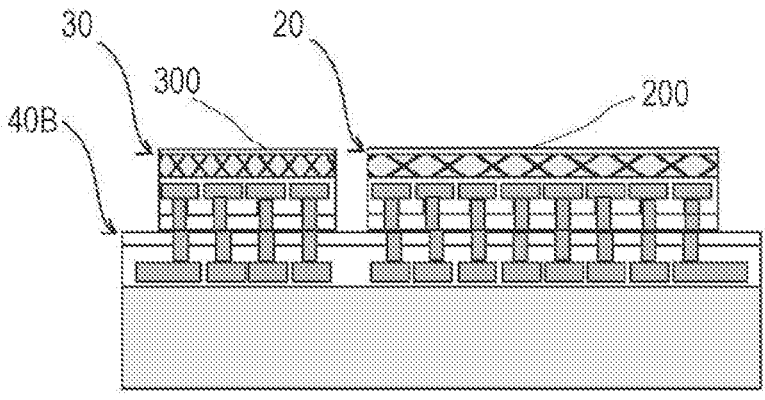
FIG. 62 is a cross-sectional view illustrating a state where semiconductor substrates of the two circuit chips are made thinner.

In step S206 in FIG. 57, the semiconductor substrates of the circuit chips 20 and 30 are made thinner (see FIG. 62). Specifically, the back surfaces of the second semiconductor substrates 200 and 300 of the inverted circuit chips 20 and 30 are polished to be thinner.

Figure 63:
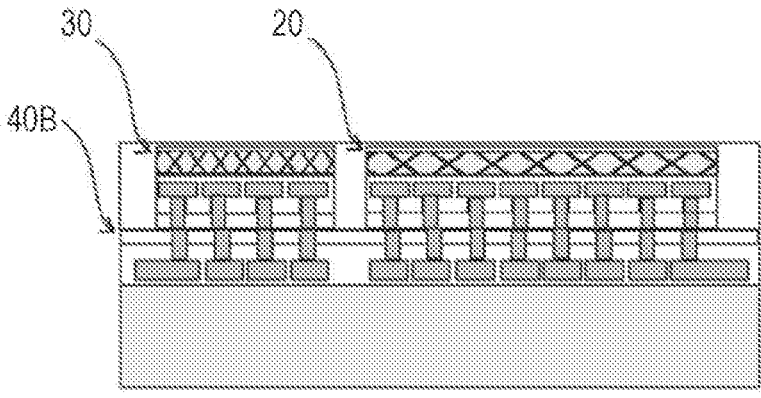
FIG. 63 is a cross-sectional view illustrating a state where the two circuit chips attached to the connecting substrate base member are planarized.

In step S207 in FIG. 57, step filling planarization is performed (see FIG. 63). Specifically, a step (see FIG. 62) formed by the circuit chips 20 and 30, and the connecting substrate base member 40B is filled with an insulating material for planarization.

Figure 64:
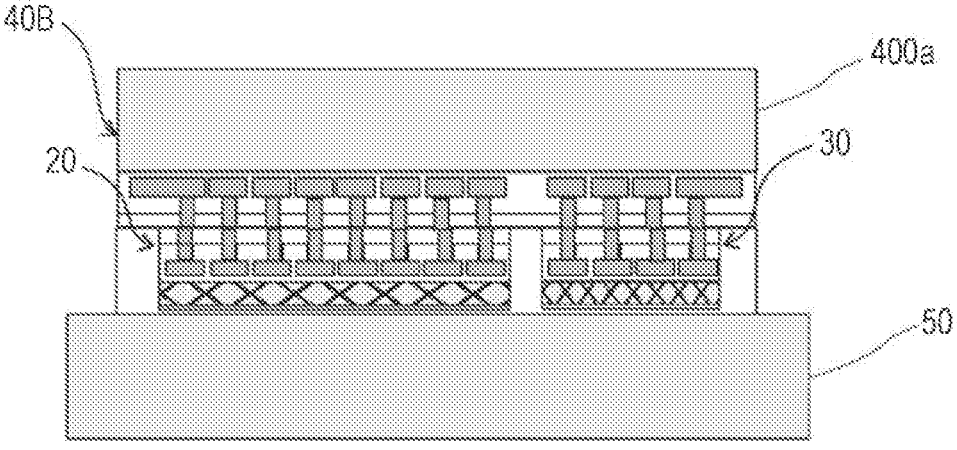
FIG. 64 is a cross-sectional view illustrating a state where the two circuit chips thus planarized are bonded to a support substrate.

In step S208 in FIG. 57, the planarized circuit chips 20 and 30 are bonded to the support substrate 50 (see FIG. 64). Specifically, the planarized circuit chips 20 and 30 are inverted and bonded to the support substrate 50.

Figure 58:
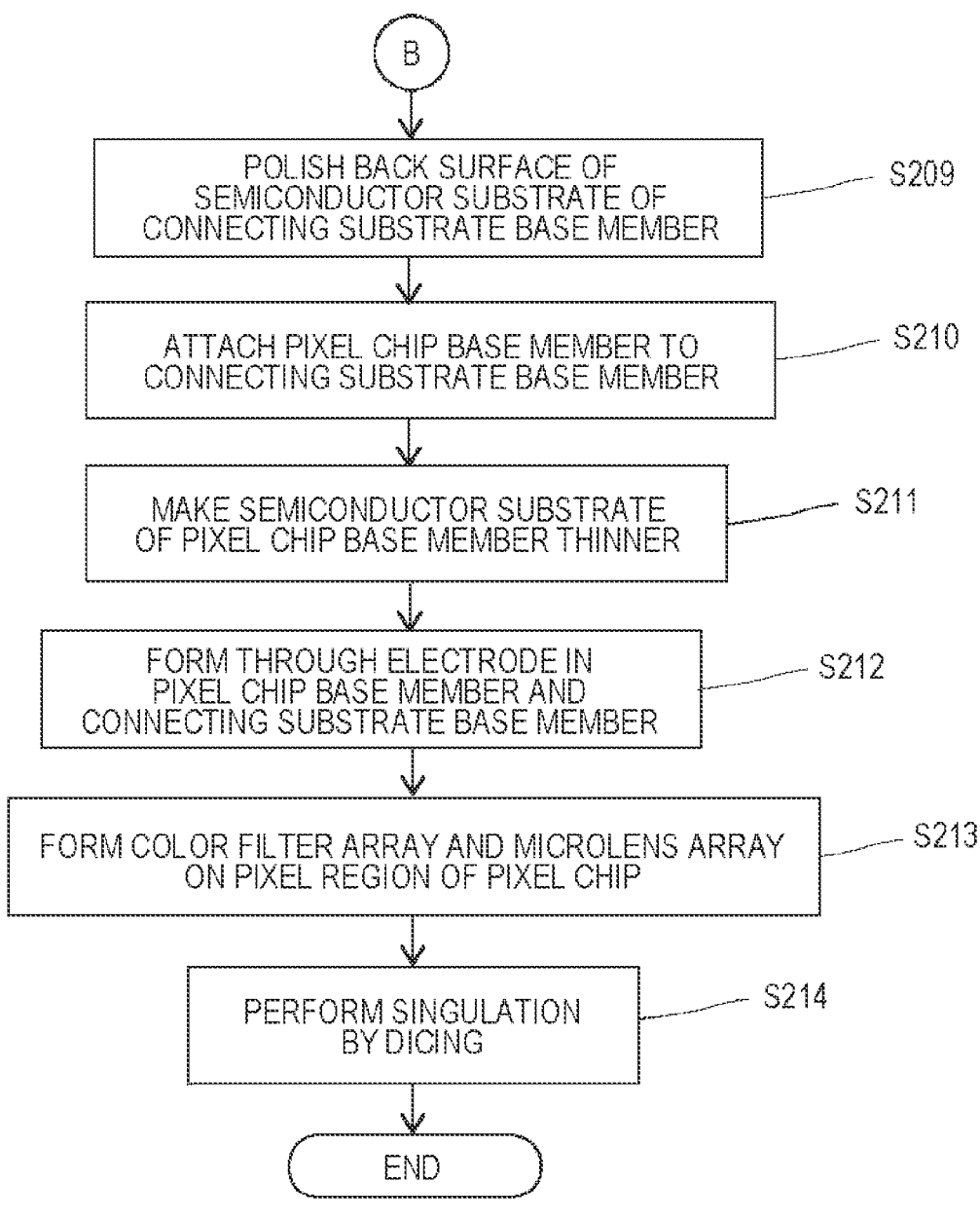
FIG. 58 is a second half of the flowchart for describing the method for manufacturing the solid-state imaging device according to the third embodiment of the present technology.
Figure 65:
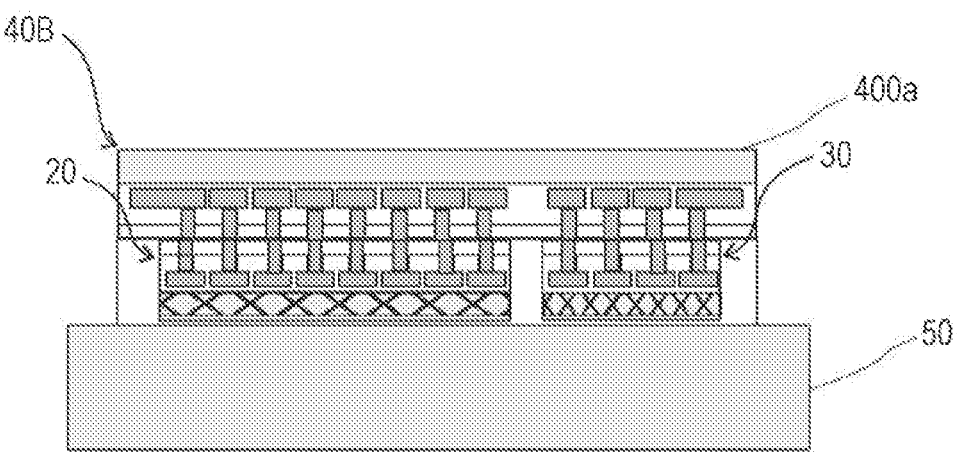
FIG. 65 is a cross-sectional view illustrating a state where a back surface of a semiconductor substrate of the connecting substrate base member is polished and planarized.

In step S209 in FIG. 58, the back surface of the semiconductor substrate 400*a* of the connecting substrate base member 40B is polished and planarized (see FIG. 65).

Figure 66:
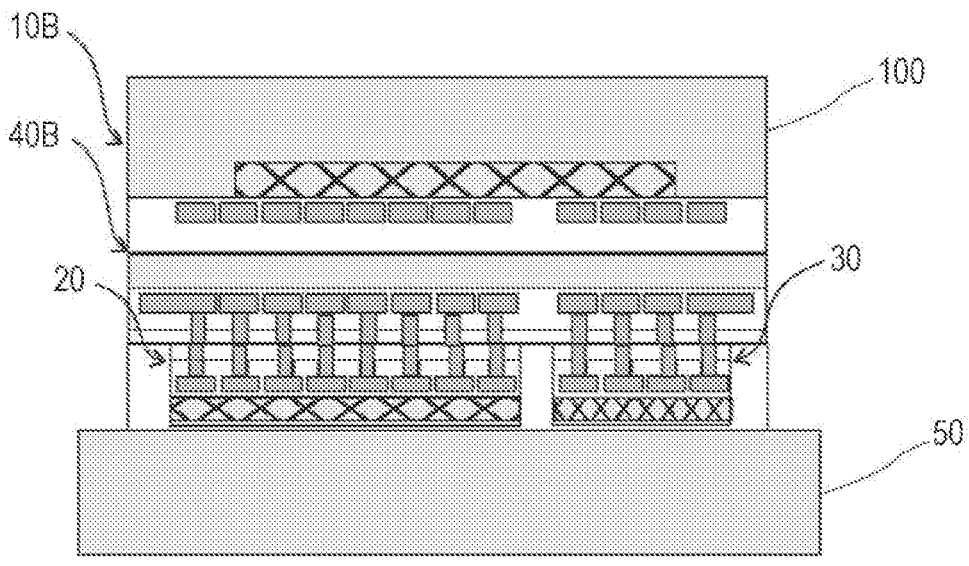
FIG. 66 is a cross-sectional view illustrating a state where a pixel chip base member is attached to the connecting substrate.

In step S210 in FIG. 58, the pixel chip base member 10B is attached to the connecting substrate base member 40B (see FIG. 66). Specifically, the inverted pixel chip base member 10B is attached to the connecting substrate base member 40B.

Figure 67:
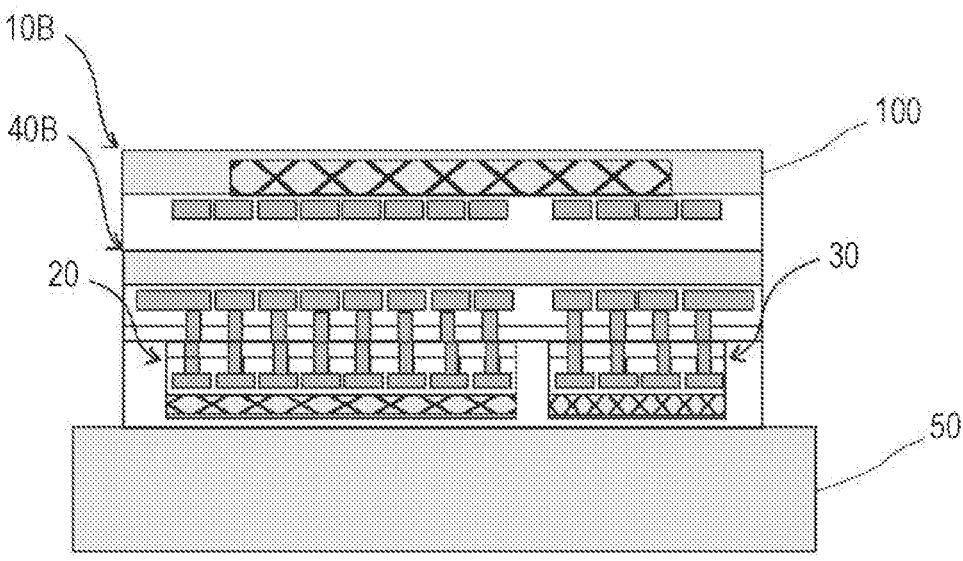
FIG. 67 is a cross-sectional view illustrating a state where a back surface of a semiconductor substrate of the pixel chip base member is polished.

In step S211 in FIG. 58, the first semiconductor substrate 100 of the pixel chip base member 10B is made thinner (see FIG. 67). Specifically, the back surface of the first semiconductor substrate 100 of the pixel chip base member 10B is polished to be thinner.

Figure 68:
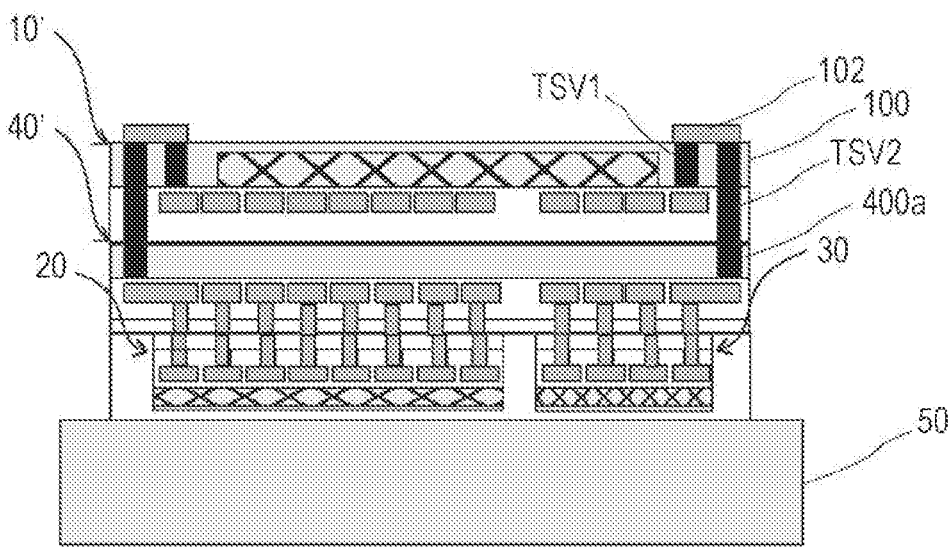
FIG. 68 is a diagram illustrating a state where a through electrode is formed in the pixel chip base member and the connecting substrate base member.

In step S212 in FIG. 58, a through electrode is formed in the pixel chip base member 10B and the connecting substrate base member 40B (see FIG. 68). Specifically, the first through electrode TSV1 is formed in the first semiconductor substrate 100 of the pixel chip base member 10B, and the second through electrode TSV2 is formed in the pixel chip base member 10B and the semiconductor substrate 400*a* of the connecting substrate base member 40B. More specifically, the first semiconductor substrate 100 is etched to form a through hole, and a metal material (for example, Cu, W, Al, or the like) is embedded in the through hole to form the first through electrode TSV1. The pixel chip base member 10B and the semiconductor substrate 400*a* are etched to form a continuous through hole, and a metal material (for example, Cu, W, Al, or the like) is embedded in the through hole to form the second through electrode TSV2.

Thereafter, the conductive pad 102 connecting the first through electrode TSV1 and the second through electrode TSV2 is formed on the first semiconductor substrate 100.

Figure 69:
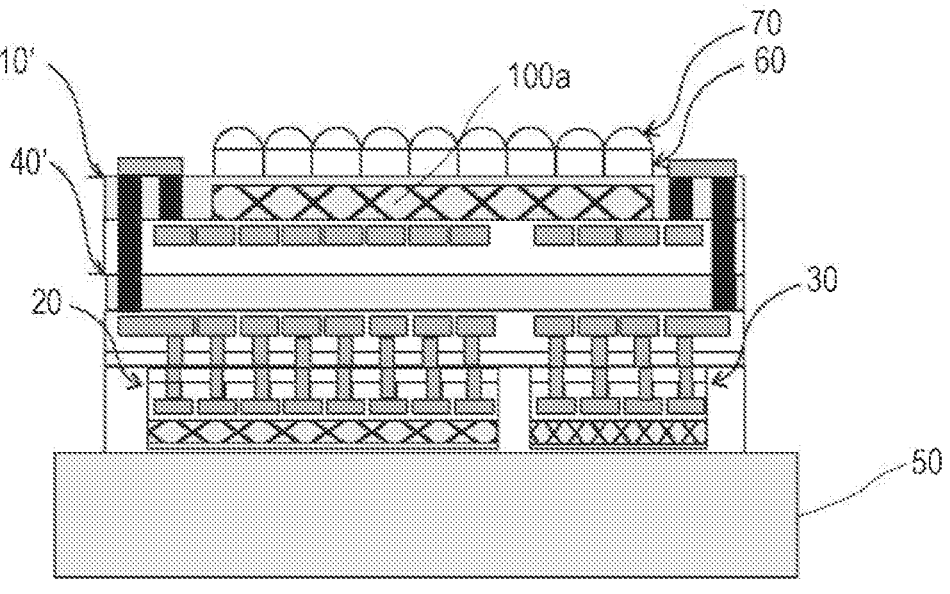
FIG. 69 is a diagram illustrating a state where a color filter array and a microlens array are formed on a pixel region of the pixel chip.

In step S213 in FIG. 58, the color filter array 60 and the microlens array 70 are formed on the pixel region 100*a* of the pixel chip 10 (see FIG. 69). Specifically, the color filter array 60 is formed so as to place each color filter 60*a* of the color filter array 60 on a corresponding pixel. The microlens array 70 is formed so as to place each microlens 70*a* of the microlens array 70 on a corresponding pixel and a corresponding color filter 60*a*.

Figure 70:
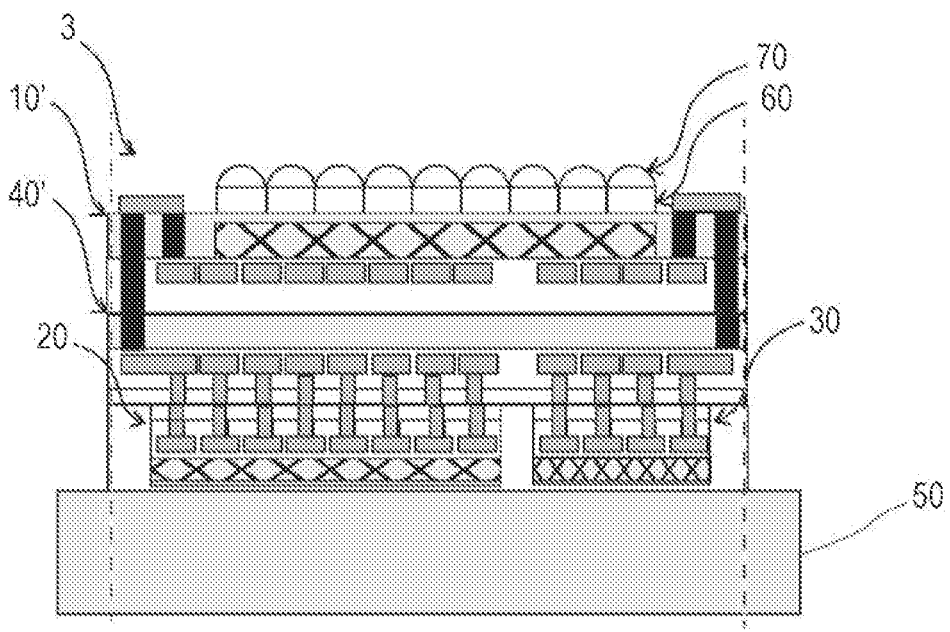
FIG. 70 is a diagram illustrating a process of subjecting the solid-state imaging device to singulation.

In step S214 in FIG. 58, singulation is performed by dicing. (see FIG. 70). Specifically, a plurality of the solid-state imaging devices 3 formed as a single piece is divided by dicing into separate chip-shaped solid-state imaging devices 3.

The solid-state imaging device 3 of the third embodiment described above is also similar in actions and effects to the solid-state imaging device 1 of the first embodiment.

The method for manufacturing the solid-state imaging device 3 of the third embodiment is also similar in effects to the method for manufacturing the solid-state imaging device 1 of the first embodiment.

7. <Modification Common to Embodiments of Present Technology>

The configuration of the solid-state imaging device of each of the first to third embodiments described above may be modified as needed.

For example, the configurations of the solid-state imaging devices of the above-described embodiments may be combined with each other within a range where there is not technical contradiction.

In the solid-state imaging device of each of the above-described embodiments, the circuit chip 20 includes a memory circuit, and the circuit chip 30 includes a logic circuit, but it is not limited to such a configuration.

For example, the circuit chip 20 may include, for example, an analog circuit, an interface circuit, or an AI circuit rather than the memory circuit. Note that, in a case where the circuit chip 20 includes an analog circuit, it is not necessary to provide the analog circuit in the pixel chip.

Here, the analog circuit may include not only a control circuit that includes a circuit element such as a transistor that controls each pixel of the pixel chip, but also a circuit (for example, an A/D conversion circuit) that processes an analog signal output from each pixel. The interface circuit is a circuit including at least one interface element that inputs and outputs a signal. The AI circuit is a circuit including an AI element having a learning function based on artificial intelligence (AI).

For example, the circuit chip 30 may include, for example, the analog circuit, the interface circuit, or the AI circuit rather than the logic circuit. In this case, the logic circuit may be provided in the pixel chip.

The solid-state imaging device of each of the above-described embodiments may have at least three circuit chips arranged side by side. Each of the at least three circuit chips may have a different circuit among the memory circuit, the logic circuit, the analog circuit, the interface circuit, and the AI circuit.

The pixel chip of the solid-state imaging device of each of the above-described embodiments may have a single pixel.

The solid-state imaging device of each of the above-described embodiments may have a single circuit chip.

Even if the solid-state imaging device of each of the above-described embodiments has a single circuit chip or a plurality of circuit chips, it is preferable to include a circuit chip including at least the logic circuit.

In the solid-state imaging device of each of the above-described embodiments, the connecting substrate and the circuit chip are bonded by metal-metal bonding, but instead, the connecting substrate and the circuit chip may be electrically connected via a through electrode, for example. In this case, the substrate body of the connecting substrate need not have the first insulating layer 400*b* that is an insulating layer adjacent to the circuit chip.

In the solid-state imaging device of each of the above-described embodiments, the substrate body of the connecting substrate includes two or three layers of the semiconductor substrate and one or two insulating layers, but may include four or more layers.

For example, the solid-state imaging device of each of the above-described embodiments may be a linear image sensor (line image sensor) having a series of plurality of pixels arranged linearly.

For example, the solid-state imaging device of each of the above-described embodiments may have a single pixel structure including only one pixel.

For example, in the solid-state imaging device of each of the above-described embodiments, each pixel may have a plurality of photoelectric conversion elements.

For example, the solid-state imaging device of each of the above-described embodiments may include one color filter for a plurality of photoelectric conversion elements.

For example, in the solid-state imaging device of each of the above-described embodiments may include one microlens for a plurality of photoelectric conversion elements.

For example, the solid-state imaging device of each of the above-described embodiments need not include at least one of the color filter array or the microlens array. For example, in a case of being used for generating a black-and-white image, the color filter array need not be provided. For example, in a case of being used for sensing such as distance measurement, at least one of the color filter array or the microlens array need not be provided.

For example, the photoelectric conversion element of the solid-state imaging device of each of the above-described embodiments may be a photodiode that is not of a back-illuminated type, that is, a photodiode of a front-illuminated type on which light impinges from the surface of the semiconductor substrate adjacent to the wiring layer. In this case, a configuration where the pixel chip and the connecting substrate are connected via the through electrode is effective.

For example, in the solid-state imaging device of each of the above-described embodiments, the A/D conversion circuit as the analog circuit is provided in the circuit chip 30, but may be provided in the pixel chip 10 or the circuit chip 20.

8. <Usage Example of Solid-State Imaging Device to which Present Technology is Applied>

Figure 71:
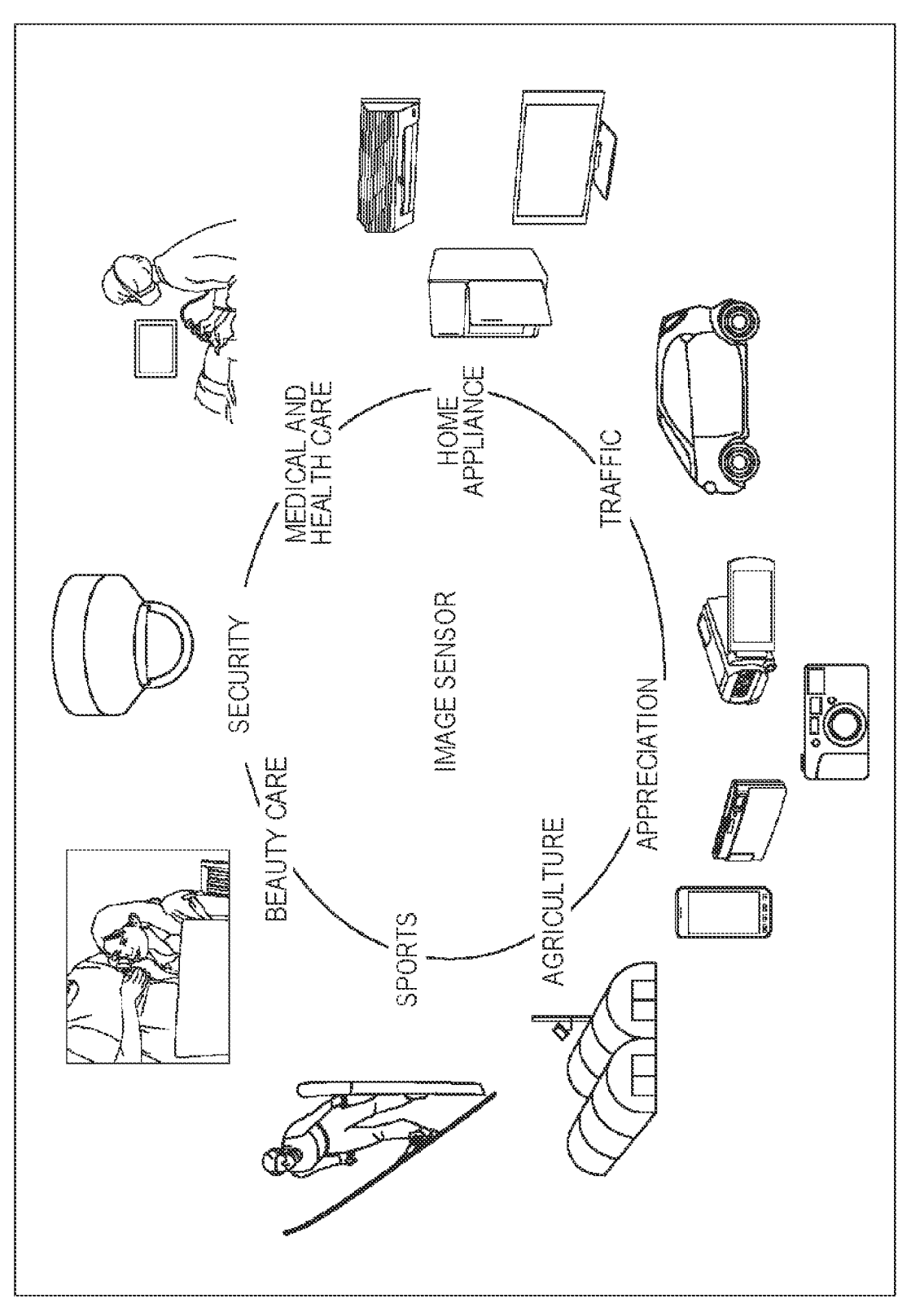
FIG. 71 is a diagram illustrating usage examples of the solid-state imaging devices according to the first to third embodiments to which the present technology is applied.

FIG. 71 is a diagram illustrating usage examples, as an image sensor, of the solid-state imaging devices according to the first to third embodiments (including modifications of each embodiment) of the present technology.

The solid-state imaging devices of the above-described first to third embodiments (including modifications of each embodiment) are applicable to, for example, various cases of sensing light such as visible light, infrared light, ultraviolet light, or X-rays. That is, as illustrated in FIG. 71, for example, the solid-state imaging devices are applicable to a device used in the field of appreciation in which an image provided for appreciation is captured, the field of traffic, the field of home appliances, the field of medical and health care, the field of security, the field of beauty care, the field of sports, the field of agriculture, or the like.

Specifically, in the field of appreciation, for example, any one of the solid-state imaging devices of the first to third embodiments (including modifications of each embodiment) is applicable to a device for capturing an image to be provided for appreciation, such as a digital camera, a smartphone, or a mobile phone with a camera function.

In the field of traffic, for example, any one of the solid-state imaging devices of the first to third embodiments (including modifications of each embodiment) is applicable to a device used for traffic, such as an in-vehicle sensor that captures images of a front view, rear view, surrounding view, inside view, and the like of an automobile for safe driving such as automatic braking, recognition of a driver's condition, and the like, a monitoring camera that monitors a traveling vehicle or a road, and a distance measurement sensor that measures such as a distance between vehicles.

In the field of home appliances, for example, any one of the solid-state imaging devices of the first to third embodiments (including modifications of each embodiment) is applicable to a device used in home appliances such as a television receiver, a refrigerator, and an air conditioner in order to capture an image of a gesture made by a user to operate the device in accordance with the gesture.

In the field of medical and health care, for example, any one of the solid-state imaging devices of the first to third embodiments (including modifications of each embodiment) is applicable to a device used for medical and health care, such as an endoscope or a device that performs angiography by receiving infrared light.

In the field of security, for example, any one of solid-state imaging elements of the first to third embodiments (including modifications of each embodiment) is applicable to a device used for security, such as a surveillance camera used for crime prevention or a camera used for person authentication.

In the field of beauty care, for example, any one of the solid-state imaging devices of the first to third embodiments (including modifications of each embodiment) is applicable to a device used for beauty care, such as a skin measuring instrument for capturing an image of skin or a microscope for capturing an image of a scalp.

In the field of sports, for example, any one of the solid-state imaging devices of the first to third embodiments (including modifications of each embodiment) is applicable to a device used for sports, such as an action camera or a wearable camera used for sports or the like.

In the field of agriculture, for example, any one of the solid-state imaging devices of the first to third embodiments (including modifications of each embodiment) is applicable to a device used for agriculture, such as a camera for monitoring the condition of a field or crops.

Figure 72:
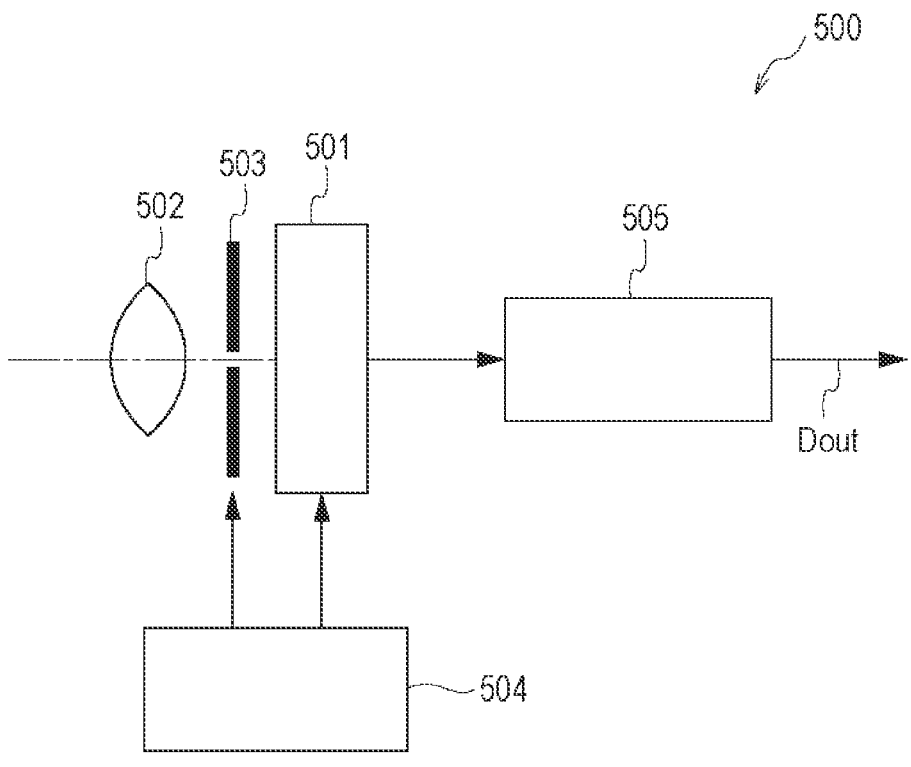
FIG. 72 is a functional block diagram of an example of an electronic apparatus according to a fourth embodiment to which the present technology is applied.

Next, the usage examples of the solid-state imaging devices of the first to third embodiments (including modifications of each embodiment) of the present technology will be described in detail. For example, any one of the solid-state imaging devices of the first to third embodiments (including modifications of each embodiment) described above is applicable, as a solid-state imaging device 501, to any type of electronic apparatus with an imaging function, such as a camera system including a digital still camera, a video camera, and the like, or a mobile phone with an imaging function. FIG. 72 illustrates a schematic configuration of an electronic apparatus 500 (camera) as an example. The electronic apparatus 500 is, for example, a video camera capable of capturing a still image or a moving image, and includes the solid-state imaging device 501, an optical system (optical lens) 502, a shutter device 503, a drive unit 504 that drives the solid-state imaging device 501 and the shutter device 503, and a signal processing unit 505.

The optical system 502 guides image light (incident light) from a subject to the pixel region of the solid-state imaging device 501. The optical system 502 may include a plurality of optical lenses. The shutter device 503 controls a period during which the solid-state imaging device 501 is irradiated with light and a period during which the solid-state imaging device 501 is shielded from light. The drive unit 504 controls a transfer operation of the solid-state imaging device 501 and a shutter operation of the shutter device 503. The signal processing unit 505 performs various types of signal processing on a signal output from the solid-state imaging device 501. A video signal Dout subjected to the signal processing is stored into a storage medium such as a memory or output to a monitor or the like.

9. <Another Usage Example of Solid-State Imaging Device to which Present Technology is Applied>

Any one of the solid-state imaging devices of the first to third embodiments (including modifications of each embodiment) of the present technology is also applicable to, for example, a different electronic apparatus that detects light, such as a time of flight (TOF) sensor. In a case of being applied to a TOF sensor, for example, the solid-state imaging device is applicable to a distance image sensor using a direct TOF measurement method or a distance image sensor using an indirect TOF measurement method. In the distance image sensor using the direct TOF measurement method, the photon arrival timing is directly obtained in the time domain for each pixel, so that a light pulse having a short pulse width is transmitted, and an electrical pulse is generated by a receiver that responds at a high speed. The present disclosure is applicable to the receiver. Furthermore, under the indirect TOF method, the time of flight of light is measured using a semiconductor element structure in which the detection of carriers generated by light and the accumulation amount of the carriers vary in a manner that depends on the light arrival time. The present disclosure is also applicable to such a semiconductor structure. In a case of being applied to a TOF sensor, whether or not to provide the color filter array and the microlens array as illustrated in FIG. 5 and the like is optional, and the color filter array and the microlens array need not be provided.

10. <Application Example to Moving Object>

The technology according to the present disclosure (the present technology) is applicable to various products. For example, the technology according to the present disclosure may be implemented as a device installed on any type of moving object such as an automobile, an electric automobile, a hybrid electric automobile, a motorcycle, a bicycle, a personal transporter, a plane, a drone, a ship, and a robot.

Figure 73:
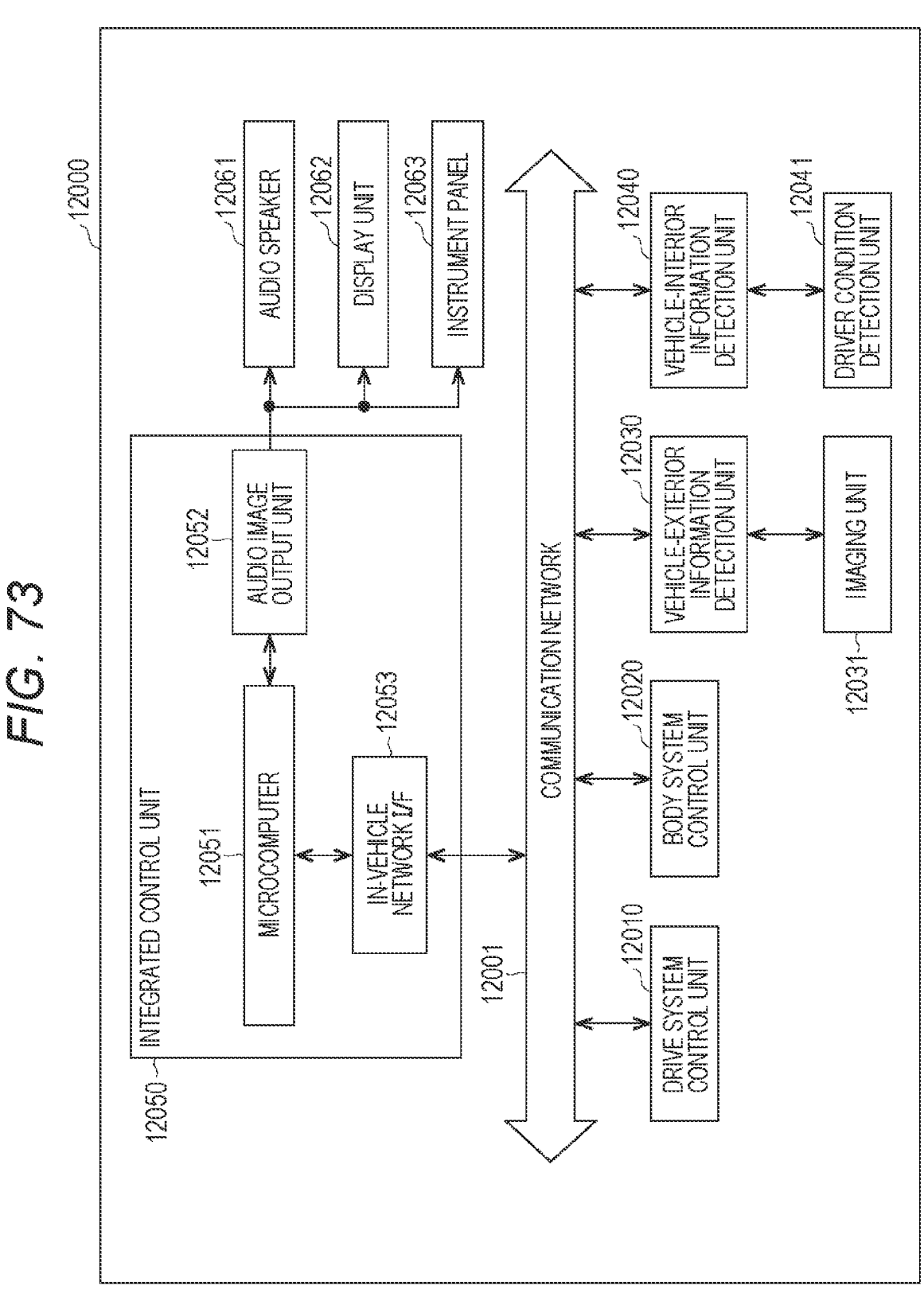
FIG. 73 is a block diagram illustrating an example of a schematic configuration of a vehicle control system.

FIG. 73 is a block diagram illustrating a schematic configuration example of a vehicle control system that is an example of a moving object control system to which the technology according to the present disclosure is applicable.

A vehicle control system 12000 includes a plurality of electronic control units connected over a communication network 12001. In the example illustrated in FIG. 73, the vehicle control system 12000 includes a drive system control unit 12010, a body system control unit 12020, a vehicle-exterior information detection unit 12030, a vehicle-interior information detection unit 12040, and an integrated control unit 12050. Furthermore, as functional components of the integrated control unit 12050, a microcomputer 12051, an audio image output unit 12052, and an in-vehicle network interface (I/F) 12053 are illustrated.

The drive system control unit 12010 controls operation of devices related to a drive system of a vehicle in accordance with various programs. For example, the drive system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operation of various devices installed on the vehicle body in accordance with various programs. For example, the body system control unit 12020 functions as a control device of a keyless entry system, a smart key system, a power window device, or various lamps such as a headlamp, a tail lamp, a brake lamp, a turn signal, or a fog lamp. In this case, radio waves transmitted from a portable device that substitutes for a key or signals of various switches can be input to the body system control unit 12020. Upon receipt of such radio waves or signals, the body system control unit 12020 controls a door lock device, the power window device, the lamps, or the like of the vehicle.

The vehicle-exterior information detection unit 12030 detects information regarding the exterior of the vehicle on which the vehicle control system 12000 is installed. For example, an imaging unit 12031 is connected to the vehicle-exterior information detection unit 12030. The vehicle-exterior information detection unit 12030 causes the imaging unit 12031 to capture an image of an outside view seen from the vehicle, and receives the captured image data. The vehicle-exterior information detection unit 12030 may perform object detection processing of detecting an object such as a person, a vehicle, an obstacle, a sign, or a character on a road surface or distance detection processing of detecting a distance to such an object on the basis of the received image.

The imaging unit 12031 is an optical sensor that receives light and outputs an electrical signal corresponding to the intensity of the received light. The imaging unit 12031 can output the electric signal as an image or can output the electrical signal as distance information. Furthermore, the light received by the imaging unit 12031 may be visible light or invisible light such as infrared rays.

The vehicle-interior information detection unit 12040 detects vehicle-interior information. For example, a driver condition detection unit 12041 that detects a condition of a driver is connected to the vehicle-interior information detection unit 12040. The driver condition detection unit 12041 may include, for example, a camera that captures an image of the driver, and the vehicle-interior information detection unit 12040 may calculate a degree of fatigue or a degree of concentration of the driver or may determine whether or not the driver is dozing on the basis of the detection information input from the driver condition detection unit 12041.

The microcomputer 12051 may calculate a control target value of the driving force generation device, the steering mechanism, or the braking device on the basis of the information regarding the inside and outside of the vehicle acquired by the vehicle-exterior information detection unit 12030 or the vehicle-interior information detection unit 12040, and output a control command to the drive system control unit 12010. For example, the microcomputer 12051 can perform coordinated control for the purpose of implementing a function of an advanced driver assistance system (ADAS) including vehicle collision avoidance or impact mitigation, follow-up traveling based on an inter-vehicle distance, traveling with the vehicle speed maintained, vehicle collision warning, vehicle lane departure warning, or the like.

Furthermore, the microcomputer 12051 can perform coordinated control for the purpose of automated driving or the like in which the vehicle autonomously travels without depending on driver's operation by controlling the driving force generation device, the steering mechanism, the braking device, or the like on the basis of the information regarding surroundings of the vehicle acquired by the vehicle-exterior information detection unit 12030 or the vehicle-interior information detection unit 12040.

Furthermore, the microcomputer 12051 can output a control command to the body system control unit 12020 on the basis of the vehicle-exterior information acquired by the vehicle-exterior information detection unit 12030. For example, the microcomputer 12051 can perform coordinated control for the purpose of preventing glare, such as switching from a high beam to a low beam, by controlling the headlamp in accordance with the position of a preceding vehicle or an oncoming vehicle detected by the vehicle-exterior information detection unit 12030.

The audio image output unit 12052 transmits an output signal of at least one of a sound or an image to an output device capable of visually or audibly notifying the occupant of the vehicle or the outside of the vehicle of information. In the example illustrated in FIG. 73, an audio speaker 12061, a display unit 12062, and an instrument panel 12063 are illustrated as output devices. The display unit 12062 may include, for example, at least one of an on-board display or a head-up display.

Figure 74:
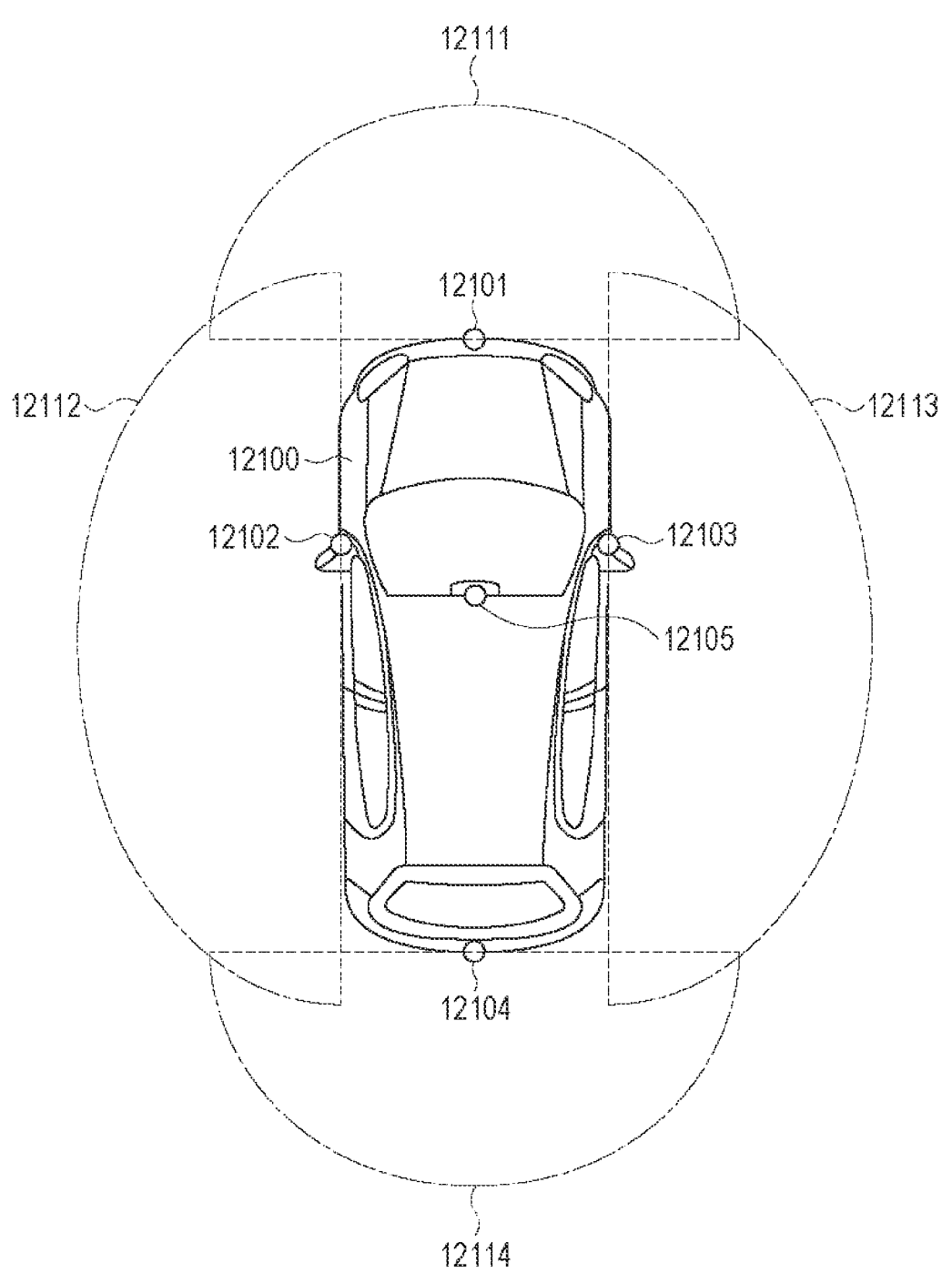
FIG. 74 is an explanatory diagram illustrating an example of installation positions of a vehicle exterior information detection unit and an imaging unit.

FIG. 74 is a diagram illustrating an example of an installation position of the imaging unit 12031.

In FIG. 74, a vehicle 12100 includes imaging units 12101, 12102, 12103, 12104, 12105 as the imaging unit 12031.

The imaging units 12101, 12102, 12103, 12104, 12105 are provided, for example, at a front nose, a side mirror, a rear bumper, a back door, an upper portion of a windshield in a vehicle interior of the vehicle 12100, or the like. The imaging unit 12101 provided at the front nose and the imaging unit 12105 provided at the upper portion of the windshield in the vehicle interior mainly capture an image of a front view seen from the vehicle 12100. The imaging units 12102, 12103 provided at the side mirrors mainly capture images of side views seen from the vehicle 12100. The imaging unit 12104 provided at the rear bumper or the back door mainly capture an image of a rear view seen from the vehicle 12100. The images of the front view acquired by the imaging units 12101, 12105 are mainly used for detecting a preceding vehicle, a pedestrian, an obstacle, a traffic light, a traffic sign, a lane, or the like.

Note that FIG. 74 illustrates an example of respective imaging ranges of the imaging units 12101 to 12104. An imaging range 12111 indicates an imaging range of the imaging unit 12101 provided at the front nose, imaging ranges 12112, 12113 indicate imaging ranges of the imaging units 12102, 12103 provided at the side mirrors, respectively, and an imaging range 12114 indicates an imaging range of the imaging unit 12104 provided at the rear bumper or the back door. For example, it is possible to obtain a bird's-eye view image of the vehicle 12100 by superimposing image data captured by the imaging units 12101 to 12104 on top of one another.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 obtains a distance to a three-dimensional object in each of the imaging ranges 12111 to 12114 and a temporal change in the distance (speed relative to the vehicle 12100) on the basis of the distance information obtained from the imaging units 12101 to

12104, so as to extract, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Moreover, the microcomputer 12051 can set in advance an inter-vehicle distance that needs to be maintained relative to the preceding vehicle, and perform automated deceleration control (including follow-up stop control), automated acceleration control (including follow-up start control), or the like. As described above, it is possible to perform coordinated control for the purpose of, for example, automated driving in which a vehicle autonomously travels without depending on the operation of the driver.

For example, on the basis of the distance information obtained from the imaging units 12101 to 12104, the microcomputer 12051 can classify three-dimensional object data regarding three-dimensional objects into a two-wheeled vehicle, a standard-sized vehicle, a large-sized vehicle, a pedestrian, and other three-dimensional objects such as a utility pole and extract the three-dimensional object data for use in automated avoidance of obstacles. For example, the microcomputer 12051 identifies obstacles around the vehicle 12100 as an obstacle that can be visually recognized by the driver of the vehicle 12100 and an obstacle that is difficult to be visually recognized. Then, the microcomputer 12051 determines a collision risk indicating a risk of collision with each obstacle, and when the collision risk is greater than or equal to a set value and there is a possibility of collision, the microcomputer 12051 can give driver assistance for collision avoidance by issuing an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not the pedestrian is present in the images captured by the imaging units 12101 to 12104. Such pedestrian recognition is performed by, for example, a procedure of extracting feature points in the images captured by the imaging units 12101 to 12104 as infrared cameras, and a procedure of performing pattern matching processing on a series of feature points indicating an outline of an object to determine whether or not the object is a pedestrian. When the microcomputer 12051 determines that a pedestrian is present in the images captured by the imaging units 12101 to 12104 and recognizes the pedestrian, the audio image output unit 12052 controls the display unit 12062 to display the images with a square contour line for emphasis on the recognized pedestrian superimposed on the images. Furthermore, the audio image output unit 12052 may control the display unit 12062 to display an icon or the like indicating a pedestrian at a desired position.

An example of the vehicle control system to which the technology according to the present disclosure (the present technology) is applicable has been described above. The technology according to the present disclosure is applicable to, for example, the imaging unit 12031 and the like among the above-described configurations. Specifically, a solid-state imaging device 111 of the present disclosure is applicable to the imaging unit 12031. Applying the technology according to the present disclosure to the imaging unit 12031 makes it possible to improve the yield and reduce the manufacturing cost.

11. <Application Example to Endoscopic Surgery System>

The present technology is applicable to various products. For example, the technology according to the present disclosure (the present technology) may be applied to an endoscopic surgery system.

Figure 75:
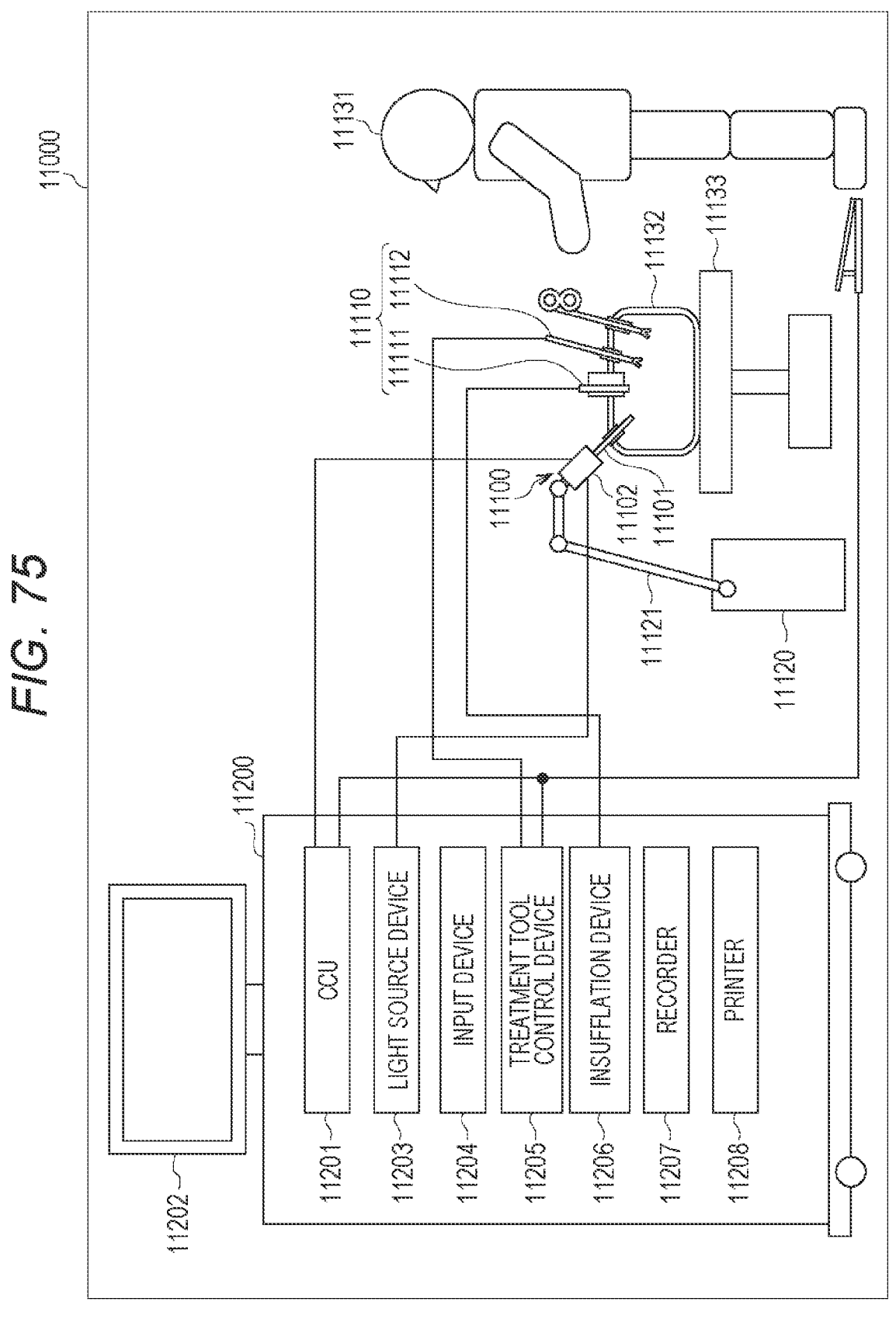
FIG. 75 is a diagram illustrating an example of a schematic configuration of an endoscopic surgery system.

FIG. 75 is a diagram illustrating an example of a schematic configuration of an endoscopic surgery system to which the technology according to the present disclosure (the present technology) is applicable.

FIG. 75 illustrates a state where an operator (surgeon) 11131 is performing surgery on a patient 11132 on a patient bed 11133 using an endoscopic surgery system 11000. As illustrated in the drawing, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 on which various devices for use in endoscopic surgery are mounted.

The endoscope 11100 includes a lens barrel 11101, a part of which having a predetermined length from a distal end is inserted into a body cavity of the patient 11132, and a camera head 11102 connected to a proximal end of the lens barrel 11101. In the illustrated example, the endoscope 11100 including a so-called rigid scope having the rigid lens barrel 11101 is illustrated, but the endoscope 11100 may include a so-called flexible scope having a flexible lens barrel.

The lens barrel 11101 has an opening into which an objective lens is fitted provided at the distal end of the lens barrel 11101. A light source device 11203 is connected to the endoscope 11100, and light generated by the light source device 11203 is guided to the distal end of the lens barrel 11101 by a light guide extending through the lens barrel, and is emitted toward an observation target in the body cavity of the patient 11132 through the objective lens. Note that the endoscope 11100 may be a forward-viewing endoscope, an oblique-viewing endoscope, or a side-viewing endoscope.

An optical system and an imaging element are provided inside the camera head 11102, and reflected light (observation light) from the observation target is condensed on the imaging element by the optical system. The observation light is photoelectrically converted by the imaging element, and an electrical signal corresponding to the observation light, that is, an image signal corresponding to an observation image, is generated. The image signal is transmitted to a camera control unit (CCU) 11201 as RAW data.

The CCU 11201 includes a central processing unit (CPU), a graphics processing unit (GPU), and the like, and collectively controls operation of the endoscope 11100 and a display device 11202. Moreover, the CCU 11201 receives the image signal from the camera head 11102, and performs various types of image processing for displaying an image based on the image signal, such as development processing (demosaicing), on the image signal.

The display device 11202 displays, under the control of the CCU 11201, the image based on the image signal subjected to the image processing by the CCU 11201.

The light source device 11203 includes a light source such as a light emitting diode (LED), and supplies irradiation light for capturing an image of a surgical site or the like to the endoscope 11100.

An input device 11204 is an input interface for an endoscopic surgery system 11000. The user can input various types of information and instructions to the endoscopic surgery system 11000 via the input device 11204. For example, the user inputs an instruction or the like to change an imaging condition (type of the irradiation light, magnification, focal length, or the like) of the endoscope 11100.

A treatment tool control device 11205 controls driving of the energy treatment tool 11112 for tissue ablation, incision, sealing of a blood vessel, or the like. An insufflation device 11206 feeds gas into the body cavity of the patient 11132 through the insufflation tube 11111 in order to inflate the body cavity for the purpose of securing a visual field for the endoscope 11100 and securing a work space for the operator. A recorder 11207 is a device capable of recording various types of information regarding surgery. A printer 11208 is a device capable of printing various types of information regarding surgery in various forms such as text, image, or graph.

Note that the light source device 11203 that supplies, to the endoscope 11100, the irradiation light for capturing an image of the surgical site may include, for example, an LED, a laser light source, or a white light source including a combination of the LED and the laser light source. In a case where the white light source includes a combination of RGB laser light sources, output intensity and output timing of each color (each wavelength) can be controlled with high accuracy, so that it is possible for the light source device 11203 to adjust a white balance of a captured image. Furthermore, in this case, irradiating the observation target with the laser light from each of the RGB laser light sources in a time-division manner and controlling the driving of the imaging element of the camera head 11102 in synchronization with the irradiation timing also allows images corresponding to RGB on a one-to-one basis to be captured in a time-division manner. According to this method, a color image can be obtained without a color filter provided in the imaging element.

Furthermore, the driving of the light source device 11203 may be controlled so as to change the intensity of light to be output every predetermined time. It is possible to generate a high dynamic range image with neither so-called blocked up shadows nor blown out highlights by controlling the driving of the imaging element of the camera head 11102 in synchronization with the timing of the change in the intensity of light to acquire images in a time-division manner and compositing the images.

Furthermore, the light source device 11203 may be configured to supply light in a predetermined wavelength band corresponding to special light observation. In the special light observation, for example, so-called narrow band imaging is performed in which an image of predetermined tissue such as a blood vessel in a mucous membrane surface layer is captured with high contrast by emitting light narrower in band than the irradiation light (that is, white light) for normal observation using wavelength dependency of light absorption in body tissue. Alternatively, in the special light observation, fluorescence observation for obtaining an image using fluorescence generated by irradiation with excitation light may be performed. In the fluorescence observation, it is possible to irradiate body tissue with excitation light to observe fluorescence from the body tissue (autofluorescence observation), or to locally inject a reagent such as indocyanine green (ICG) into body tissue and irradiate the body tissue with excitation light corresponding to a fluorescent wavelength of the reagent to obtain a fluorescent image, for example. The light source device 11203 may be configured to supply narrow band light and/or excitation light corresponding to such special light observation.

Figure 76:
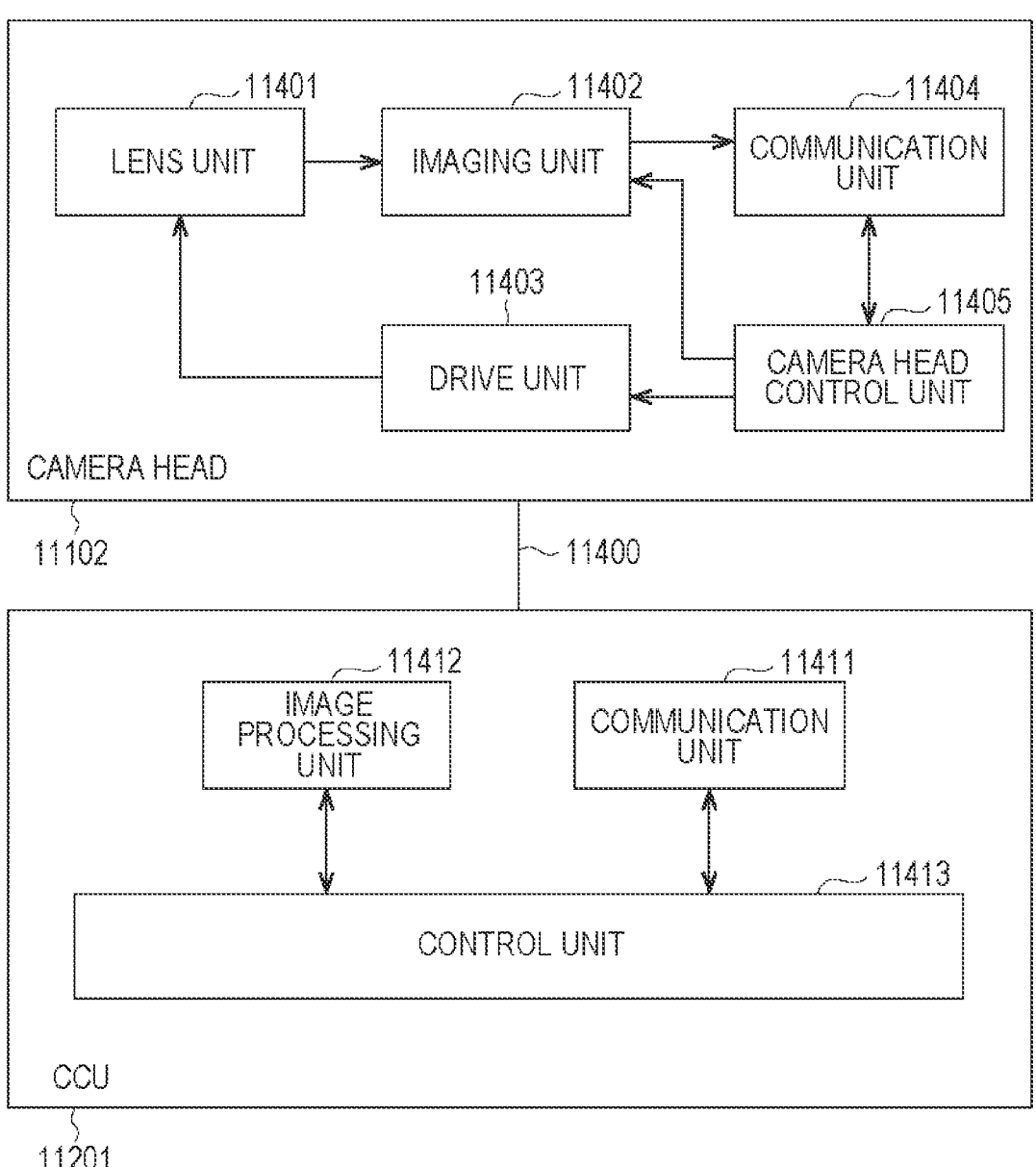
FIG. 76 is a block diagram illustrating examples of functional configurations of a camera head and a CCU.

FIG. 76 is a block diagram illustrating an example of functional configurations of the camera head 11102 and the CCU 11201 illustrated in FIG. 75.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other over a transmission cable 11400.

The lens unit 11401 is an optical system provided at a portion for connection with the lens barrel 11101. The observation light taken in from the distal end of the lens barrel 11101 is guided to the camera head 11102 to impinge on the lens unit 11401. The lens unit 11401 includes a combination of a plurality of lenses including a zoom lens and a focus lens.

The imaging unit 11402 includes an imaging element. The imaging unit 11402 may include one imaging element (so-called single-plate type) or a plurality of imaging elements (so-called multi-plate type). In a case where the imaging unit 11402 is of a multi-plate type, for example, image signals corresponding to RGB on a one-to-one basis are generated by each imaging element, and a color image may be obtained from a combination of the image signals. Alternatively, the imaging unit 11402 may include a pair of imaging elements for obtaining right-eye and left-eye image signals corresponding to three-dimensional (3D) display. Such 3D display allows the operator 11131 to grasp the depth of living tissue at the surgical site with higher accuracy. Note that, in a case where the imaging unit 11402 is of a multi-plate type, a plurality of lens units 11401 may be provided corresponding to the respective imaging elements.

Furthermore, the imaging unit 11402 need not necessarily be provided in the camera head 11102. For example, the imaging unit 11402 may be provided just after the objective lens inside the lens barrel 11101.

The drive unit 11403 includes an actuator, and moves the zoom lens and the focus lens of the lens unit 11401 by a predetermined distance along an optical axis under the control of the camera head control unit 11405. This makes it possible to adjust, as needed, the magnification and focus of the image captured by the imaging unit 11402.

The communication unit 11404 includes a communication device for transmitting and receiving various types of information to and from the CCU 11201. The communication unit 11404 transmits the image signal obtained from the imaging unit 11402 as RAW data to the CCU 11201 over the transmission cable 11400.

Furthermore, the communication unit 11404 receives a control signal for controlling driving of the camera head 11102 from the CCU 11201, and supplies the control signal to the camera head control unit 11405. The control signal includes, for example, information regarding the imaging condition such as information for specifying the frame rate of an image to be captured, information for specifying the exposure value at the time of imaging, and/or information for specifying the magnification and the focus of an image to be captured.

Note that the imaging condition such as the frame rate, the exposure value, the magnification, or the focus may be specified by the user as needed, or may be automatically set by the control unit 11413 of the CCU 11201 on the basis of the acquired image signal. In the latter case, the endoscope 11100 is equipped with a so-called auto exposure (AE) function, an auto focus (AF) function, and an auto white balance (AWB) function.

The camera head control unit 11405 controls the driving of the camera head 11102 on the basis of the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 over the transmission cable 11400.

Furthermore, the communication unit 11411 transmits a control signal for controlling the driving of the camera head 11102 to the camera head 11102. The image signal and the control signal can be transmitted by means of electrical signal communications, optical communications, or the like.

The image processing unit 11412 performs various types of image processing on the image signal that is RAW data transmitted from the camera head 11102.

The control unit 11413 performs various types of control for capturing an image of the surgical site or the like by the endoscope 11100 and displaying a captured image obtained by capturing an image of the surgical site or the like. For example, the control unit 11413 generates a control signal for controlling the driving of the camera head 11102.

Furthermore, the control unit 11413 causes the display device 11202 to display a captured image capturing the surgical site or the like on the basis of the image signal subjected to the image processing by the image processing unit 11412. At this time, the control unit 11413 may recognize various objects in the captured image using various image recognition techniques. For example, the control unit 11413 can recognize a surgical tool such as forceps, a specific body part, bleeding, mist at the time of using the energy treatment tool 11112, and the like by detecting an edge shape, color, and the like of an object included in the captured image. When displaying the captured image on the display device 11202, the control unit 11413 may display, using the recognition result, various types of surgery support information with the surgery support information superimposed on the image of the surgical site. The surgery support information displayed in a superimposed manner and presented to the operator 11131 makes it possible to reduce a burden on the operator 11131 or allows the operator 11131 to reliably proceed with surgery.

The transmission cable 11400 connecting the camera head 11102 and the CCU 11201 is an electrical signal cable adapted to electrical signal communications, an optical fiber adapted to optical communications, or a composite cable including the electrical signal cable and the optical fiber.

Here, in the illustrated example, communication is performed by wire using the transmission cable 11400, but communication between the camera head 11102 and the CCU 11201 may be performed by wireless.

The endoscopic surgery system to which the technology according to the present disclosure is applicable has been described above as an example. The technology according to the present disclosure is applicable to the endoscope 11100, (the imaging unit 11402 of) the camera head 11102, and the like among the above-described configurations. Specifically, the solid-state imaging device 111 of the present disclosure is applicable to the imaging unit 10402. Applying the technology according to the present disclosure to the endoscope 11100, (the imaging unit 11402 of) the camera head 11102, or the like makes it possible to improve the yield and reduce the manufacturing cost.

Here, the endoscopic surgery system has been described as an example, but the technology according to the present disclosure may be applied to, for example, a microscopic surgery system or the like.

Furthermore, the present technology may have the following configurations.

(1) A solid-state imaging device including:

a pixel chip including a pixel having a photoelectric conversion element;

at least one circuit chip including a circuit configured to process a signal generated in the pixel; and a connecting substrate electrically connecting the pixel chip and the circuit chip, in which the pixel chip, the connecting substrate, and the circuit chip are stacked in this order.

(2) In the solid-state imaging device according to (1), the connecting substrate includes a substrate body, and wiring provided in the substrate body to connect the pixel chip and the circuit chip.

(3) In the solid-state imaging device according to (2), the substrate body is not provided with a transistor.

(4) In the solid-state imaging device according to any one of (1) to (3), the circuit chip is smaller than the pixel chip.

(5) In the solid-state imaging device according to any one of (1) to (4), the circuit chip is smaller than the connecting substrate.

(6) In the solid-state imaging device according to any one of (1) to (5), the at least one circuit chip is a plurality of circuit chips arranged side by side.

(7) In the solid-state imaging device according to (2) or (3), the substrate body includes a substrate, and a first insulating layer disposed on a side of the substrate adjacent to the circuit chip, and the wiring is provided in the substrate and the first insulating layer.

(8) In the solid-state imaging device according to (7), the substrate body further includes a second insulating layer disposed on a side of the substrate adjacent to the pixel chip, and the wiring is provided in the substrate, the first insulating layer, and the second insulating layer.

(9) In the solid-state imaging device according to any one of (2), (3), (7), or (8), the pixel chip includes a first semiconductor substrate in which the pixel is formed and a first wiring layer disposed on a side of the first semiconductor substrate adjacent to the connecting substrate, the circuit chip includes a second semiconductor substrate in which the circuit is formed and a second wiring layer disposed on a side of the second semiconductor substrate adjacent to the connecting substrate, and the wiring includes a first connecting terminal on a surface of the substrate body adjacent to the first wiring layer at a position corresponding to a connecting terminal of wiring provided in the first wiring layer, and includes a second connecting terminal on a surface of the substrate body adjacent to the second wiring layer at a position corresponding to a connecting terminal of wiring provided in the second wiring layer.

(10) In the solid-state imaging device according to (9), the wiring and the wiring formed in the first wiring layer are connected via at least one through electrode.

(11) In the solid-state imaging device according to (10), a connecting terminal of the wiring formed in the second wiring layer is provided on a surface of the second wiring layer adjacent to the connecting substrate, and the connecting terminal and the second connecting terminal are bonded.

(12) In the solid-state imaging device according to (9), a connecting terminal of the wiring formed in the first wiring layer is provided on a surface of the first wiring layer adjacent to the connecting substrate, and the connecting terminal and the first connecting terminal are bonded.

(13) In the solid-state imaging device according to (12), a connecting terminal of the wiring formed in the second wiring layer is provided on a surface of the second wiring layer adjacent to the connecting substrate, and the connecting terminal and the second connecting terminal are bonded.

(14) In the solid-state imaging device according to (7), the substrate is a semiconductor substrate.

(15) In the solid-state imaging device according to (7), the substrate is a glass substrate.

(16) In the solid-state imaging device according to any one of (1) to (15), the at least one circuit chip includes a circuit chip having an analog circuit as the circuit.

(17) In the solid-state imaging device according to any one of (1) to (16), the at least one circuit chip includes a circuit chip having a logic circuit as the circuit.

(18) In the solid-state imaging device according to any one of (1) to (17), the at least one circuit chip includes a circuit chip having a memory circuit as the circuit.

(19) In the solid-state imaging device according to any one of (1) to (18), the at least one circuit chip includes a circuit chip having an interface circuit as the circuit.

(20) In the solid-state imaging device according to any one of (1) to (19), the at least one circuit chip includes a circuit chip having an AI circuit as the circuit.

(21) An electronic apparatus including a solid-state imaging device according to any one of (1) to (20).

(22) An electronic apparatus including a solid-state imaging device, the solid-state imaging device including:

a pixel chip including a pixel having a photoelectric conversion element;

at least one circuit chip including a circuit configured to process a signal generated in the pixel; and a connecting substrate electrically connecting the pixel chip and the circuit chip, in which the pixel chip, the connecting substrate, and the circuit chip are stacked in this order.

(23) A method for manufacturing a solid-state imaging device including:

preparing a pixel chip including a pixel having a photoelectric conversion element;

preparing at least one circuit chip including a circuit configured to process a signal generated in the pixel;

forming a connecting substrate base member, the connecting substrate base member being a base member of a connecting substrate that electrically connects the pixel chip and the circuit chip; and stacking the pixel chip, the connecting substrate base member, and the circuit chip in this order.

(24) In the method for manufacturing a solid-state imaging device according to (23), in the preparing a pixel chip, the pixel chip obtained as a result of changing an existing design of the pixel chip is formed, and in the preparing a circuit chip, the circuit chip having an existing design is formed, and in the forming a connecting substrate base member, the base member of the connecting substrate that electrically connects the pixel chip subjected to the design change and the circuit chip having the existing design is formed.

(25) In the method for manufacturing a solid-state imaging device according to (23), in the preparing a pixel chip, the pixel chip having an existing design is formed, and in the preparing a circuit chip, the circuit chip obtained as a result of changing an existing design of the circuit chip is formed, and in the forming a connecting substrate base member, the base member of the connecting substrate that electrically connects the pixel chip having the existing design and the circuit chip subjected to the design change is formed.

(26) A method for manufacturing a solid-state imaging device including:

preparing a pixel chip base member, the pixel chip base member being a base member of a pixel chip that includes a pixel having a photoelectric conversion element;

preparing at least one circuit chip including a circuit configured to process a signal generated in the pixel;

forming a connecting substrate base member, the connecting substrate base member being a base member of a connecting substrate that electrically connects the pixel chip and the circuit chip; and stacking the pixel chip base member, the connecting substrate base member, and the circuit chip in this order.

(27) In the method for manufacturing a solid-state imaging device according to (26), in the preparing a pixel chip base member, the pixel chip obtained as a result of changing an existing design of the pixel chip is formed, and in the preparing a circuit chip, the circuit chip having an existing design is formed, and in the forming a connecting substrate base member, the base member of the connecting substrate that electrically connects the pixel chip subjected to the design change and the circuit chip having the existing design is formed.

(28) In the method for manufacturing a solid-state imaging device according to (26), in the preparing a pixel chip base member, the base member of the pixel chip having an existing design is formed, and in the preparing a circuit chip, the circuit chip obtained as a result of changing an existing design of the circuit chip is formed, and in the forming a connecting substrate base member, the base member of the connecting substrate that electrically connects the pixel chip having the existing design and the circuit chip subjected to the design change is formed.

(29) In the method for manufacturing a solid-state imaging device according to any one of (23) to (25), the stacking includes attaching the circuit chip to one surface of the connecting substrate base member, and attaching the pixel chip to another surface of the connecting substrate base member.

(30) In the method for manufacturing a solid-state imaging device according to any one of (26) to (28), the stacking includes attaching the circuit chip to one surface of the connecting substrate base member, and attaching the pixel chip base member to another surface of the connecting substrate base member.

REFERENCE SIGNS LIST 1, 2, 3 Solid-state imaging device
10, 10' Pixel chip
20, 30 Circuit chip
40, 40' Connecting substrate
100 First semiconductor substrate
101 First wiring layer
101a Part of wiring provided in first wiring layer
101b Connecting terminal
200, 300 Second semiconductor substrate
201, 301 Second wiring layer
201a, 301a Part of wiring provided in second wiring layer
201b, 301b Connecting terminal
400, 400' Substrate body
400a Semiconductor substrate (substrate)
400b First insulating layer 400c Second insulating layer
401, 401' Wiring connecting pixel chip and circuit chip
401a First connecting terminal
401b Second connecting terminal
401d, TSV1, TSV2 Through electrode
500 Electronic apparatus

The invention claimed is:

1. A solid-state imaging device, comprising:
a pixel chip including a pixel having a photoelectric conversion element;
at least one circuit chip including a circuit configured to process a signal generated in the pixel; and
a connecting substrate, wherein
the connecting substrate electrically connects the pixel chip and the at least one circuit chip,
the pixel chip, the connecting substrate, and the at least one circuit chip are stacked in this order,
the connecting substrate includes a substrate body, and
the substrate body includes:
a substrate;
a first insulating layer on a first side of the substrate, wherein the first side is adjacent to the at least one circuit chip; and
a second insulating layer on a second side of the substrate, wherein
the second side is adjacent to the pixel chip, and
the first insulating layer and the second insulating layer are separated by the substrate.

2. The solid-state imaging device according to claim 1, wherein the connecting substrate further includes
a first wiring in the substrate body, wherein the first wiring connects the pixel chip and the at least one circuit chip.

3. The solid-state imaging device according to claim 2, wherein
the first wiring is in the substrate and the first insulating layer.

4. The solid-state imaging device according to claim 3, wherein
the first wiring is in the substrate, the first insulating layer, and the second insulating layer.

5. The solid-state imaging device according to claim 2, wherein
the pixel chip includes a first semiconductor substrate and a first wiring layer, wherein
the first semiconductor substrate includes the pixel,
the first wiring layer is on a side of the first semiconductor substrate, and
the side of the first semiconductor substrate is adjacent to the connecting substrate,
the at least one circuit chip includes a second semiconductor substrate and a second wiring layer, wherein
the second semiconductor substrate includes the circuit,
the second wiring layer is on a side of the second semiconductor substrate, and
the side of the second semiconductor substrate is adjacent to the connecting substrate, and
the first wiring includes:
a first connecting terminal on a first surface of the substrate body, wherein
the first surface is adjacent to the first wiring layer, and
the first connecting terminal is at a position corresponding to a connecting terminal of a second wiring of the first wiring layer; and
a second connecting terminal on a second surface of the substrate body, wherein the second surface is adjacent to the second wiring layer, and the second connecting terminal is at a position corresponding to a connecting terminal of third wiring of the second wiring layer.

6. The solid-state imaging device according to claim 5, wherein the second wiring of the first wiring layer and the first connecting terminal are connected via at least one through electrode.

7. The solid-state imaging device according to claim 6, wherein the connecting terminal of the third wiring of the second wiring layer is on a surface of the second wiring layer adjacent to the connecting substrate, and the connecting terminal of the third wiring of the second wiring layer and the second connecting terminal of the first wiring are bonded.

8. The solid-state imaging device according to claim 5, wherein a connecting terminal of the second wiring of the first wiring layer is on a surface of the first wiring layer adjacent to the connecting substrate, and the connecting terminal of the second wiring of the first wiring layer and the first connecting terminal of the first wiring are bonded.

9. The solid-state imaging device according to claim 8, wherein the connecting terminal of the third wiring of the second wiring layer is on a surface of the second wiring layer adjacent to the connecting substrate, and the connecting terminal of the third wiring of the second wiring layer and the second connecting terminal of the first wiring are bonded.

10. The solid-state imaging device according to claim 1, wherein the substrate body is without a transistor.

11. The solid-state imaging device according to claim 1, wherein the at least one circuit chip is smaller than the pixel chip.

12. The solid-state imaging device according to claim 11, wherein the at least one circuit chip is smaller than the connecting substrate.

13. The solid-state imaging device according to claim 1, wherein the at least one circuit chip is a plurality of circuit chips arranged side by side.

14. The solid-state imaging device according to claim 1, wherein the substrate is a semiconductor substrate.

15. The solid-state imaging device according to claim 1, wherein the substrate is a glass substrate.

16. The solid-state imaging device according to claim 1, wherein the at least one circuit chip includes a circuit chip having an analog circuit as the circuit.

17. The solid-state imaging device according to claim 1, wherein the at least one circuit chip includes a circuit chip having a logic circuit as the circuit.

18. The solid-state imaging device according to claim 1, wherein the at least one circuit chip includes a circuit chip having a memory circuit as the circuit.

19. The solid-state imaging device according to claim 1, wherein the at least one circuit chip includes a circuit chip having an interface circuit as the circuit.

20. An electronic apparatus, comprising a solid-state imaging device, the solid-state imaging device including:

a pixel chip including a pixel having a photoelectric conversion element;

at least one circuit chip including a circuit configured to process a signal generated in the pixel; and a connecting substrate, wherein the connecting substrate electrically connects the pixel chip and the at least one circuit chip, the pixel chip, the connecting substrate, and the at least one circuit chip are stacked in this order, the connecting substrate includes a substrate body, and the substrate body includes:

a substrate;

a first insulating layer on a first side of the substrate, wherein the first side is adjacent to the at least one circuit chip; and a second insulating layer on a second side of the substrate, wherein the second side is adjacent to the pixel chip, and the first insulating layer and the second insulating layer are separated by the substrate.

* * * * *